United States Patent
Jeon et al.

(10) Patent No.: US 12,453,229 B2
(45) Date of Patent: Oct. 21, 2025

(54) DISPLAY DEVICE AND METHOD OF FABRICATING THE SAME

(71) Applicant: Samsung Display Co., LTD., Yongin-si (KR)

(72) Inventors: Hyung Il Jeon, Seoul (KR); Byung Choon Yang, Seoul (KR); Tae Hee Lee, Hwaseong-si (KR); Joo Woan Cho, Seongnam-si (KR); Byeong Hwa Choi, Seoul (KR); Hae Yun Choi, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 529 days.

(21) Appl. No.: 17/949,841

(22) Filed: Sep. 21, 2022

(65) Prior Publication Data
US 2023/0215903 A1    Jul. 6, 2023

(30) Foreign Application Priority Data
Jan. 6, 2022  (KR) .......................... 10-2022-0001987

(51) Int. Cl.
*H10H 29/14*    (2025.01)
(52) U.S. Cl.
CPC ................................. *H10H 29/142* (2025.01)
(58) Field of Classification Search
None
See application file for complete search history.

(56) References Cited

U.S. PATENT DOCUMENTS

| | | | |
|---|---|---|---|
| 10,062,675 B2 | 8/2018 | Chang et al. | |
| 10,600,767 B2 | 3/2020 | Chong et al. | |
| 10,636,349 B2* | 4/2020 | Shin | H04N 25/76 |
| 10,847,077 B2 | 11/2020 | Sakariya et al. | |
| 2014/0319470 A1* | 10/2014 | Kim | H10K 59/38 |
| | | | 257/40 |
| 2016/0172560 A1* | 6/2016 | Chen | H10H 20/84 |
| | | | 257/99 |

FOREIGN PATENT DOCUMENTS

| | | |
|---|---|---|
| JP | 2019-529989 A | 10/2019 |
| KR | 10-2018-0118488 A | 10/2018 |

* cited by examiner

*Primary Examiner* — Bilkis Jahan
(74) *Attorney, Agent, or Firm* — Womble Bond Dickinson (US) LLP

(57) ABSTRACT

A display device includes: a substrate; a first pixel electrode on the substrate; a second pixel electrode on the substrate and spaced apart from the first pixel electrode; a first light emitting element on the first pixel electrode and configured to emit first light; a first connection electrode on the second pixel electrode; a first partition wall between a side surface of the first light emitting element and a side surface of the first connection electrode; a second light emitting element on the first connection electrode and configured to emit second light; and a common electrode on an upper surface of the first light emitting element and an upper surface of the second light emitting element.

30 Claims, 63 Drawing Sheets

DISPLAY DEVICE AND METHOD OF FABRICATING THE SAME

CROSS-REFERENCE TO RELATED APPLICATION

This application claims priority to, and the benefit of, Korean Patent Application No. 10-2022-0001987, filed on Jan. 6, 2022, in the Korean Intellectual Property Office (KIPO), the entire content of which is incorporated herein by reference.

BACKGROUND

1. Field

Aspects of embodiments of the present disclosure relate to a display device and a method of fabricating the same.

2. Description of the Related Art

As the information society develops, demands for display devices for displaying images in various forms are increasing. Display devices may be flat panel displays, such as liquid crystal displays, field emission displays, and light emitting displays. The light emitting displays may include an organic light emitting display including an organic light emitting diode element as a light emitting element, an inorganic light emitting display including an inorganic semiconductor element as a light emitting element, and an ultra-small light emitting diode display including an ultra-small light emitting diode element (e.g., a micro-light emitting diode element) as a light emitting element.

Recently, a head-mounted display including a light emitting display has been developed. The head-mounted display is a virtual reality (VR) or augmented reality (AR) glasses-type monitor device that is worn on a user's head in the form of glasses or a helmet and forms a focus at a short distance in front of the user's eyes.

A high-resolution, ultra-small light emitting diode display panel including a micro-light emitting diode element may be applied to the head-mounted display. When the ultra-small light emitting diode element emits light of a single color, a red wavelength conversion layer converting the wavelength of light emitted from the ultra-small light emitting diode element into a red wavelength and a green wavelength conversion layer converting the wavelength of the light into a green wavelength may be employed such that the ultra-small light emitting diode display panel can display various colors.

SUMMARY

Aspects and features of embodiments of the present disclosure provide a display device from which at least any one of a red wavelength conversion layer and a green wavelength conversion layer may be omitted and a method of fabricating the display device.

However, aspects and features of the present disclosure are not limited to those set forth herein. The above and other aspects and features of the present disclosure will become more apparent to one of ordinary skill in the art to which the present disclosure pertains by referencing the detailed description of the present disclosure given below.

According to an embodiment of the present disclosure, a display device includes a substrate, a first pixel electrode on the substrate, a second pixel electrode on the substrate and spaced apart from the first pixel electrode, a first light emitting element on the first pixel electrode and configured to emit first light, a first connection electrode on the second pixel electrode, a first partition wall between a side surface of the first light emitting element and a side surface of the first connection electrode, a second light emitting element on the first connection electrode and configured to emit second light, and a common electrode on an upper surface of the first light emitting element and an upper surface of the second light emitting element.

The first partition wall may have conductivity.

The display device may further include a first oxide layer on an upper surface of the first partition wall.

The display device may further include a planarization layer on the first light emitting element and a second partition wall between a side surface of the second light emitting element and a side surface of the planarization layer.

The second partition wall have conductivity.

The first partition wall and the second partition wall may include an opaque metal material.

The first partition wall and the second partition wall may be made of the same material.

The second partition wall may include a light blocking material that absorbs or blocks light.

The common electrode may be between the first light emitting element and the planarization layer.

The display device may further include a first insulating layer between the side surface of the first light emitting element and the first partition wall and a second insulating layer between the side surface of the second light emitting element and the second partition wall.

The common electrode may be between the second insulating layer and the second partition wall.

The display device may further include a third pixel electrode on the substrate and spaced apart from the first pixel electrode and the second pixel electrode and a third light emitting element on the third pixel electrode and configured to emit the first light.

The display device may further include a wavelength conversion layer on the third light emitting element and configured to convert the first light emitted from the third light emitting element into third light and a second partition wall between a side surface of the second light emitting element and a side surface of the wavelength conversion layer.

The common electrode may be between the third light emitting element and the wavelength conversion layer.

The display device may further include a color filter on the wavelength conversion layer and configured to transmit the third light and block the first light.

The display device may further include a reflective conductive layer on the first partition wall, and the common electrode may be on the reflective conductive layer.

The display device may further include a third pixel electrode on the substrate and spaced apart from the first pixel electrode and the second pixel electrode, a second connection electrode on the third pixel electrode, a third connection electrode on the second connection electrode, and a third light emitting element on the third connection electrode.

The common electrode may be on an upper surface of the third light emitting element.

The display device may further include a second partition wall between a side surface of the second light emitting element and a side surface of the third connection electrode and a third partition wall on a side surface of the third light emitting element.

The second partition wall and the third partition wall may have conductivity.

The display device may further include a second oxide layer on an upper surface of the second partition wall and a third oxide layer on an upper surface of the third partition wall.

According to an embodiment of the present disclosure, a display device includes a substrate, a first pixel electrode on the substrate, a second pixel electrode on the substrate and spaced apart from the first pixel electrode, a first light emitting element on the first pixel electrode and configured to emit first light, a second light emitting element on the second pixel electrode and configured to emit second light, and a common electrode on an upper surface of the first light emitting element and an upper surface of the second light emitting element. A minimum distance between the substrate and the first light emitting element is smaller than a minimum distance between the substrate and the second light emitting element.

The display device may further include a first partition wall surrounding a side surface of the first light emitting element and a second partition wall surrounding a side surface of the second light emitting element. The second partition wall may be on the first partition wall.

The display device may further include a first connection electrode between the second pixel electrode and the second light emitting element.

A thickness of the first light emitting element may be the same as a thickness of the first connection electrode.

The display device may further include a third pixel electrode on the substrate and spaced apart from the first pixel electrode and the second pixel electrode and a third light emitting element on the third pixel electrode and configured to emit third light. The common electrode may be on an upper surface of the third light emitting element, and a minimum distance between the substrate and the third light emitting element may be greater than the minimum distance between the substrate and the second light emitting element.

The display device may further include a third partition wall surrounding a side surface of the third light emitting element. The first partition wall, the second partition wall, and the third partition wall may have conductivity.

The display device may further include a first oxide layer on the first partition wall, a second oxide layer on the second partition wall, and a third oxide layer on the third partition wall.

The display device may further include a first connection electrode between the third pixel electrode and the third light emitting element and a second connection electrode between the first connection electrode and the third light emitting element.

The thickness of the first light emitting element may be the same as a thickness of the first connection electrode, and a thickness of the second light emitting element may be the same as a thickness of the second connection electrode.

According to an embodiment of the present disclosure, a method of fabricating a display device includes bonding a first bonding metal layer on a first substrate to a second bonding metal layer on a first light emitting element layer of a second substrate, forming a first light emitting element on a first pixel electrode by removing the second substrate and etching the first light emitting element layer, forming a first insulating layer on the first light emitting element, forming a first partition wall by forming a first partition wall layer on the first insulating layer and etching the first partition wall layer to expose an upper surface of the first light emitting element, forming a first oxide layer by oxidizing an upper surface of the first partition wall, forming first openings penetrating the first oxide layer and the first partition wall, forming a first connection electrode in one of the first openings on a second pixel electrode from among the first openings, forming a third bonding metal layer on the first connection electrode and bonding the third bonding metal layer to a fourth bonding metal layer on a second light emitting element layer of a third substrate, and forming a second light emitting element on the first connection electrode by removing the third substrate and etching the second light emitting element layer.

According to the aforementioned and other embodiments of the present disclosure, each of the plurality of pixels includes a first light emitting element and a third light emitting element for emitting a first light, a second light emitting element for emitting a second light, and a fourth light emitting element for emitting a third light. Therefore, only one wavelength conversion layer is included to convert the first light of the third light emitting element into the third light, thereby simplifying a fabrication process.

According to the aforementioned and other embodiments of the present disclosure, each of the plurality of pixels includes a first light emitting element for emitting a first light, a second light emitting element for emitting a second light, and a third light emitting element for emitting a third light. Therefore, the display device may display colors without a wavelength conversion layer. Also, because the wavelength conversion layer can be omitted, a fabrication process may be facilitated.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
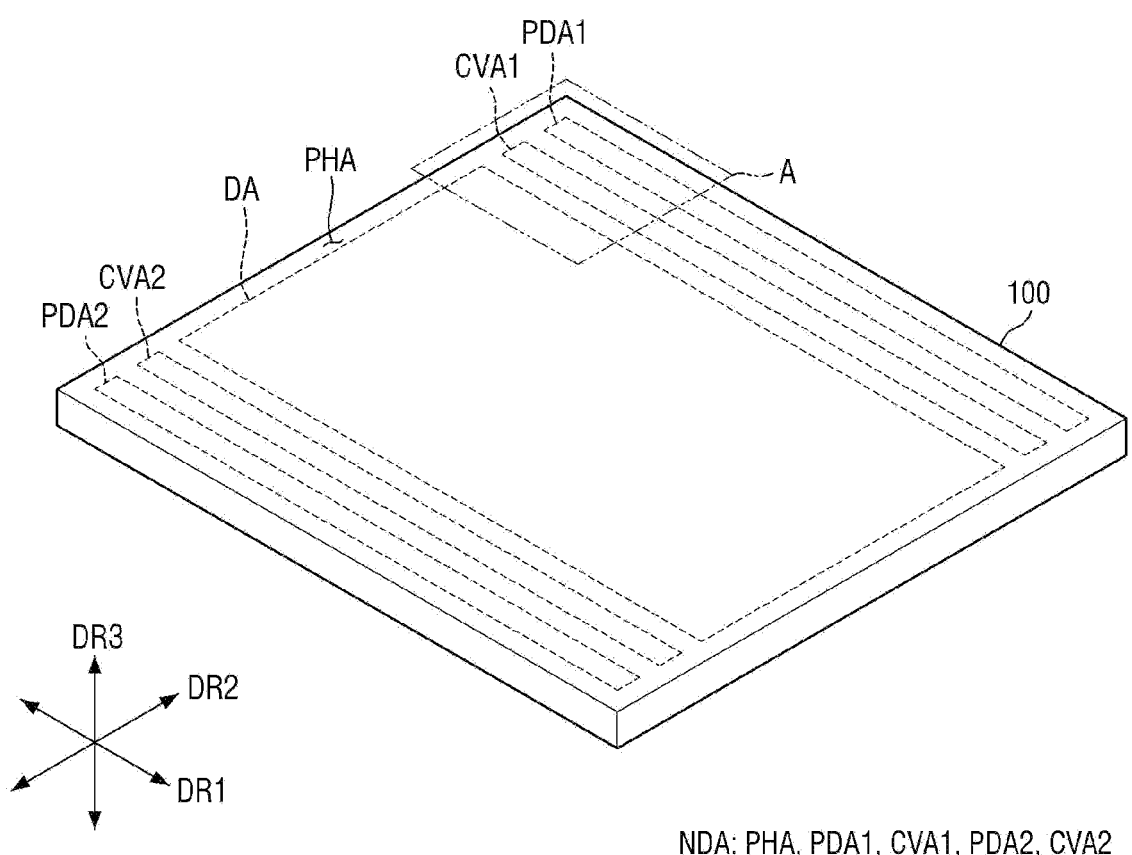
FIG. 1 is a layout view of a display device according to an embodiment.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The present disclosure and the described embodiments, however, may be embodied in various different forms and should not be construed as being limited to only the embodiments illustrated herein. Rather, these embodiments are provided as examples so that this disclosure will be thorough and complete and will fully convey the aspects and features of embodiments of the present disclosure to those skilled in the art. Accordingly, processes, elements, and techniques that are not necessary to those having ordinary skill in the art for a complete understanding of the aspects and features of embodiments of the present disclosure may not be described.

Unless otherwise noted, like reference numerals, characters, or combinations thereof denote like elements throughout the attached drawings and the written description, and thus, descriptions thereof may not be repeated. Further, parts not related to the description of some embodiments may not be shown and/or described to make the description clearer.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the present disclosure as well as aspects and features of embodiments of the present disclosure. Thus, embodiments disclosed herein should not be construed as limited to the particular illustrated shapes of regions but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Similarly, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices may be shown in block diagram form to avoid unnecessarily obscuring aspects and features of the various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane" or "in a plan view" means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly formed on," "directly on," "directly connected to," or "directly coupled to" refers to one component being directly formed on, on, connecting, or coupling another component without an intermediate component. Other expressions describing relationships between components such as "between," "immediately between," or "adjacent to" and "directly adjacent to" may be construed similarly. In addition, it will also be understood that when an element or layer is referred to as being "between" two elements or layers, it may be the only element or layer between the two elements or layers or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system and may be interpreted in a broader sense. For example, the x-axis, the y-axis, and the z-axis may be perpendicular to one another or may represent different directions that are not perpendicular to one another. The same applies for first, second, and/or third directions.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

Figure 2:
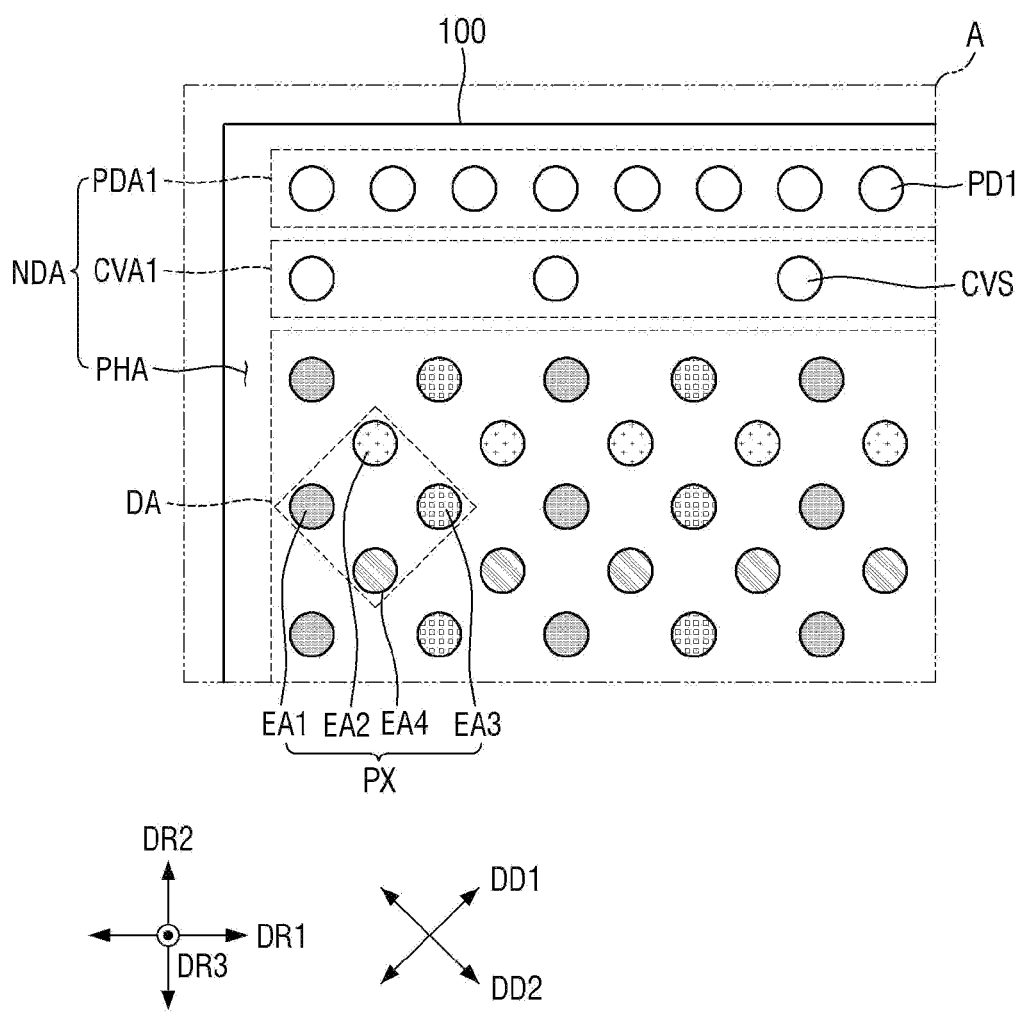
FIG. 2 is a layout view of the area A of FIG. 1 according to an embodiment.
Figure 3:
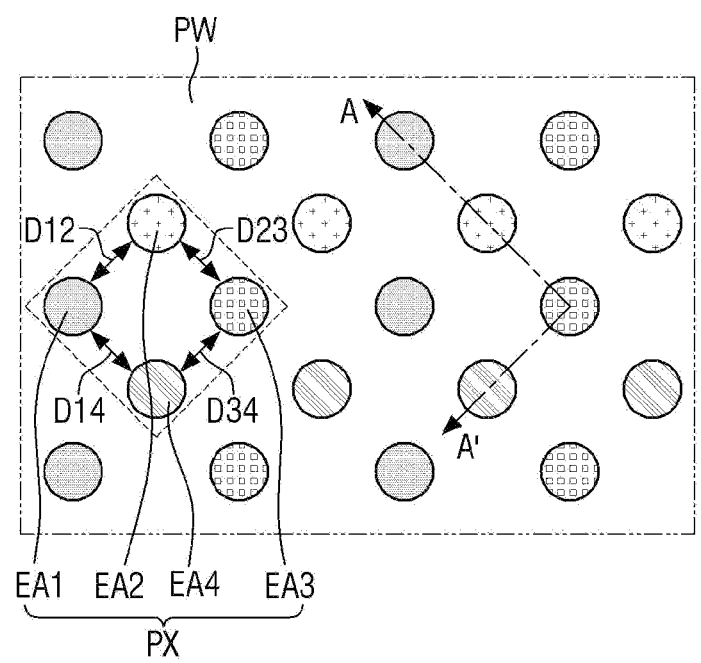
FIG. 3 is a layout view illustrating pixels of a display panel according to an embodiment.

FIG. 1 is a layout view of a display device according to an embodiment. FIG. 2 is a detailed layout view of the area A of FIG. 1. FIG. 3 is a layout view illustrating pixels PX of the display panel according to an embodiment.

In FIGS. 1 through 3, the display device is primarily described as an ultra-small light emitting diode display (e.g., a micro-light emitting diode display) including an ultra-small light emitting diode (e.g., a micro-light emitting diode) as a light emitting element, but embodiments of the present disclosure are not limited thereto.

In addition, in FIGS. 1 through 3, the display device is primarily described as a light emitting diode on silicon (LEDoS) display device in which light emitting diodes are disposed as light emitting elements on a semiconductor circuit board formed by using a semiconductor process. However, it should be noted that embodiments of the present disclosure are not limited thereto.

In addition, in FIGS. 1 through 3, a first direction DR1 refers to a horizontal direction of the display panel, a second direction DR2 refers to a vertical direction (in a plan view) of the display panel, and a third direction DR3 refers to a thickness direction of the display panel or a thickness direction of the semiconductor circuit board. Herein, "left," "right," "upper," and "lower" refer to directions when the display panel is viewed in a plan view. For example, a "right side" refers to one side in the first direction DR1, a "left side" refers to the other side in the first direction DR1, an "upper side" refers to one side in the second direction DR2, and a "lower side" refers to the other side in the second direction DR2. In addition, "top" refers to one side in the third direction DR3, and "bottom" refers to the other side in the third direction DR3.

Referring to FIGS. 1 through 3, the display device according to an embodiment includes a display panel 100 having a display area DA and a non-display area NDA.

The display panel 100 may have a quadrilateral planar shape having long sides in the first direction DR1 and short sides in the second direction DR2. However, the planar shape of the display panel 100 is not limited thereto, and the display panel 100 may also have a polygonal, circular, oval, or irregular planar shape other than the quadrilateral shape.

The display area DA may be an area where an image is displayed (e.g., is to be displayed), and the non-display area NDA may be an area where no image is displayed. The planar shape of the display area DA may follow the planar shape of the display panel 100. In FIG. 1, the planar shape of the display area DA is a quadrilateral shape. The display area DA may be disposed in a central area of the display panel 100. The non-display area NDA may be disposed around (e.g., around a periphery of) the display area DA. The non-display area NDA may surround (e.g., may surround in a plan view or may extend around a periphery of) the display area DA.

The display area DA of the display panel 100 may include a plurality of pixels PX. Each of the pixels PX may be defined as a minimum light emitting unit that can display white light.

Each of the pixels PX may include a plurality of light emitting areas EA1 through EA4. In an embodiment of the present disclosure, each of the pixels PX includes four light emitting areas EA1 through EA4, but embodiments of the present disclosure are not limited thereto.

Each of the light emitting areas EA1 through EA4 may include a light emitting element to emit light. Although each of the light emitting areas EA1 through EA4 is illustrated as having a circular planar shape, embodiments of the present disclosure are not limited thereto. For example, each of the light emitting areas EA1 through EA4 may also have a polygonal, oval, or irregular planar shape.

Each of first light emitting areas EA1 refers to an area that emits first light. Each of the first light emitting areas EA1 may output the first light emitted from a first light emitting element LE1 as it is (e.g., without modification or variation to the emitted wavelength). The first light may be light in a blue wavelength band. The blue wavelength band may be in a range from about 370 nm to about 460 nm, but embodiments of the present disclosure are not limited thereto.

Each of second light emitting areas EA2 refers to an area that emits second light. Each of the second light emitting areas EA2 may output the second light emitted from a second light emitting element LE2 as it is. The second light may be light in a green wavelength band. The green wavelength band may be in a range from about 480 nm to about 560 nm, but embodiments of the present disclosure are not limited thereto.

Each of third light emitting areas EA3 refers to an area that emits third light. Each of the third light emitting areas EA3 may convert a portion of the first light emitted from a third light emitting element LE3 into the third light and output the third light. The third light may be light in a red wavelength band. The red wavelength band may be in a range from about 600 nm to about 750 nm, but embodiments of the present disclosure are not limited thereto.

Each of fourth light emitting areas EA4 refers to an area that emits the second light. Each of the fourth light emitting areas EA4 may output the second light emitted from a fourth light emitting element LE4 as it is.

In the display area DA, the first light emitting areas EA1 and the third light emitting areas EA3 may be alternately disposed in the first direction DR1. In the display area DA, the second light emitting areas EA2 and the fourth light emitting areas EA4 may be alternately disposed in the second direction DR2.

In the display area DA, the first light emitting areas EA1, the second light emitting areas EA2, the third light emitting areas EA3, and the fourth light emitting areas EA4 may be alternately disposed in a first diagonal direction DD1 and a second diagonal direction DD2. The first diagonal direction DD1 may be a diagonal direction between the first direction DR1 and the second direction DR2, and the second diagonal direction DD2 may be a direction crossing (or orthogonal to) the first diagonal direction DD1.

In each of the pixels PX, the first light emitting area EA1 and the third light emitting area EA3 may be disposed in the first direction DR1, and the second light emitting area EA2 and the fourth light emitting area EA4 may be disposed in the second direction DR2. In each of the pixels PX, the first light emitting area EA1 and the second light emitting area EA2 may be disposed in the first diagonal direction DD1, the second light emitting area EA2 and the third light emitting area EA3 may be disposed in the second diagonal direction DD2, and the third light emitting area EA3 and the fourth light emitting area EA4 may be disposed in the first diagonal direction DD1.

The area of the first light emitting area EA1, the area of the second light emitting area EA2, the area of the third light emitting area EA3, and the area of the fourth light emitting area EA4 may be substantially the same, but embodiments of the present disclosure are not limited thereto. For example, the area of the second light emitting area EA2 and the area of the fourth light emitting area EA4 may be substantially the same, but the area of the first light emitting area EA1 may be smaller than the area of the second light emitting area EA2, and the area of the third light emitting area EA3 may be larger than the area of the second light emitting area EA2. In other embodiments, the area of the second light emitting area EA2 and the area of the fourth light emitting area EA4 may be substantially the same, but the area of the third light emitting area EA3 may be smaller than the area of the second light emitting area EA2, and the area of the first light emitting area EA1 may be larger than the area of the second light emitting area EA2.

In addition, a minimum distance D12 between the first light emitting area EA1 and the second light emitting area EA2 neighboring each other, a minimum distance D23 between the second light emitting area EA2 and the third light emitting area EA3 neighboring each other, a minimum distance D14 between the first light emitting area EA1 and the fourth light emitting area EA4 neighboring each other, and a minimum distance D34 between the third light emitting area EA3 and the fourth light emitting area EA4 neighboring each other may be substantially the same, but embodiments of the present disclosure are not limited thereto. For example, the minimum distance D12 between the first light emitting area EA1 and the second light emitting area EA2 neighboring each other and the minimum distance D23 between the second light emitting area EA2 and the third light emitting area EA3 neighboring each other may be different, and the minimum distance D14 between the first light emitting area EA1 and the fourth light emitting area EA4 neighboring each other and the minimum distance D34 between the third light emitting area EA3 and the fourth light emitting area EA4 neighboring each other may be different. In such an embodiment, the minimum distance D12 between the first light emitting area EA1 and the second light emitting area EA2 neighboring each other and the minimum distance D14 between the first light emitting area EA1 and the fourth light emitting area EA4 neighboring each other may be substantially the same, and the minimum distance D23 between the second light emitting area EA2 and the third light emitting area EA3 neighboring each other and the minimum distance D34 between the third light emitting area EA3 and the fourth light emitting area EA4 neighboring each other may be substantially the same.

In addition, the first light emitting area EA1 may emit the first light, the second light emitting area EA2 and the fourth light emitting area EA4 may emit the second light, and the third light emitting area EA3 may emit the third light, but embodiments of the present disclosure area not limited thereto. For example, the first light emitting area EA1 may emit the first light, the second light emitting area EA2 and the fourth light emitting area EA4 may emit the third light, and the third light emitting area EA3 may emit the second light. In other embodiments, the first light emitting area EA1 may emit the second light, the second light emitting area EA2 and the fourth light emitting area EA4 may emit the first light, and the third light emitting area EA3 may emit the third light. In other embodiments, the first light emitting area EA1 may emit the first light, the second light emitting area EA2 may emit the second light, the third light emitting area EA3 may emit the third light, and the fourth light emitting area EA4 may emit fourth light. The fourth light may be light in a yellow wavelength band. That is, a primary peak wavelength of the fourth light may be in a range from about 550 nm to about 600 nm, but embodiments of the present disclosure are not limited thereto.

The display area DA of the display panel 100 may further include a partition wall portion PW that separates the light emitting areas EA1 through EA4. The partition wall portion PW may include a plurality of partition walls.

The non-display area NDA may include common voltage supply units CVS, a first pad portion PDA1, and a second pad portion PDA2.

The first pad portion PDA1 may be disposed on an upper side of the display panel 100. The first pad portion PDA1 may include first pads PD1 connected to an external circuit board.

The second pad portion PDA2 may be disposed on a lower side of the display panel 100. The second pad portion PDA2 may include second pads PD2 so as to be connected to an external circuit board. In some embodiments, the second pad portion PDA2 may be omitted.

The common voltage supply units CVS may be disposed between the first pad portion PDA1 and the display area DA. In addition, the common voltage supply units CVS may be disposed between the second display portion PDA2 and the display area DA. The common voltage supply units CVS may be connected to a common electrode. Therefore, a common voltage of the common voltage supply units CVS may be supplied to the common electrode. The common voltage supply units CVS may be electrically connected to any one of the first pads PD1 of the first pad portion PDA1. In some embodiments, the common voltage supply units CVS may be electrically connected to any one of the second pads PD2 of the second pad portion PDA2.

Figure 4:
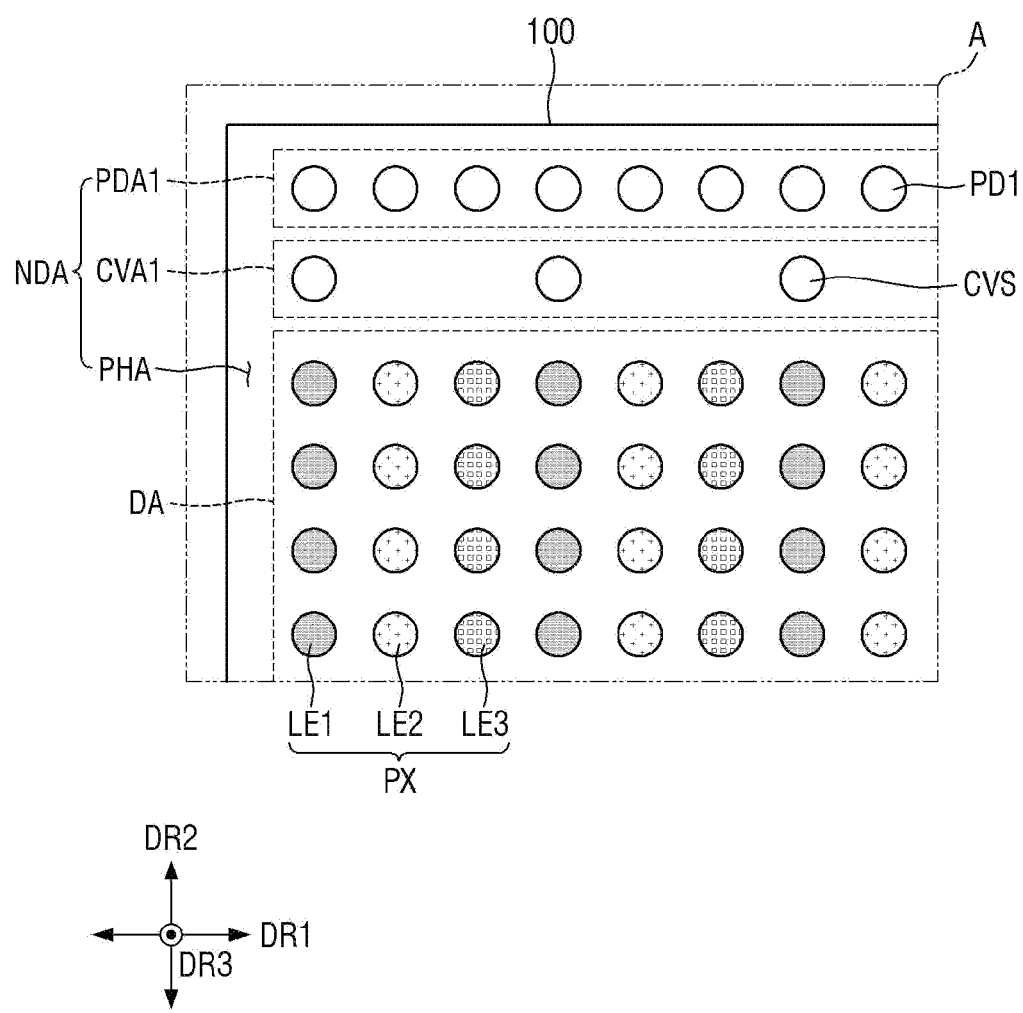
FIG. 4 is a layout view of the area A of FIG. 1 according to another embodiment.

FIG. 4 is a layout view of the area A of FIG. 1 according to another embodiment.

In FIG. 4, different from the embodiment shown in FIG. 2, each of a plurality of pixels PX includes three light emitting areas EA1 through EA3. In describing the embodiment shown in FIG. 4, differences from the embodiment shown in FIG. 2 will be primarily described.

Referring to FIG. 4, first light emitting areas EA1, second light emitting areas EA2, and third light emitting areas EA3 may be alternately arranged in the first direction DR1. For example, the first light emitting areas EA1, the second light emitting areas EA2, and the third light emitting areas EA3 may be disposed in the order of the first light emitting area EA1, the second light emitting area EA2, and the third light emitting area EA3 in the first direction DR1. In addition, in each of the pixels PX, the first light emitting area EA1, the second light emitting area EA2, and the third light emitting area EA3 may be arranged in the first direction DR1.

The first light areas EA1 may be arranged in the second direction DR2. The second light emitting areas EA2 may be arranged in the second direction DR2. The third light emitting areas EA3 may be arranged in the second direction DR2.

Figure 5:
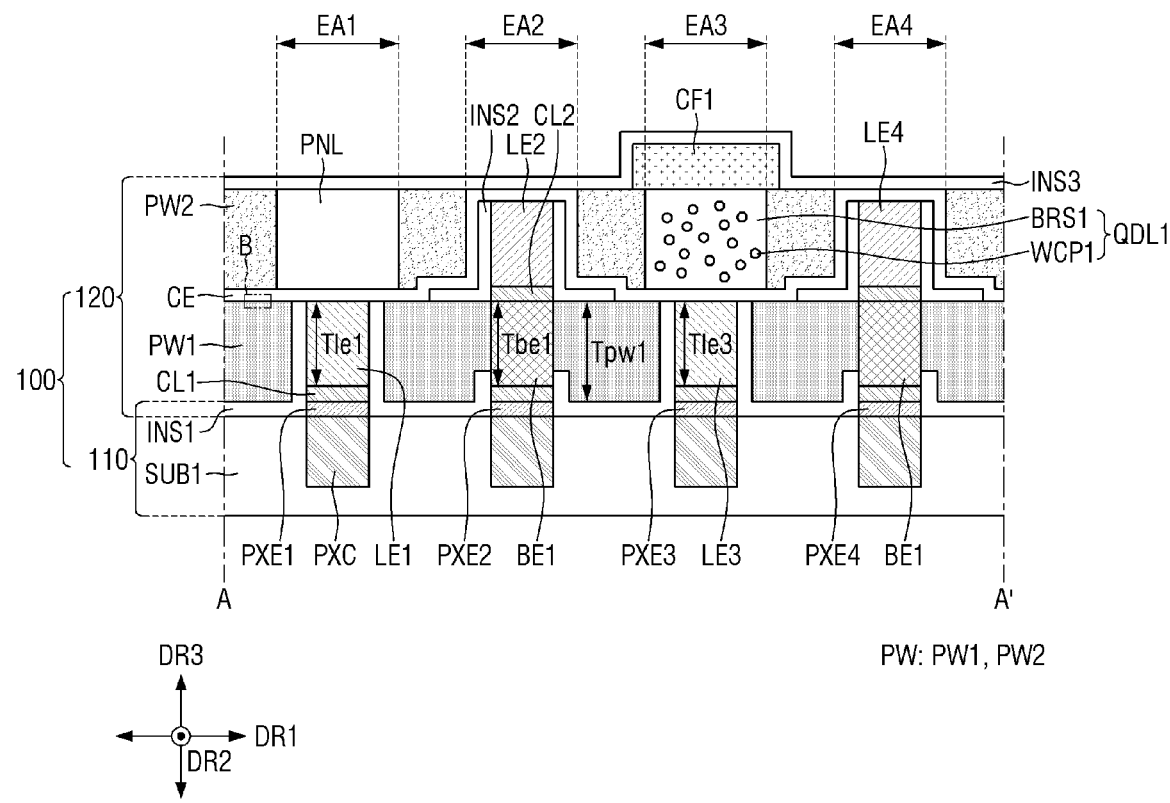
FIG. 5 is a cross-sectional view of the display panel taken along the line A-A' of FIG. 3.
Figure 6:
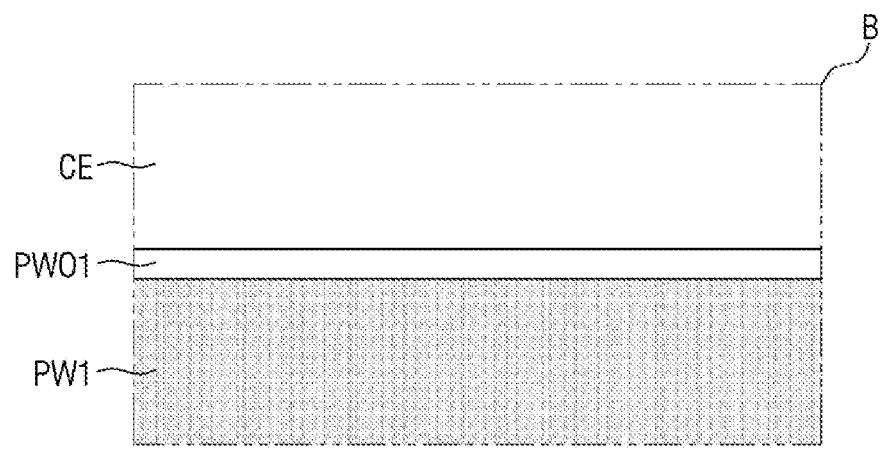
FIG. 6 is a cross-sectional view of the area B of FIG. 5.
Figure 7:
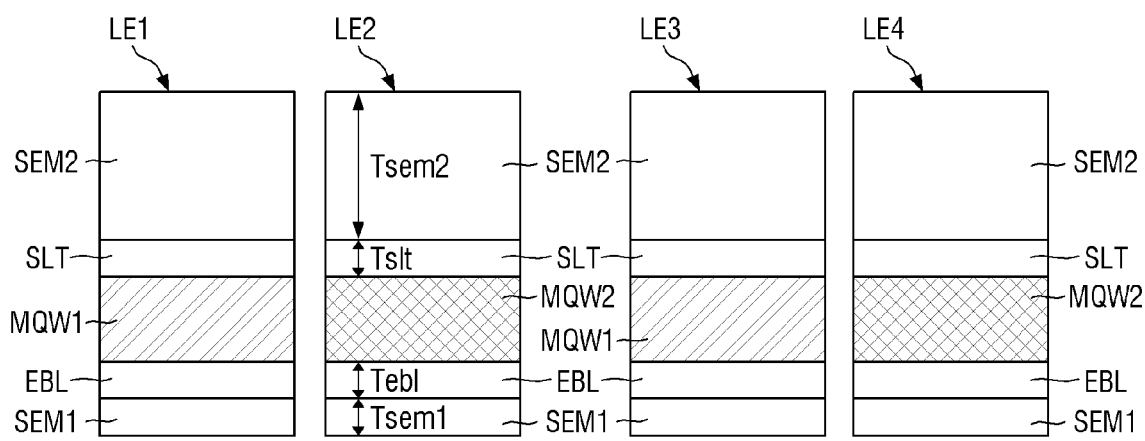
FIG. 7 is an enlarged cross-sectional view illustrating a first light emitting element, a second light emitting element, a third light emitting element, and a fourth light emitting element shown in FIG. 5 in more detail.

FIG. 5 is a cross-sectional view of the display panel 100 taken along the line A-A' of FIG. 3 according to an embodiment. FIG. 6 is a cross-sectional view of an example of the area B of FIG. 5. FIG. 7 is an enlarged cross-sectional view illustrating a first light emitting element LE1, a second light emitting element LE2, a third light emitting element LE3, and a fourth light emitting element LE4 shown in FIG. 5 in detail.

Referring to FIGS. 5 through 7, the display panel 100 may include the semiconductor circuit board 110 and a light emitting element layer 120.

The semiconductor circuit board 110 may include a first substrate SUB1, a plurality of pixel circuit units PXC, and pixel electrodes PXE1 through PXE4.

The first substrate SUB1 may be a silicon wafer substrate. The first substrate SUB1 may be made of monocrystalline silicon.

Each of the pixel circuit units PXC may be disposed on the first substrate SUB1. Each of the pixel circuit units PXC may include a complementary metal oxide semiconductor (CMOS) circuit formed by using a semiconductor process. Each of the pixel circuit units PXC may include at least one transistor formed by using a semiconductor process. In addition, each of the pixel circuit units PXC may further include at least one capacitor formed by using a semiconductor process.

The pixel circuit units PXC may be disposed in the display area DA. Each of the pixel circuit units PXC may be connected to a corresponding pixel electrode PXE1/PXE2/PXE3/PXE4 from among the pixel electrodes PXE1 through PXE4. For example, the pixel circuit units PXC and the pixel electrodes PXE1 through PXE4 may be connected to each other in a one-to-one manner. Each of the pixel circuit units PXC may apply a pixel voltage (or an anode voltage) to a corresponding pixel electrode PXE1/PXE2/PXE3/PXE4.

Each of the pixel electrodes PXE1 through PXE4 may be disposed on a corresponding pixel circuit unit PXC. Each of the pixel electrodes PXE1 through PXE4 may be an exposed electrode exposed from the pixel circuit unit PXC. For example, each of the pixel electrodes PXE1 through PXE4 may protrude from an upper surface of the pixel circuit unit PXC. Each of the pixel electrodes PXE1 through PXE4 may be integrally formed with the pixel circuit unit PXC. Each of the pixel electrodes PXE1 through PXE4 may receive a pixel voltage (or an anode voltage) from the pixel circuit unit PXC. The pixel electrodes PXE1 through PXE4 may be made of aluminum (Al). However, embodiments of the present disclosure are not limited thereto, and the pixel electrodes PXE1 through PXE4 may also be made of another metal.

Each of first pixel electrodes PXE1 may be disposed in a corresponding first light emitting area EA1. Each of second pixel electrodes PXE2 may be disposed in a corresponding second light emitting area EA2. Each of third pixel electrodes PXE3 may be disposed in a corresponding third light emitting area EA3. Each of fourth pixel electrodes PXE4 may be disposed in a corresponding fourth light emitting area EA4.

The light emitting element layer 120 may be a layer including the light emitting elements LE1 through LE4 to emit light (e.g., predetermined light). The light emitting element layer 120 may include first conductive layers CL1, second conductive layers CL2, first connection electrodes BE1, the light emitting elements LE1 through LE4, a common electrode CE, a first insulating layer INS1, a second insulating layer INS2, a third insulating layer INS3, a planarization layer PNL, a first wavelength conversion layer QDL1, a first color filter CF1, and a partition wall portion PW. The partition wall portion PW may include a first partition wall PW1 and a second partition wall PW2.

Each of the first conductive layers CL1 may be disposed on a corresponding pixel electrode PXE1/PXE2/PXE3/PXE4. The first conductive layers CL1 may be bonding metal layers for bonding the pixel electrodes PXE1 through PXE4 to the light emitting elements LE. For example, each of the first conductive layers CL1 may include at least any one of gold (Au), copper (Cu), aluminum (Al), and tin (Sn). In another embodiment, each of the first conductive layers CL1 may include a first layer including any one of gold (Au), copper (Cu), aluminum (Al) and tin (Sn) and a second layer including another one of gold (Au), copper (Cu), aluminum (Al) and tin (Sn). In such an embodiment, the second layer may be disposed on the first layer.

The light emitting element layer 120 may include the first light emitting areas EA1, the second light emitting areas EA2, the third light emitting areas EA3, and the fourth light emitting areas EA4 separated by the partition wall portion PW. The first light emitting element LE1 may be disposed in each of the first light emitting areas EA1, the second light emitting element LE2 may be disposed in each of the second light emitting areas EA2, the third light emitting element LE3 may be disposed in each of the third light emitting areas EA3, and the fourth light emitting element LE4 may be disposed in each of the fourth light emitting areas EA4.

Each of the first light emitting element LE1, the second light emitting element LE2, the third light emitting element LE3, and the fourth light emitting element LE4 may be a vertical light emitting diode element extending in the third direction DR3. For example, a length of each of the first light emitting element LE1, the second light emitting element LE2, the third light emitting element LE3, and the fourth light emitting element LE4 in the third direction DR3 may be greater than a length thereof in the horizontal direction. The length in the horizontal direction refers to a length in the first direction DR1 or a length in the second direction DR2. For example, the length of each of the first light emitting element LE1, the second light emitting element LE2, the third light emitting element LE3, and the fourth light emitting element LE4 in the third direction DR3 may be about 1 µm to 5 µm.

Each of the first light emitting element LE1, the second light emitting element LE2, the third light emitting element LE3, and the fourth light emitting element LE4 may be a micro-light emitting diode element. The first light emitting element LE1 and the third light emitting element LE3 may be substantially the same, and the second light emitting element LE2 and the fourth light emitting element LE4 may be substantially the same.

Each of the first light emitting element LE1 and the third light emitting element LE3 may include a first semiconductor layer SEM1, an electron blocking layer EBL, a first active layer MQW1, a superlattice layer SLT, and a second semiconductor layer SEM2 as illustrated in FIG. 7. Each of the second light emitting element LE2 and the fourth light emitting element LE4 may include a first semiconductor layer SEM1, an electron blocking layer EBL, a second active layer MQW2, a superlattice layer SLT, and a second semiconductor layer SEM2 as illustrated in, for example, FIG. 7. The first semiconductor layer SEM1, the electron blocking layer EBL, the first active layer MQW1 or the second active layer MQW2, the superlattice layer SLT, and the second semiconductor layer SEM2 may be sequentially stacked in the third direction DR3.

The first semiconductor layer SEM1 may be disposed on a first conductive layer CL1. The first semiconductor layer SEM1 may be doped with a dopant of a first conductive type, such as Mg, Zn, Ca, Se, or Ba. For example, the first semiconductor layer SEM1 may be p-GaN doped with p-type Mg. A thickness Tsem1 of the first semiconductor layer SEM1 may be in a range of about 30 nm to about 200 nm.

The electron blocking layer EBL may be disposed on the first semiconductor layer SEM1. The electron blocking layer EBL may be a layer for suppressing (or preventing) too many electrons from flowing into the first active layer MQW1 or the second active layer MQW2. For example, the electron blocking layer EBL may be p-AlGaN doped with p-type Mg. A thickness Tebl of the electron blocking layer EBL may be in a range of about 10 nm to about 50 nm. In some embodiments, the electron blocking layer EBL may be omitted.

The first active layer MQW1 may be disposed on the electron blocking layer EBL in each of the first light emitting element LE1 and the third light emitting element LE3. The first active layer MQW1 may emit light through the combination of electron-hole pairs according to an electrical signal received though the first semiconductor layer SEM1 and the second semiconductor layer SEM2. The first active layer MQW1 may emit the first light, that is, light in the blue wavelength band.

The second active layer MQW2 may be disposed on the electron blocking layer EBL in each of the second light emitting element LE2 and the fourth light emitting element LE4. The second active layer MQW2 may emit light through combination of electron-hole pairs according to an electrical signal received though the first semiconductor layer SEM1 and the second semiconductor layer SEM2. The second active layer MQW2 may emit the second light, that is, light in the green wavelength band.

Each of the first active layer MQW1 and the second active layer MQW2 may include a material having a single or multiple quantum well structure. When each of the first active layer MQW1 and the second active layer MQW2 includes a material having a multiple quantum well structure, it may have a structure in which a plurality of well layers and a plurality of barrier layers are alternately stacked. In some embodiments, the well layers may be made of InGaN and the barrier layers may be made of GaN or AlGaN, but embodiments of the present disclosure are not limited thereto. The well layers may have a thickness in a range of about 1 nm to about 4 nm, and the barrier layers may have a thickness in a range of about 3 nm to about 10 nm.

Alternatively, each of the first active layer MQW1 and the second active layer MQW2 may have a structure in which a semiconductor material having a large band gap energy and a semiconductor material having a small band gap energy are alternately stacked or may include different Group 3 to 5 semiconductor materials depending on the wavelength band of light to be emitted.

When each of the first active layer MQW1 and the second active layer MQW2 includes InGaN, the color of emitted light may vary according to the content of indium (In). As the indium content increases, the wavelength band of light emitted from an active layer may move toward the red wavelength band. As the indium content decreases, the wavelength band of light emitted from the active layer may move toward the blue wavelength band. Therefore, the indium content of the first active layer MQW1 may be lower than the indium content of the second active layer MQW2. For example, the indium content of the first active layer MQW1 may be in a range of about 10 wt % to about 20 wt %, and the indium content of the second active layer MQW2 may be in a range of about 20 wt % to about 30 wt %. In such an embodiment, the first active layer MQW1 may emit the first light, and the second active layer MQW2 may emit the second light.

The superlattice layer SLT may be disposed on each of the first active layer MQW1 and the second active layer MQW2. The superlattice layer SLT may be a layer for relieving stress between the second semiconductor layer SEM2 and the first active layer MQW1 or the second active layer MQW2. For example, the superlattice layer SLT may be made of InGaN or GaN. A thickness Tslt of the superlattice layer SLT may be in a range of about 50 nm to about 200 nm. In some embodiments, the superlattice layer SLT may be omitted.

The second semiconductor layer SEM2 may be disposed on the superlattice layer SLT. The second semiconductor layer SEM2 may be doped with a dopant of a second conductivity type, such as Si, Ge, or Sn. For example, the second semiconductor layer SEM2 may be n-GaN doped with n-type Si. A thickness Tsem2 of the second semiconductor layer SEM2 may be in a range of about 2 μm to about 4 μm.

The first light emitting element LE1 may be disposed on the first conductive layer CL1 in each of the first light emitting areas EA1. The third light emitting element LE3 may be disposed on the first conductive layer CL1 in each of the third light emitting areas EA3.

The first connection electrode BE1 may be disposed on the first conductive layer CL1 in each of the second light emitting areas EA2 and the fourth light emitting areas EA4. The first connection electrode BE1 may be made of a metal material having high conductivity. For example, the first connection electrode BE1 may be made of a metal material, such as molybdenum (Mo), aluminum (Al), chromium (Cr), gold (Au), tin (Sn), titanium (Ti), nickel (Ni), neodymium (Nd), or copper (Cu). A thickness Tle1 of the first light emitting element LE1, a thickness Tle3 of the third light emitting element LE3, and a thickness Tbe1 of the first connection electrode BE1 may be substantially the same. The thickness Tle1 of the first light emitting element LE1 refers to the length of the first light emitting element LE1 in the third direction DR3.

The first insulating layer INS1 may be disposed on side surfaces of each of the first and third light emitting elements LE1 and LE3. The first insulating layer INS1 may not be disposed on an upper surface of each of the first and third light emitting elements LE1 and LE3. In addition, the first insulating layer INS1 may be disposed on side surfaces of each of the pixel electrodes PXE1 through PXE4 and the first conductive layers CL1. In addition, the first insulating layer INS1 may be disposed on part of side surfaces of each of the first connection electrodes BE1.

In addition, the first insulating layer INS1 may be disposed on the first substrate SUB1. In other embodiments, the first insulating layer INS1 disposed on the first substrate SUB1 may be omitted.

The first insulating layer INS1 may be formed of an inorganic layer, such as a silicon oxide (e.g., $SiO_2$) layer, an aluminum oxide (e.g., $Al_2O_3$) layer, or a hafnium oxide ($HfO_x$) layer, but embodiments of the present disclosure are not limited thereto.

The first partition wall PW1 may be disposed on the side surfaces of each of the first and third light emitting elements LE1 and LE3. The first partition wall PW1 may surround the side surfaces of each of the first and third light emitting elements LE1 and LE3. The first partition wall PW1 may be disposed on the side surfaces of each of the first connection electrodes BE1. The first partition wall PW1 may surround the side surfaces of each of the first connection electrode BE1.

The first partition wall PW1 may be disposed on the first insulating layer INS1. Side surfaces of the first partition wall PW1 may contact the first insulating layer INS1 disposed on the side surfaces of each of the first and third light emitting elements LE1 and LE3 and the first connection electrodes BE1. A lower surface of the first partition wall PW1 may contact the first insulating layer INS1 disposed on the first substrate SUB1. In other embodiments in which the first insulating layer INS1 disposed on the first substrate SUB1 is omitted, the lower surface of the first partition wall PW1 may contact the first substrate SUB1.

An upper surface of the first partition wall PW1, an upper surface of the first insulating layer INS1, the upper surface of the first light emitting element LE1, the upper surface of the third light emitting element LE3, and upper surfaces of the first connection electrodes BE1 may be connected (e.g., may be directly adjacent to each other without a gap therebetween) to form a flat surface. While the first insulating layer INS1 is disposed between the first partition wall PW1 and the first substrate SUB1, the first pixel electrode PXE1 and the first conductive layer CL1 are disposed between the first light emitting element LE1 and the first substrate SUB1. Therefore, a thickness Tpw1 of the first partition wall PW1 may be greater than the thickness Tle1 of the first light emitting element LE1.

The first partition wall PW1 may include a material having conductivity (e.g., a conductive material). For example, the first partition wall PW1 may be made of a metal material having high thermal conductivity. In such an embodiment, heat generated by the first and third light emitting elements LE1 and LE3 may be radiated to the first partition wall PW1. For example, the first partition wall PW1 may dissipate heat generated by the first and third light emitting elements LE1 and LE3.

In addition, the first partition wall PW1 may include a metal material having high reflectivity. In such an embodiment, the first light emitted from the first light emitting element LE1 may be reflected upwardly above the first light emitting element LE1 by the first partition wall PW1. In addition, the first light emitted from the third light emitting element LE3 may be reflected upwardly above the third light emitting element LE3 by the first partition wall PW1. Therefore, the output efficiency of the first light of the first light emitting element LE1 and the output efficiency of the first light of the third light emitting element LE3 may be increased by the first partition wall PW1.

The first partition wall PW1 may be made of aluminum (Al). However, embodiments of the present disclosure are not limited thereto, and the first partition wall PW1 may also be made of an opaque metal material, such as molybdenum (Mo), chromium (Cr), gold (Au), titanium (Ti), nickel (Ni), neodymium (Nd), or copper (Cu).

A first oxide layer PWO1, formed by oxidizing the upper surface of the first partition wall PW1, may be formed on the upper surface of the first partition wall PW1 as illustrated in, for example, FIG. 6. For example, when the first partition wall PW1 is made of aluminum (Al), the first oxide layer PWO1 may be an aluminum oxide (e.g., $Al_2O_3$) layer. The first partition wall PW1 may be electrically insulated from the common electrode CE by the first oxide layer PWO1.

The second conductive layers CL2 may be disposed on the first connection electrodes BE1, respectively. The second conductive layers CL2 may be bonding metal layers for bonding the first connection electrodes BE1 to the second light emitting elements LE2 or the fourth light emitting elements LE4. For example, each of the second conductive layers CL2 may include at least any one of gold (Au), copper (Cu), aluminum (Al), and tin (Sn). In some embodiments, each of the second conductive layers CL2 may include a first layer including any one of gold (Au), copper (Cu), aluminum (Al), and tin (Sn) and a second layer including another one of gold (Au), copper (Cu), aluminum (Al)m and tin (Sn). In such an embodiment, the second layer may be disposed on the first layer.

The second light emitting element LE2 may be disposed on the second conductive layer CL2 in each of the second light emitting areas EA2, and the fourth light emitting element LE4 may be disposed on the second conductive layer CL2 in each of the second light emitting areas EA2.

For example, a minimum distance between the second light emitting element LE2 and the first substrate SUB1 and a minimum distance between the fourth light emitting element LE4 and the first substrate SUB1 may be greater than a minimum distance between the first light emitting element LE1 and the first substrate SUB1 and a minimum distance between the third light emitting element LE3 and the first substrate SUB1. The minimum distance between the first light emitting element LE1 and the first substrate SUB1 and the minimum distance between the third light emitting element LE3 and the first substrate SUB1 may be substantially the same. The minimum distance between the second light emitting element LE2 and the first substrate SUB1 and the minimum distance between the fourth light emitting element LE4 and the first substrate SUB1 may be substantially the same.

The second insulating layer INS2 may be disposed on side surfaces of each of the second and fourth light emitting elements LE2 and LE4. The second insulating layer INS2 may not be disposed on an upper surface of each of the second and fourth light emitting elements LE2 and LE4. In addition, the second insulating layer INS2 may be disposed on side surfaces of each of the second conductive layers CL2. In addition, the second insulating layer INS2 may be disposed on the first partition wall PW1. The second insulating layer INS2 may be formed of an inorganic layer, such as a silicon oxide (e.g., $SiO_2$) layer, an aluminum oxide (e.g., $Al_2O_3$) layer, or a hafnium oxide ($HfO_x$) layer, but embodiments of the present disclosure are not limited thereto.

The common electrode CE may be disposed on the upper surface of each of the light emitting elements LE1 through LE4, an upper surface of the second insulating layer INS2, and the upper surface of the first partition wall PW1. The common electrode CE may be disposed on the side surfaces of each of the second and fourth light emitting elements LE2 and LE4. The common electrode CE may include a transparent conductive material. For example, the common electrode CE may include a transparent conductive oxide (TCO), such as indium tin oxide (ITO) or indium zinc oxide (IZO).

The planarization layer PNL may be disposed on the common electrode CE in each of the first light emitting areas EA1. The planarization layer PNL may overlap the first light emitting element LE1 in the third direction DR3. The common electrode CE may be disposed between the first light emitting element LE1 and the planarization layer PNL in each of the first light emitting areas EA1. The planarization film PNL may be formed of an organic layer, such as acryl resin, epoxy resin, phenolic resin, polyamide resin, or polyimide resin.

The first wavelength conversion layer QDL1 may be disposed on the common electrode CE in each of the third light emitting areas EA3. The first wavelength conversion layer QDL1 may overlap the third light emitting element LE3. The common electrode CE may be disposed between the third light emitting element LE3 and the first wavelength conversion layer QDL1 in each of the third light emitting areas EA3.

The first wavelength conversion layer QDL1 may convert a portion of (or some of) the first light of (e.g., emitted by) the third light emitting element LE3 into the third light and output the third light. The first wavelength conversion layer QDL1 may include a first base resin BRS1 and first wavelength conversion particles WCP1.

The first base resin BRS1 may include a light-transmitting organic material. For example, the first base resin BRS1 may include epoxy resin, acrylic resin, cardo resin, or imide resin.

The first wavelength conversion particles WCP1 may convert the first light of the third light emitting element LE3 into the third light. For example, the first wavelength conversion particles WCP1 may convert light of the blue wavelength band into light of the red wavelength band. The first wavelength conversion particles WCP1 may be quantum dots, quantum rods, a fluorescent material, or a phosphorescent material. The quantum dots may include Group IV nanocrystals, Group II-VI compound nanocrystals, Group III-V compound nanocrystals, Group IV-VI nanocrystals, or a combination thereof.

Each quantum dot may include a core and a shell overcoating the core. The core may be, but is not limited to, at least one of, for example, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. The shell may include, but is not limited to, at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and PbTe.

The first wavelength conversion layer QDL1 may further include scatterers for scattering the first light of the third light emitting element LE3 in various directions. The scatterers may include metal oxide particles or organic particles. For example, the metal oxide may be titanium oxide (e.g., $TiO_2$), zirconium oxide (e.g., $ZrO_2$), silicon dioxide ($SiO_2$), aluminum oxide (e.g., $Al_2O_3$), indium oxide (e.g., $In_2O_3$), zinc oxide (ZnO), or tin oxide (e.g., $SnO_2$). In addition, the organic particles may include acrylic resin or urethane resin. A diameter of the scatterers may be in a range of several nanometers to several tens of nanometers.

The second partition wall PW2 may be disposed on the side surfaces of each of the second and fourth light emitting elements LE2 and LE4, the planarization layer PNL, and the first wavelength conversion layer QDL1. The second partition wall PW2 may surround the side surfaces of each of the second and fourth light emitting elements LE2 and LE4, the planarization layer PNL, and the first wavelength conversion layer QDL1.

The second partition wall PW2 may be disposed on the second insulating layer INS2. Side surfaces of the second partition wall PW2 may contact the second insulating layer INS2 disposed on the side surfaces of each of the second and fourth light emitting elements LE2 and LE4. A lower surface of the second partition wall PW2 may contact the first partition wall PW1 and the first insulating layer INS1 disposed on the first partition wall PW1. An upper surface of the second partition wall PW2, an upper surface of the common electrode CE, an upper surface of the planarization layer PNL, and an upper surface of the first wavelength conversion layer QLD1 may be connected to form a flat surface.

The second partition wall PW2 may include a material having conductivity (e.g., a conductive material). For example, the second partition wall PW2 may be made of a metal material having high thermal conductivity. In such an embodiment, heat generated by the second and fourth light emitting elements LE2 and LE4 may be radiated to the second partition wall PW2. For example, the second partition wall PW2 may dissipate heat generated by the second and fourth light emitting elements LE2 and LE4.

In addition, the second partition wall PW2 may include a metal material having high reflectivity. The second partition wall PW2 may be made of aluminum (Al). However, embodiments of the present disclosure are not limited thereto, and the second partition wall PW2 may also be made of an opaque metal material, such as molybdenum (Mo), chromium (Cr), gold (Au), titanium (Ti), nickel (Ni), neodymium (Nd), or copper (Cu).

When the second partition wall PW2 is made of a metal material having high reflectivity, the first light emitted from the first light emitting element LE1 may be reflected upwardly above the planarization layer PNL by the second partition wall PW2. In addition, the second light emitted from the second light emitting element LE2 and the second light emitted from the fourth light emitting element LE4 may be reflected upwardly above the second light emitting element LE2 and the fourth light emitting element LE4 by the second partition wall PW2. Therefore, the second partition wall PW2 may increase (or improve) the output efficiency (e.g., the light output or emission efficiency) of the first light of the first light emitting element LE1, the output efficiency of the second light of the second light emitting element LE2, and the output efficiency of the second light of the fourth light emitting element LE4.

Further, when the second partition wall PW2 is made of a metal material having high reflectivity, the first light emitted from the third light emitting element LE3 may be reflected by the second partition wall PW2 to re-enter the first wavelength conversion layer QDL1. Therefore, a conversion ratio of the first light emitted from the third light emitting element LE3 to the third light may be increased.

In other embodiments, the second partition wall PW2 may include a light blocking material that absorbs or blocks light. The light blocking material may be an inorganic black pigment, such as carbon black or an organic black pigment. In such an embodiment, the second partition wall PW2 may prevent light emitted from adjacent light emitting elements LE1 through LE4 from being mixed with each other.

The first color filter CF1 may be disposed on the first wavelength conversion layer QDL1 in each of the third light emitting areas EA3. The first color filter CF1 may transmit the third light into which the first light of the third light emitting element ED3 has been converted by the first wavelength conversion layer QDL1 and may absorb or block the first light of the third light emitting element LE3 that is not converted by the first wavelength conversion layer QDL1. For example, the first color filter CF1 may transmit light of the red wavelength band and may absorb or block light of the blue wavelength band. Therefore, each of the third light emitting areas EA3 may emit the third light.

The third insulating layer INS3 may be disposed on an upper surface of the first color filter CF1, the upper surface of the second partition wall PW2, the upper surface of the common electrode CE, and the upper surface of the planarization layer PNL. The third insulating layer INS3 may be disposed on side surfaces of the first color filter CF1. The third insulating layer INS3 may be formed of an inorganic layer, such as a silicon oxide (e.g., $SiO_2$) layer, an aluminum oxide (e.g., $Al_2O_3$) layer, or a hafnium oxide ($HfO_x$) layer, but embodiments of the present disclosure are not limited thereto. In some embodiments, the third insulating layer INS3 may be omitted.

In the embodiment illustrated in FIGS. 5 through 7, the first partition wall PW1 and the second partition wall PW2 are made of a material having conductivity. Therefore, heat generated by the light emitting elements LE1 through LE4 may be radiated to the first partition wall PW1 and the second partition wall PW2.

In addition, the first partition wall PW1 and the second partition wall PW2 are made of a metal material having high reflectivity. Therefore, light emitted from each of the light emitting elements LE1 through LE4 may be reflected upwardly above each of the light emitting elements LE1 through LE4 by the first partition wall PW1 and the second partition wall PW2. Accordingly, the light output efficiency of each of the light emitting elements LE1 through LE4 may be increased by the first partition wall PW1 and the second partition wall PW2.

In addition, the second partition wall PW2 is made of a metal material having high reflectivity. Therefore, the first light of the third light emitting element LE3 may be reflected by the second partition wall PW2 to re-enter the first wavelength conversion layer QDL1. Accordingly, the output efficiency of the third light of the third light emitting element LE3 may be increased.

In addition, the luminous efficiency of the first light emitting element LE1 emitting the first light, the luminous efficiency of the third light emitting element LE3 emitting the first light, and the luminous efficiency of the second light emitting element LE2 emitting the second light are higher than the luminous efficiency of a light emitting element emitting the third light. Therefore, the third light emitting element LE3 emitting the first light may be used instead of the light emitting element emitting the third light and having low luminous efficiency, and the third light may be emitted by using (or by including) the first wavelength conversion layer QDL1.

Further, each of the pixels PX includes the first and third light emitting elements LE1 and LE3 emitting the first light and the second and fourth light emitting elements LE2 and LE4 emitting the second light. Therefore, only the first wavelength conversion layer QDL1 is included to convert the first light of the third light emitting element LE3 into the third light. This can facilitate (e.g., improve) a fabrication process.

Figure 8:
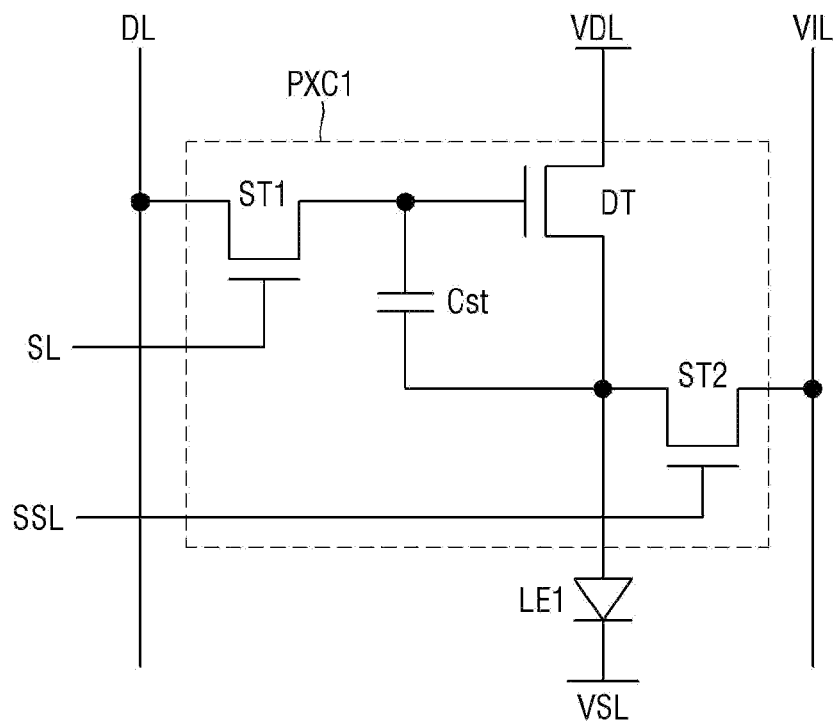
FIG. 8 is a circuit diagram of the first light emitting element and a pixel circuit unit shown in FIG. 5 according to an embodiment.

FIG. 8 is a circuit diagram of the first light emitting element LE1 and the pixel circuit unit PXC shown in FIG. 5 according to an embodiment.

Referring to FIG. 8, a pixel circuit unit PXC may include a driving transistor DT, a first transistor ST1, a second transistor ST2, and a capacitor Cst.

A light emitting element LE emits light according to a driving current. The amount of light emitted from the light emitting element LE may be proportional to the driving current. The light emitting element LE may have an anode connected to a source electrode of the driving transistor DT and a cathode connected to a second power line VSL to which a low potential voltage, lower than a high potential voltage, is supplied.

The driving transistor DT adjusts a current flowing from a first power line VDL, to which a first power supply voltage is supplied, to the light emitting element LE according to a voltage difference between a gate electrode and the source electrode. The gate electrode of the driving transistor DT may be connected to a first electrode of the first transistor ST1, the source electrode thereof may be connected to the anode of the light emitting element LE, and a drain electrode thereof may be connected to the second power line VSL to which a high potential voltage is applied.

The first transistor ST1 is turned on by a scan signal of (or transmitted by) a scan line SL to connect a data line DL to the gate electrode of the driving transistor DT. The first transistor ST1 may have a gate electrode connected to the scan line SL, the first electrode connected to the gate electrode of the driving transistor DT, and a second electrode connected to the data line DL.

The second transistor ST2 is turned on by a sensing signal of a sensing signal line SSL to connect an initialization voltage line VIL to the source electrode of the driving transistor DT. The second transistor ST2 may have a gate electrode connected to the sensing signal line SSL, a first electrode connected to the initialization voltage line VIL, and a second electrode connected to the source electrode of the driving transistor DT.

The first electrode of each of the first and second transistors ST1 and ST2 may be a source electrode, and the second electrode may be a drain electrode. However, it should be noted that embodiments of the present disclosure are not limited thereto. For example, the first electrode of each of the first and second transistors ST1 and ST2 may also be a drain electrode, and the second electrode may also be a source electrode.

The capacitor Cst is formed between the gate electrode and the source electrode of the driving transistor DT. The storage capacitor Cst stores a difference voltage between a gate voltage and a source voltage of the driving transistor DT.

Although the driving transistor DT and the first and second transistors ST1 and ST2 are primarily described as N-type metal oxide semiconductor field effect transistors (MOSFETs) in FIG. 8, it should be noted that embodiments of the present disclosure are not limited thereto. For example, the driving transistor DT and the first and second transistors ST1 and ST2 may be formed as P-type MOSFETs.

Figure 9:
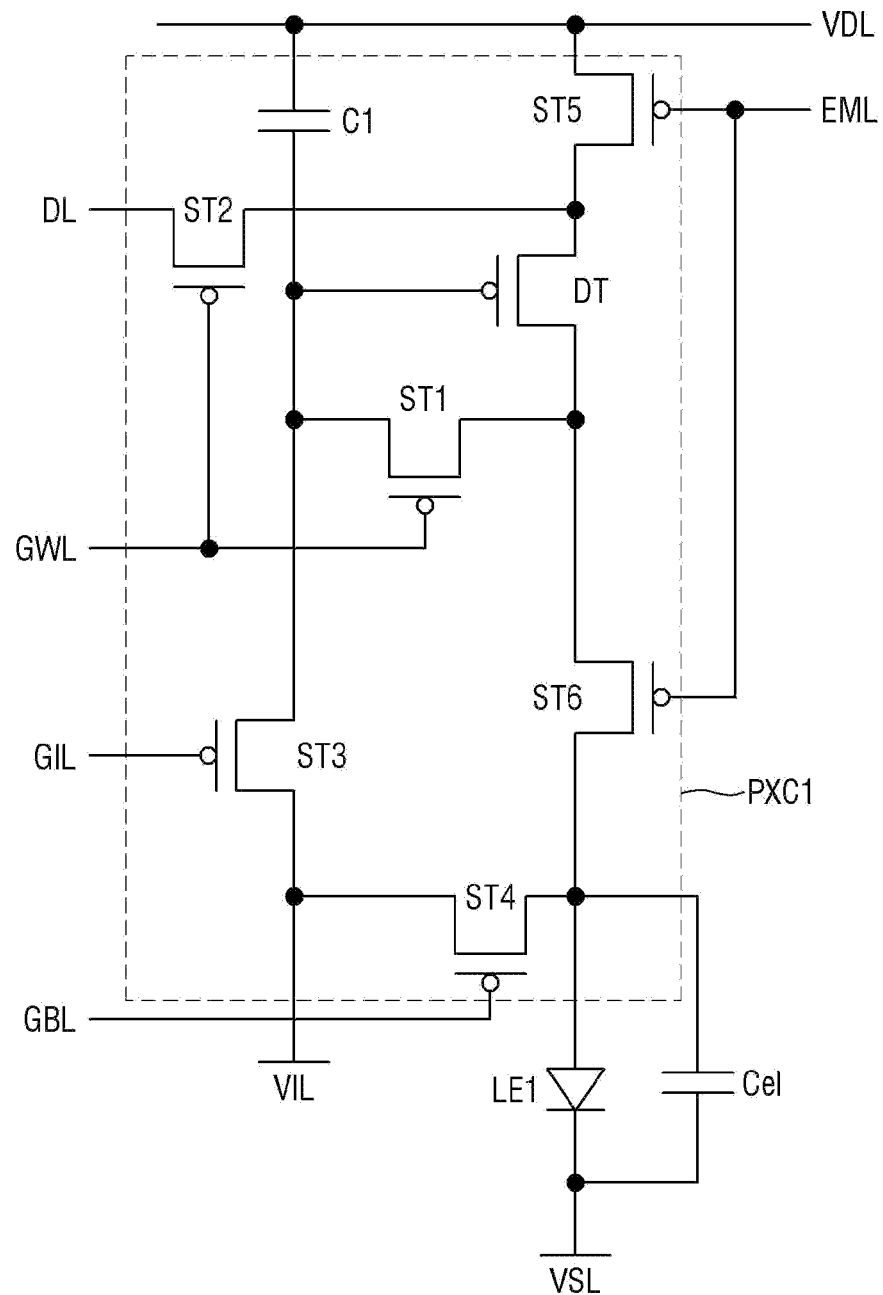
FIG. 9 is a circuit diagram of the first light emitting element and the pixel circuit unit shown in FIG. 5 according to another embodiment.

FIG. 9 is a circuit diagram of the first light emitting element LE1 and the pixel circuit unit PXC shown in FIG. 5 according to another embodiment.

Referring to FIG. 9, a pixel circuit unit PXC includes a driving transistor DT, switch elements, and a capacitor C1. The switch elements include first through sixth transistors ST1 through ST6.

The driving transistor DT includes a gate electrode, a first electrode, and a second electrode. The driving transistor DT controls a drain-source current (hereinafter, referred to as a "driving current") flowing between the first electrode and the second electrode according to a data voltage applied to the gate electrode.

The capacitor C1 is formed between the second electrode of the driving transistor DT and a second power line VSL. The capacitor Cst may have one electrode connected to the second electrode of the driving transistor DT and the other electrode connected to the second power line VSL.

When a first electrode of each of the first through sixth transistors ST1 through ST6 and of the driving transistor DT is a source electrode, a second electrode may be a drain electrode. Alternatively, when the first electrode of each of the first through sixth transistors ST1 through ST6 and of the driving transistor DT is a drain electrode, the second electrode may be a source electrode.

An active layer of each of the first through sixth transistors ST1 through ST6 and the driving transistor DT may be made of any one of polysilicon, amorphous silicon, and an oxide semiconductor. When a semiconductor layer of each of the first through sixth transistors ST1 through ST6 and the driving transistor DT is made of polysilicon, a process for forming the semiconductor layer may be a low-temperature polysilicon (LTPS) process.

In addition, although the first through sixth transistors ST1 through ST6 and the driving transistor DT are primarily described as P-type MOSFETs in FIG. 9, embodiments of the present disclosure are not limited thereto, and they may be formed as N-type MOSFETs.

Figure 10:
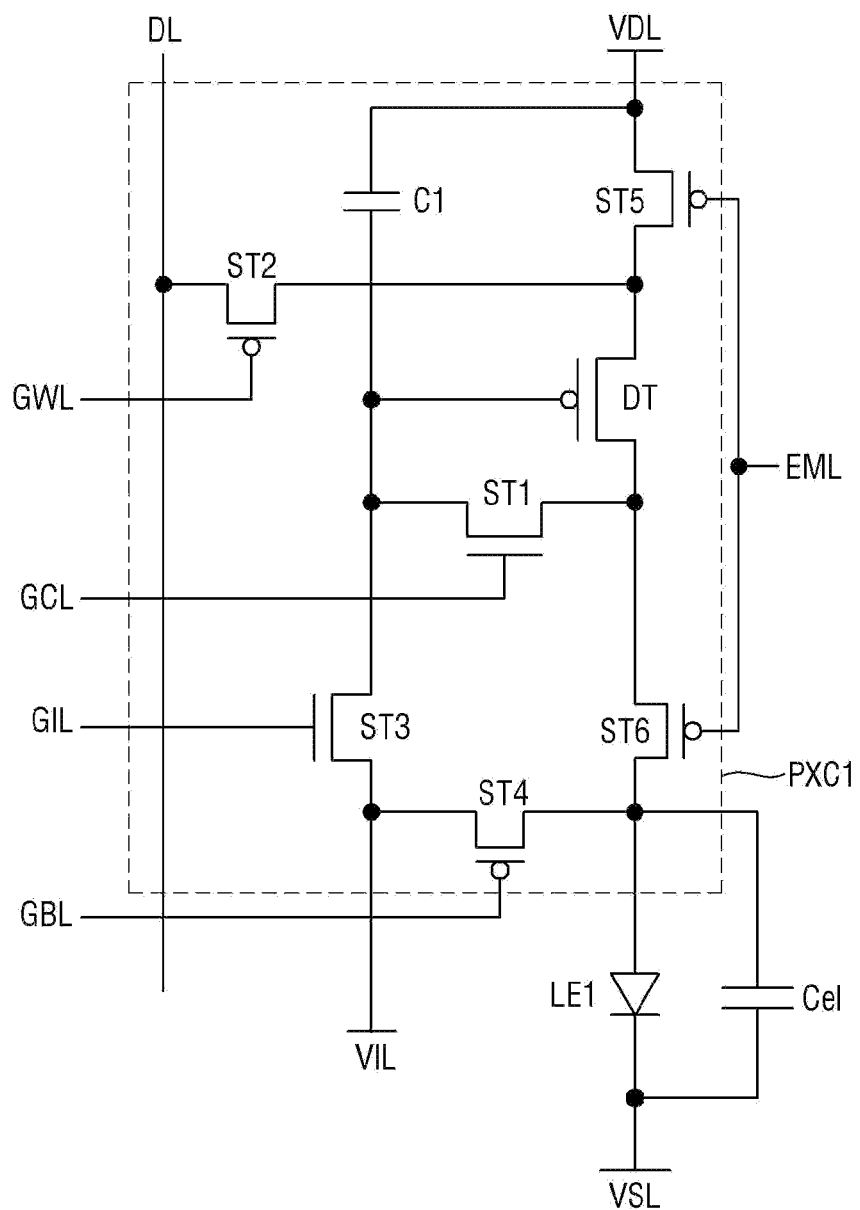
FIG. 10 is a circuit diagram of the first light emitting element and the pixel circuit unit shown in FIG. 5 according to another embodiment.

FIG. 10 is a circuit diagram of the first light emitting element LE1 and the pixel circuit unit PXC shown in FIG. 5 according to another embodiment.

Referring to FIG. 10, a driving transistor DT, a second transistor ST2, a fourth transistor ST4, a fifth transistor ST5, and a sixth transistor ST6 of a pixel circuit unit PXC may be formed as P-type MOSFETs, and a first transistor ST1 and a third transistor ST3 may be formed as N-type MOSFETs.

An active layer of each of the driving transistor DT, the second transistor ST2, the fourth transistor ST4, the fifth transistor ST5, and the sixth transistor ST6, formed as P-type MOSFETs, may be made of polysilicon, and an active layer of each of the first transistor ST1 and the third transistor ST3, formed as N-type MOSFETs, may be made of an oxide semiconductor.

The embodiment shown in FIG. 10 differs from the embodiment shown in FIG. 9 in that a gate electrode of the second transistor ST2 and a gate electrode of the fourth transistor ST4 are connected to a write scan line GWL and a gate electrode of the first transistor ST1 is connected to a control scan line GCL. In addition, because the first transistor ST1 and the third transistor ST3 are formed as N-type MOSFETs in this embodiment, a scan signal of a gate-high voltage may be transmitted to the control scan line GCL and an initialization scan line GIL. In contrast, because the second transistor ST2, the fourth transistor ST4, the fifth transistor ST5, and the sixth transistor ST6 are formed as P-type MOSFETs in this embodiment, a scan signal of a gate-low voltage may be transmitted to the write scan line GWL, a bias scan line GBL, and an emission line EML.

In other embodiments, the fourth transistor ST4 may be formed as an N-type MOSFET. In such an embodiment, a scan signal of a gate-high voltage may be transmitted to the bias scan line GBL.

It should be noted that a pixel circuit unit PXC according to embodiments of the present disclosure is not limited to those illustrated in FIGS. 8 through 10. The pixel circuit unit PXC according to embodiments of the present disclosure may be formed in other known circuit structures that can be employed by those skilled in the art, in addition to the embodiments illustrated in FIGS. 8 through 10.

Figure 11A:
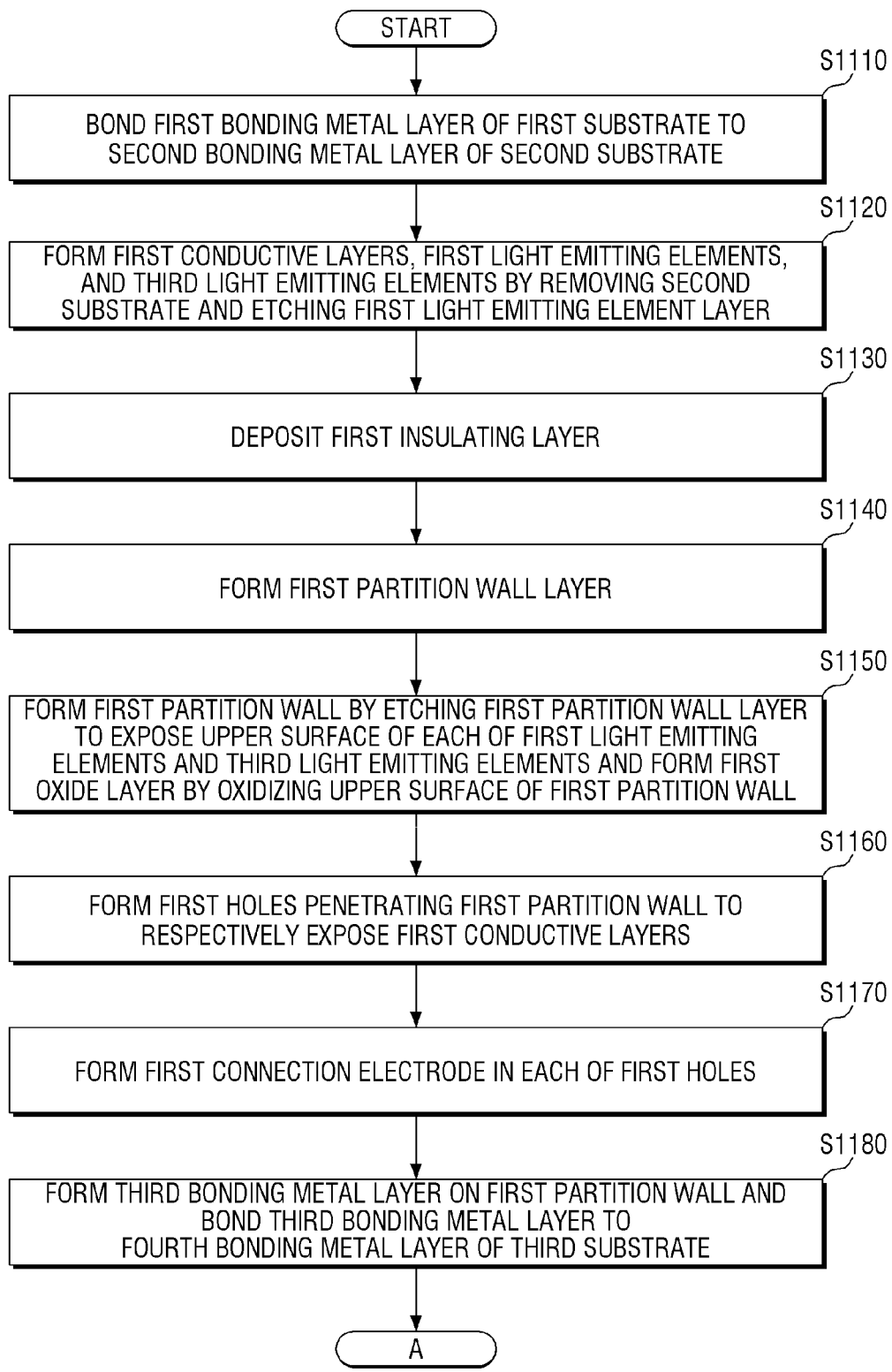
FIGS. 11A and 11B are flowcharts illustrating steps of a method of fabricating a display device according to an embodiment.
Figure 11B:
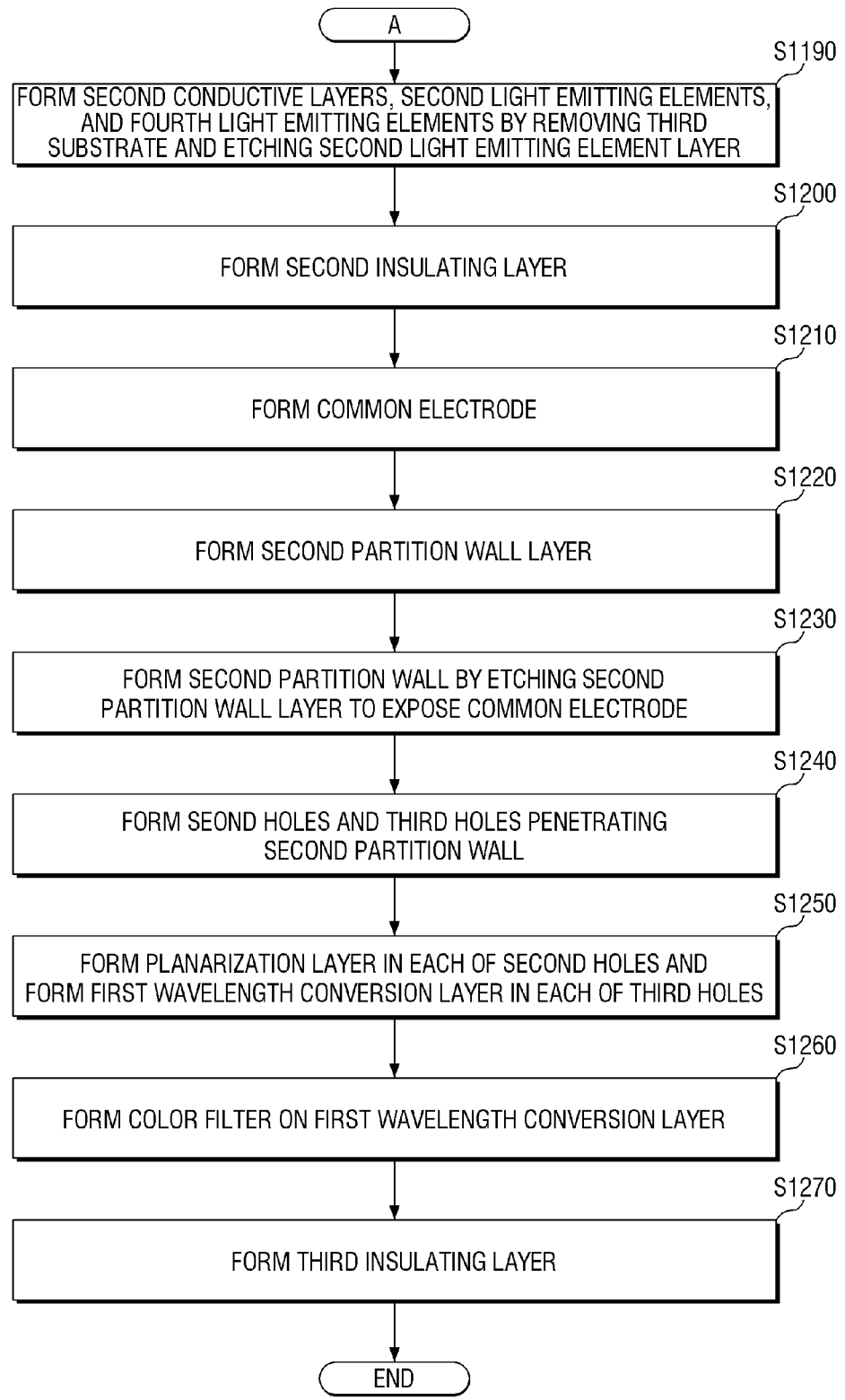

FIGS. 11A and 11B are flowcharts illustrating steps of a method of fabricating a display device according to an embodiment. FIGS. 12 through 28 are cross-sectional views for describing the method of fabricating the display device according to the embodiment shown in FIGS. 11A and 11B.

FIGS. 12 through 28 are cross-sectional views of a display panel 100 taken along the line A-A' of FIG. 3.

A method of fabricating a display panel according to an embodiment will now be described in detail with reference to FIGS. 11A, 11B, and 12 through 28.

Figure 12:
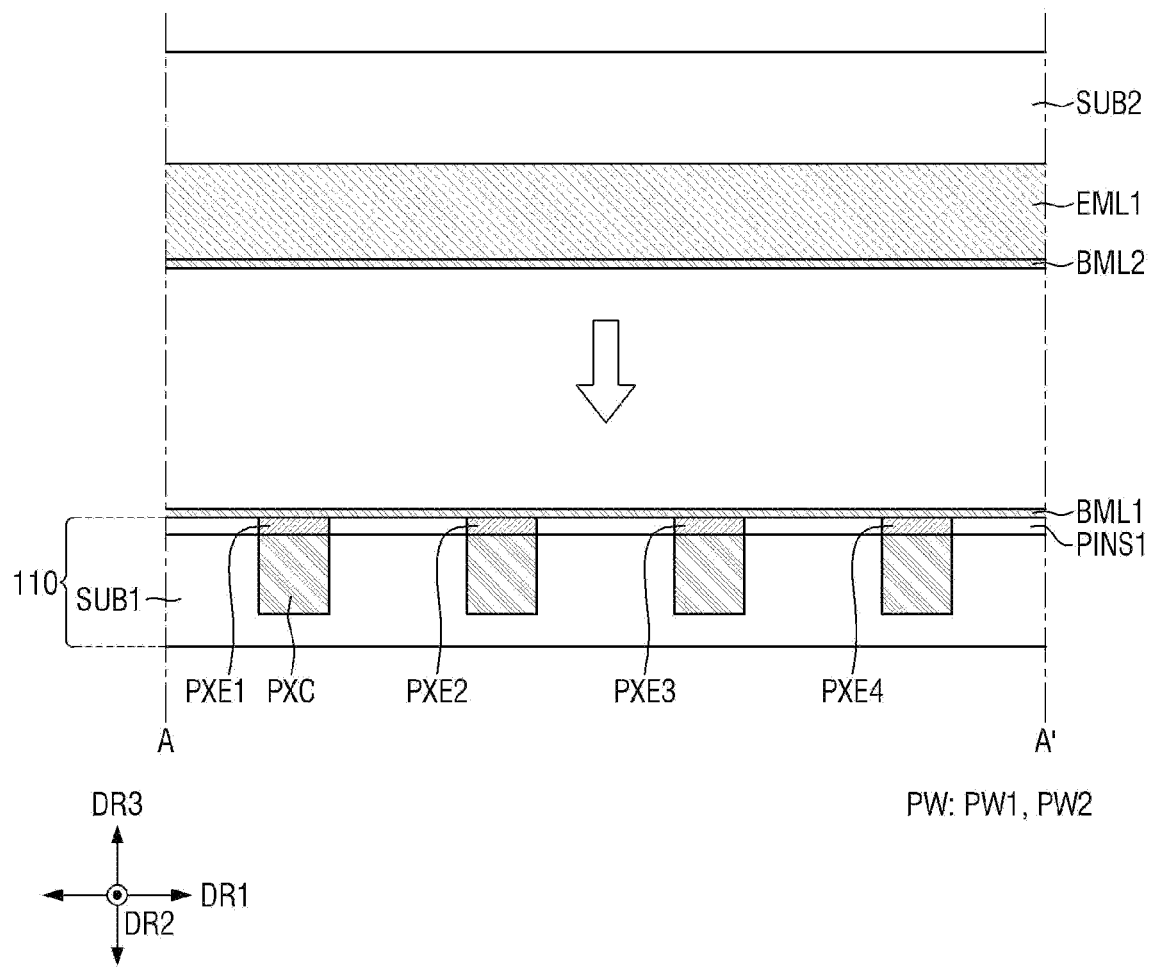
FIGS. 12 through 28 are cross-sectional views showing steps of the method of fabricating the display device according to an embodiment.

First, referring to FIG. 12, a first bonding metal layer BML1 of a first substrate SUB1 and a bonding metal layer BML2 of a second substrate SUB2 are bonded together (operation S1110 in FIG. 11A).

A planarization insulating layer PINS1 is formed on the first substrate SUB1 to eliminate a height difference between an upper surface of the first substrate SUB1 and an upper surface of each of pixel electrodes PXE1 through PXE4. Thus, the upper surface of the first substrate SUB1 and the upper surface of each of the pixel electrodes PXE1 through PXE4 may be connected to form a flat surface. The planarization insulating layer PINS1 may be formed of an inorganic layer, such as a silicon oxide (e.g., $SiO_2$) layer, an aluminum oxide (e.g., $Al_2O_3$) layer, or a hafnium oxide ($HfO_x$) layer.

Next, the first bonding metal layer BML1 is deposited on the planarization insulating layer PINS1 and the pixel electrodes PXE1 through PXE4. The first bonding metal layer BML1 may include gold (Au), copper (Cu), aluminum (Al), or tin (Sn).

Next, the second bonding metal layer BML2 is formed on a first light emitting element layer EML1 of the second substrate SUB2. The second substrate SUB2 may be a silicon substrate or a sapphire substrate. The first light emitting element layer EML1 may include a first semiconductor layer SEM1, an electron blocking layer EBL, a first active layer MQW1, a superlattice layer SLT, and a second semiconductor layer SEM2. Additionally, in the first light emitting element layer EML1, a semiconductor layer not doped with a dopant, that is, an undoped semiconductor layer, may be disposed on the second substrate SUB2 and the second semiconductor layer SEM2. The second bonding metal layer BML2 may include gold (Au), copper (Cu), aluminum (Al), or tin (Sn).

Next, the first bonding metal layer BML1 of the first substrate SUB1 and the second bonding metal layer BML2 of the second substrate SUB2 are brought into contact with each other. Then, one bonding metal layer is formed by melt-bonding the first bonding metal layer BML1 and the second bonding metal layer BML2 at a reference temperature (e.g., a predetermined temperature).

Figure 13:
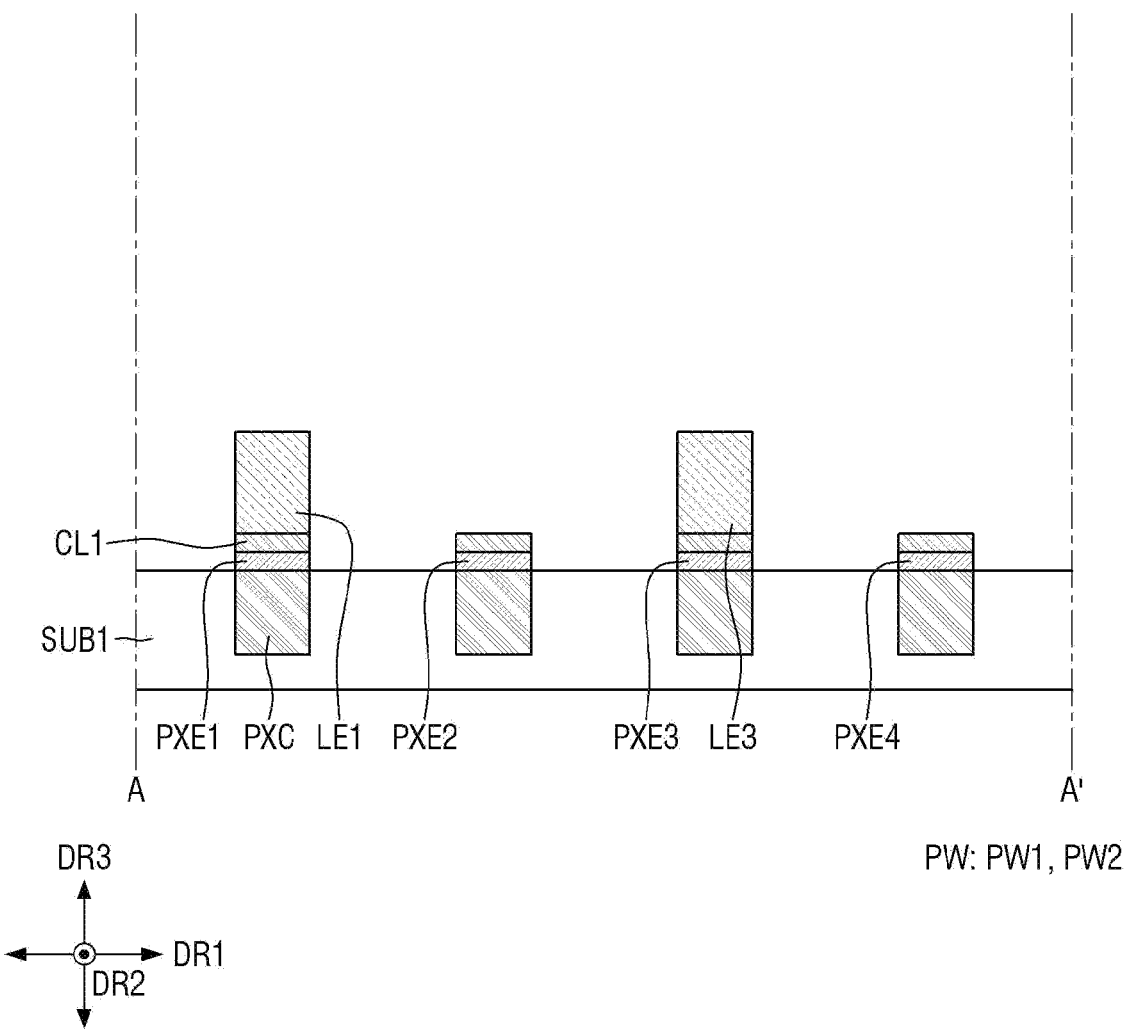

Second, referring to FIG. 13, the second substrate SUB2 is removed, and the first light emitting element layer EML1 is etched to form first conductive layers CL1, first light emitting elements EL1, and third light emitting elements EL3 (operation S1120 in FIG. 11A).

The second substrate SUB2 may be removed by a polishing process, such as a chemical mechanical polishing (CMP) process or a laser lift off process. When the first light emitting element layer EML1 includes an undoped semiconductor layer, the undoped semiconductor layer may be removed by a polishing process, such as a CMP process.

Next, a first mask pattern may be formed on the first light emitting element layer EML1, and the first light emitting element layer EML1 may be etched according to the first mask pattern to form the first conductive layers CL1, the first light emitting elements LE1, and the third light emitting elements LE3. In such an embodiment, the planarization insulating layer PINS1 may be etched together with the first light emitting element layer EML1.

Figure 14:
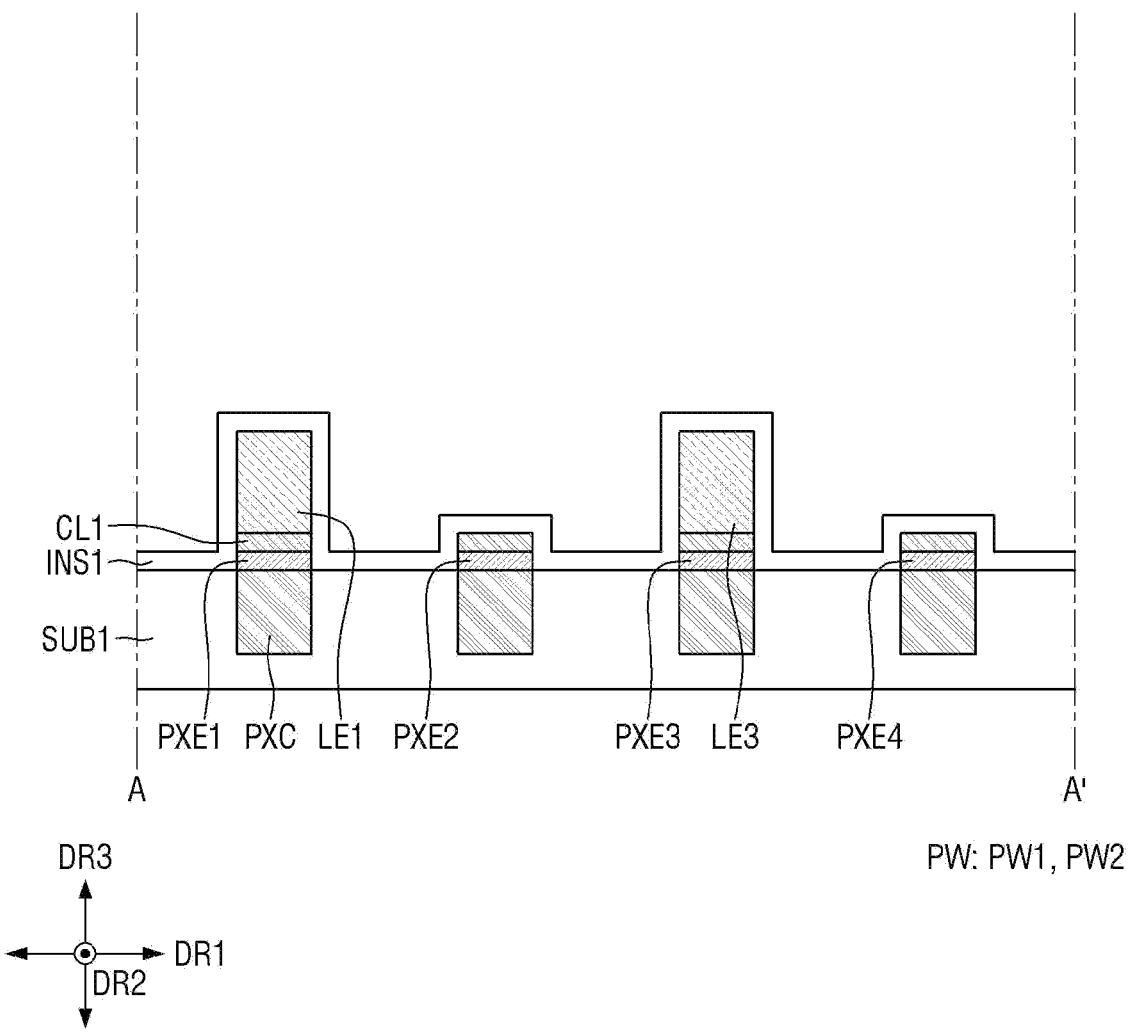

Third, referring to FIG. 14, a first insulating layer INS1 is deposited (operation S1130 in FIG. 11A).

The first insulating layer INS1 may be formed by using a deposition method, such as chemical vapor deposition. The first insulating layer INS1 may be formed to cover the first light emitting elements LE1 and the third light emitting elements LE3. The first insulating layer INS1 may be disposed on side surfaces of each of the first conductive layers CL1 disposed under the first light emitting elements LE1 and the third light emitting elements LE3. The first insulating layer INS1 may cover the first conductive layers CL1 that are not covered by the first light emitting elements LE1 and the third light emitting elements LE3. For example, the first insulating layer INS1 may cover the first conductive layers CL1 disposed on second pixel electrodes PXE2 and fourth pixel electrodes PXE4. The first insulating layer INS1 may be disposed on side surfaces of each of the pixel electrodes PXE1 through PXE4. The first insulating layer INS1 may cover the upper surface of the first substrate SUB1 disposed between the pixel electrodes PXE1 through PXE4.

Figure 15:
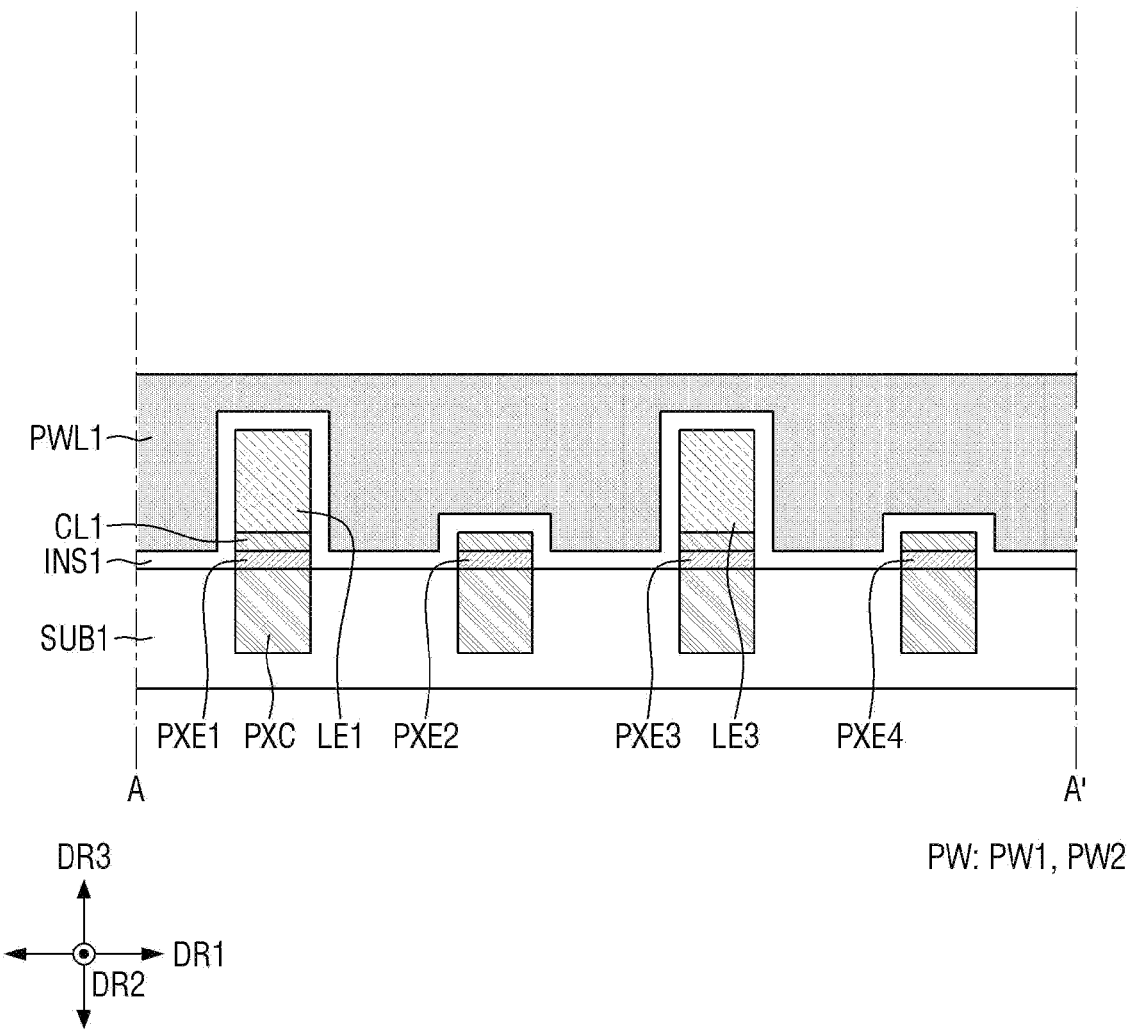

Fourth, referring to FIG. 15, a first partition wall layer PWL1 is formed (operation S1140 in FIG. 11A).

The first partition wall layer PWL1 may be formed by electroplating (or electrolytic plating) or electroless plating. A thickness of the first partition wall layer PWL1 may be greater than a thickness of each of the first light emitting elements LE1 and the third light emitting elements LE3. For example, the first insulating layer INS1 disposed on an upper surface of each of the first light emitting elements LE1 and the third light emitting elements LE3 may be covered by the first partition wall layer PWL1.

The first partition wall layer PWL1 may be made of aluminum (Al). However, embodiments of the present disclosure are not limited thereto, and the first partition wall layer PWL1 may be made of a material having conductivity, for example, an opaque metal material, such as molybdenum (Mo), chromium (Cr), gold (Au), titanium (Ti), nickel (Ni), neodymium (Nd), or copper (Cu).

Figure 16:
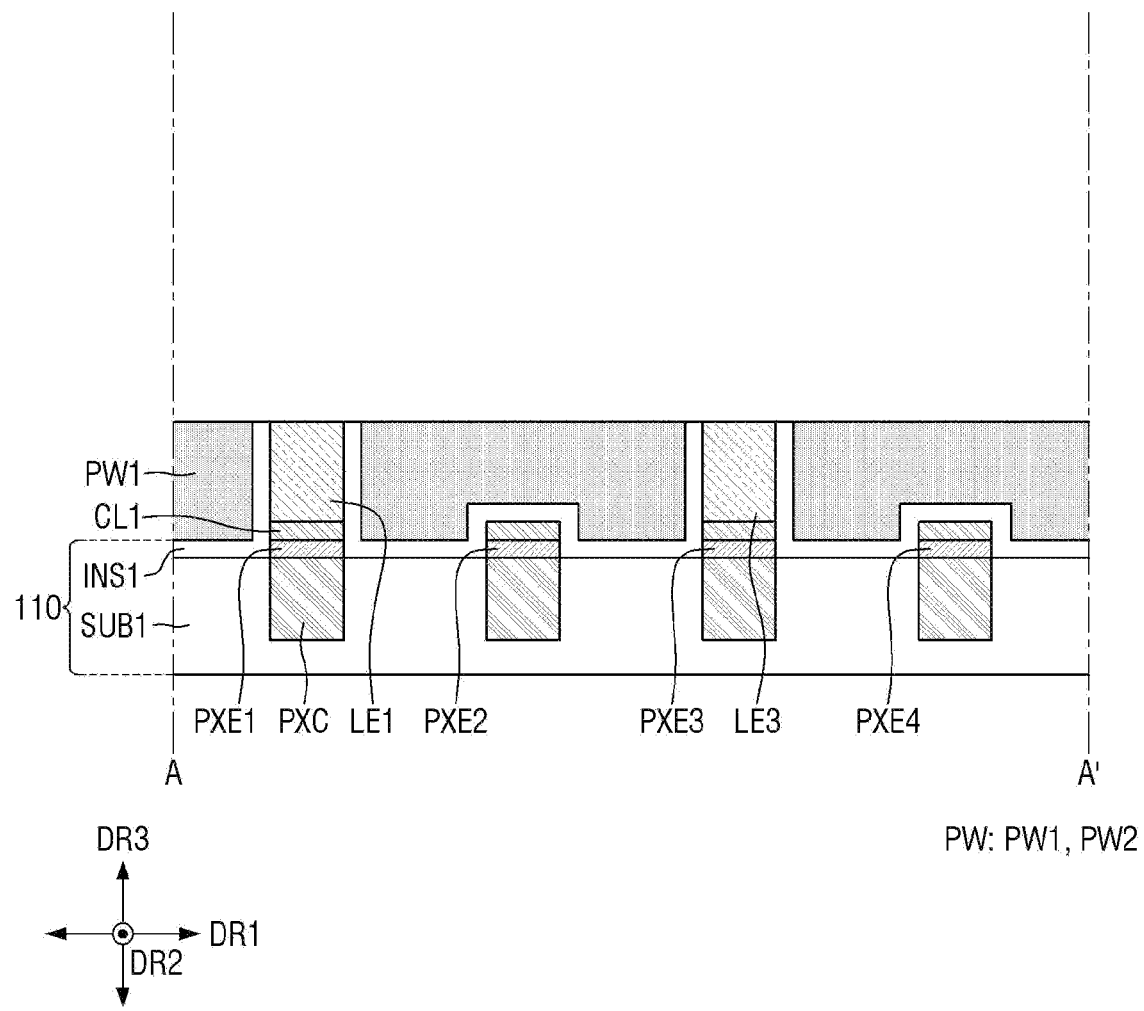

Fifth, referring to FIG. 16, a first partition wall PW1 is formed by etching the first partition wall layer PWL1 to expose the upper surface of each of the first light emitting elements LE1 and the third light emitting elements LE3, and a first oxide layer PWO1 (see, e.g., FIG. 6) is formed by oxidizing an upper surface of the first partition wall PW1 (operation S1150 in FIG. 11A).

The first partition wall PW1 may be formed by removing the first partition wall layer PWL1 by using a polishing process, such as a CMP process. Accordingly, the upper surface of each of the first light emitting elements LE1 and the third light emitting elements LE3 may be exposed (e.g., may not be covered by the first partition wall PW1). In addition, an upper surface of the first insulating layer INS1 disposed on side surfaces of each of the first light emitting elements LE1 and the third light emitting elements LE3 may be exposed without being covered by the first partition wall PW1. The upper surface of each of the first and third light emitting elements LE1 and LE3, the upper surface of the first insulating layer INS1, and the upper surface of the first partition wall PW1 may be connected to form a flat surface.

Figure 17:
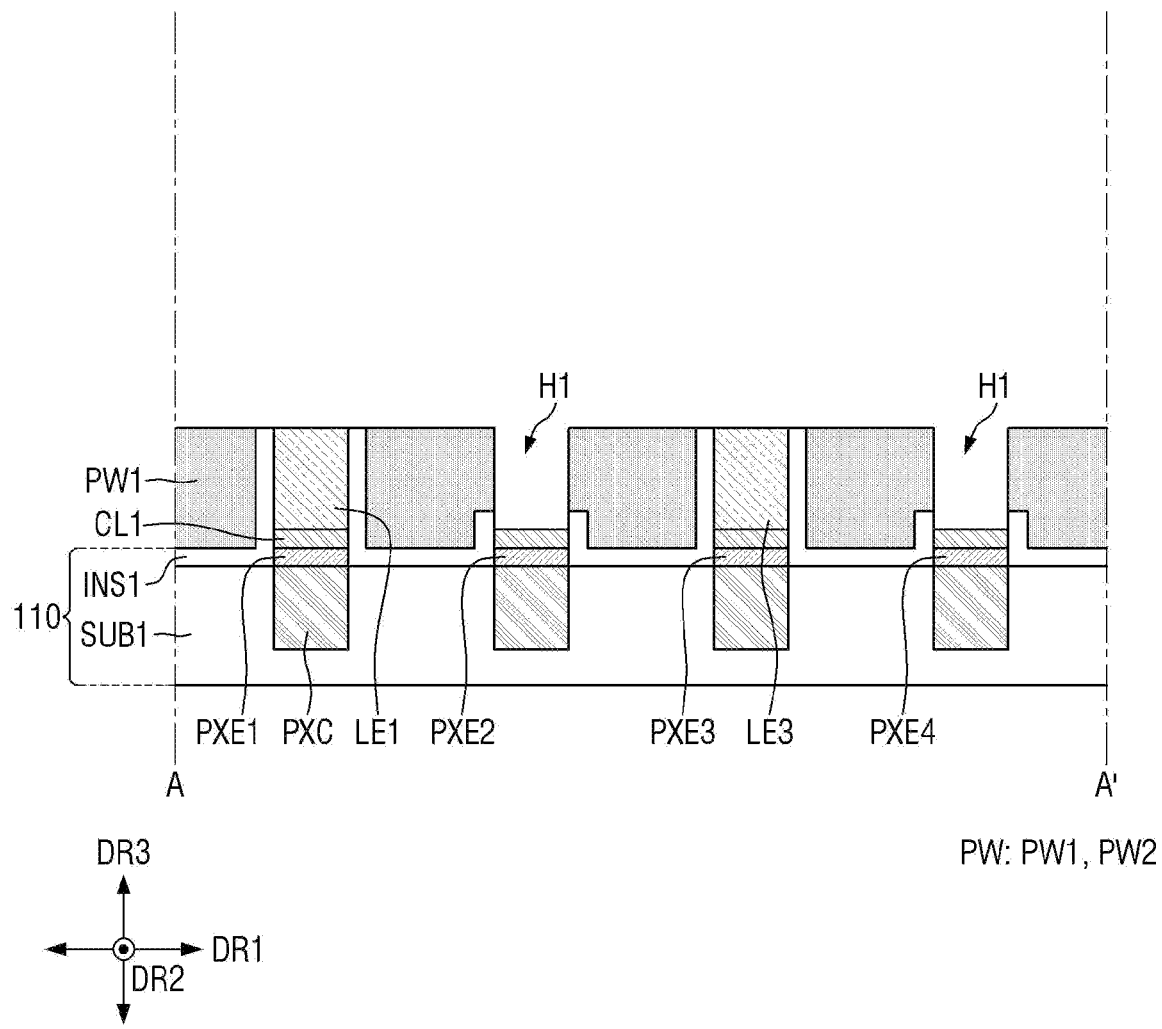

Sixth, referring to FIG. 17, first holes (e.g., first openings) H1 are formed to penetrate the first partition wall PW1 to expose the first conductive layers CL1, respectively (operation S1160 in FIG. 11A).

A second mask pattern may be formed on the first partition wall PW1, and the first holes H1 may be formed by etching the first partition wall PW1 and the first insulating layer INS1 according to the second mask pattern. The first holes H1 may be formed to expose the first conductive layers CL1 that are not covered by the first light emitting elements LE1 and the third light emitting elements LE3. For example, the first holes H1 may be formed to expose the first conductive layers CL1 disposed on the second pixel electrodes PXE2 and the fourth pixel electrodes PXE4, respectively.

Figure 18:
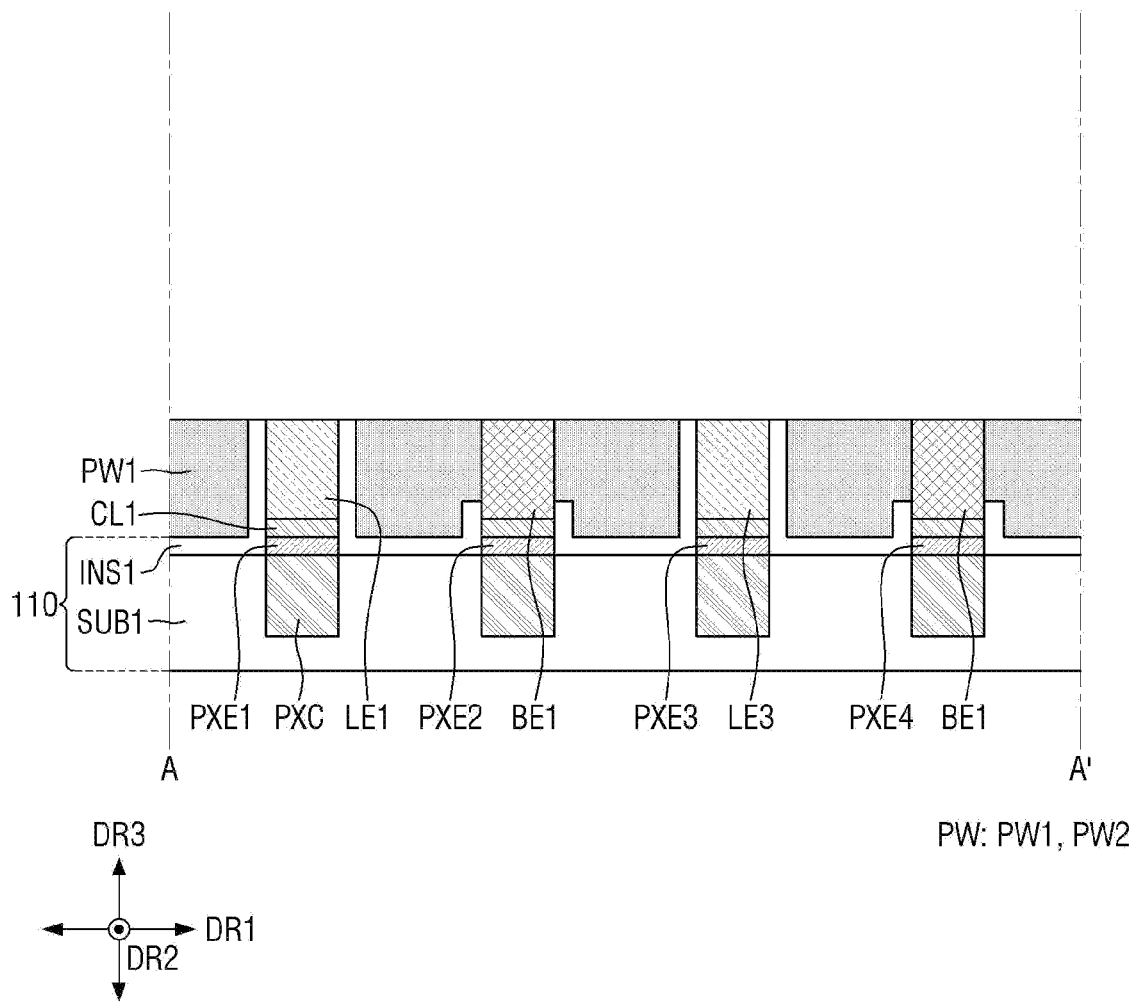

Seventh, referring to FIG. 18, a first connection electrode BE1 is formed in each of the first holes H1 (operation S1170 in FIG. 11A).

Because the first connection electrode BE1 fills each of the first holes H1, the upper surface of the first partition wall PW1, the upper surface of the first insulating layer INS1, the upper surfaces of the first light emitting elements LE1, the upper surfaces of the light emitting elements LE3, and upper surfaces of the first connection electrodes BE1 may be connected to form a flat surface.

Figure 19:
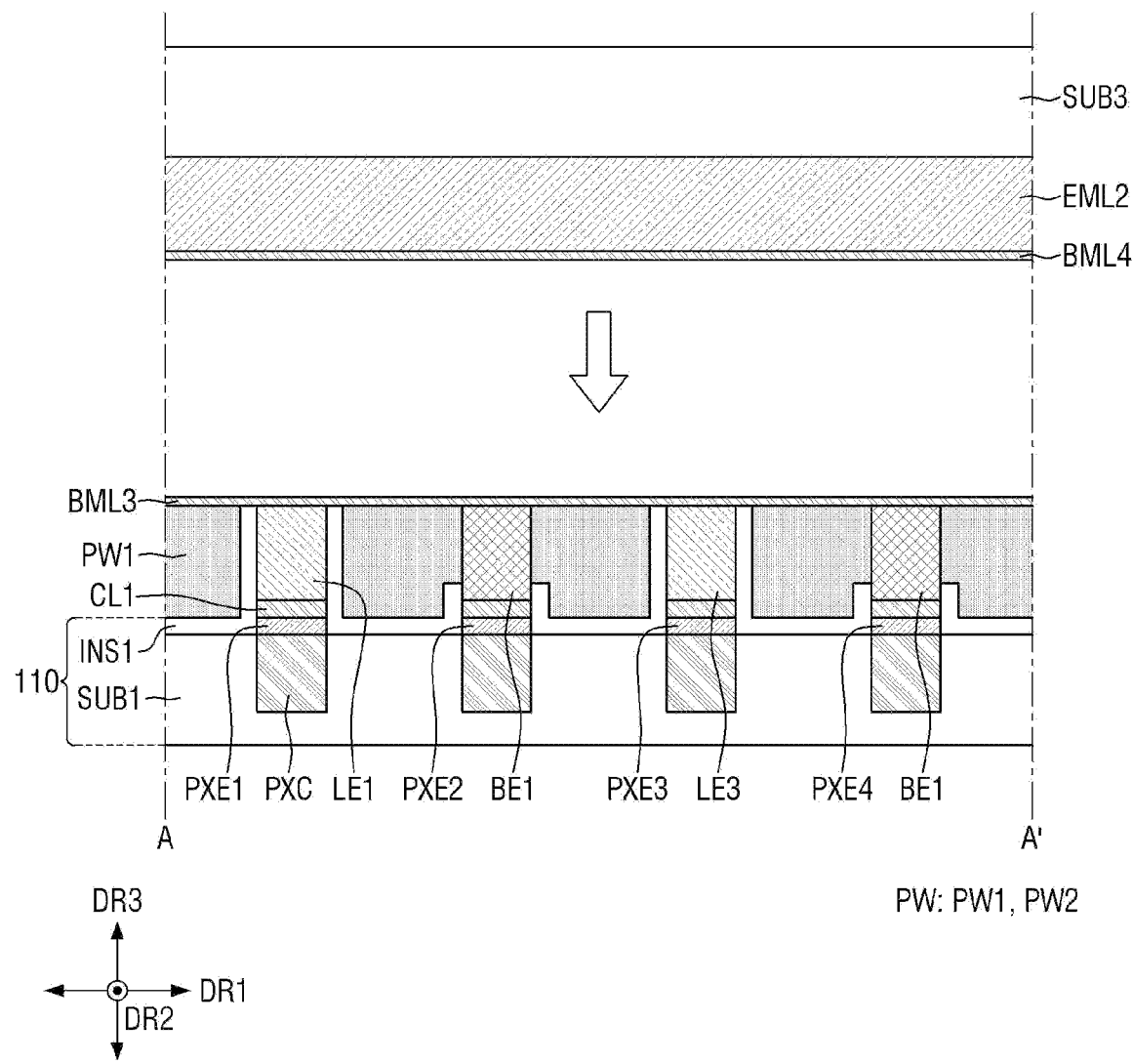

Eighth, referring to FIG. 19, a third bonding metal layer BML3 is formed on the first partition wall PW1, and the third bonding metal layer BML3 and a fourth bonding metal layer BML4 of a third substrate SUB3 are bonded together (operation S1180 in FIG. 11A).

The third bonding metal layer BML3 may be deposited on the upper surfaces of the first light emitting elements LE1, the third light emitting elements LE3, the first insulating layer INS1, the first connection electrodes BE1, and the first partition wall PW1. The third bonding metal layer BML3 may include gold (Au), copper (Cu), aluminum (Al), or tin (Sn).

Next, the fourth bonding metal layer BML4 is formed on a second light emitting element layer EML2 of the third substrate SUB3. The third substrate SUB3 may be a silicon substrate or a sapphire substrate. The second light emitting element layer EML2 may include a first semiconductor layer SEM1, an electron blocking layer EBL, a second active layer MQW2, a superlattice layer SLT, and a second semiconductor layer SEM2. Additionally, in the second light emitting element layer EML2, a semiconductor layer not doped with a dopant, that is, an undoped semiconductor layer, may be disposed on the third substrate SUB3 and the second semiconductor layer SEM2. The fourth bonding metal layer BML4 may include gold (Au), copper (Cu), aluminum (Al), or tin (Sn).

Next, the third bonding metal layer BML3 and the fourth bonding metal layer BML4 of the third substrate SUB3 are brought into contact with each other. Then, one bonding metal layer is formed by melt-bonding the third bonding metal layer BML3 and the fourth bonding metal layer BML4 at a reference temperature (e.g., a predetermined temperature).

Figure 20:
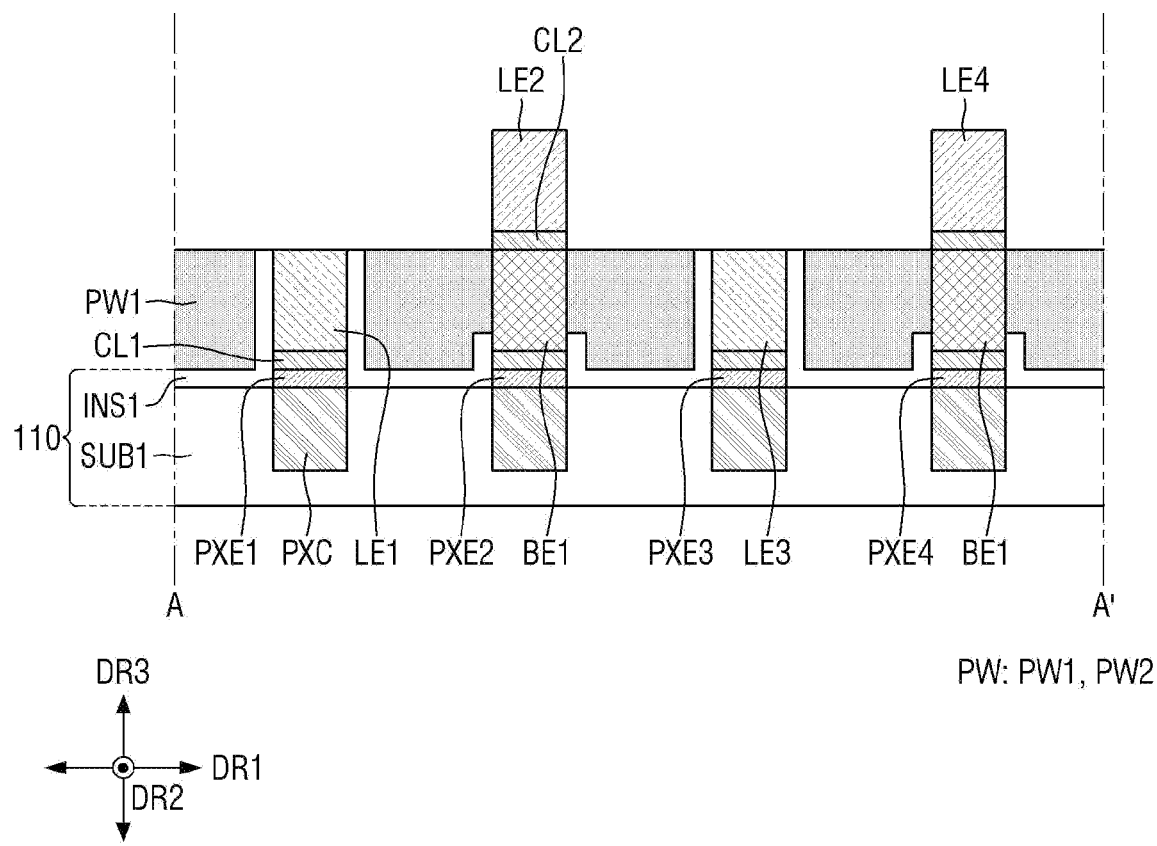

Ninth, referring to FIG. 20, the third substrate SUB3 is removed, and the second light emitting element layer EML2 is etched to form second conductive layers CL2, second light emitting elements LE2, and fourth light emitting elements LE4 (operation S1190 in FIG. 11B).

The third substrate SUB3 may be removed by a polishing process, such as a CMP process or a laser lift off process. When the second light emitting element layer EML2 includes an undoped semiconductor layer, the undoped semiconductor layer may be removed by a polishing process, such as a CMP process.

Next, a third mask pattern may be formed on the second light emitting element layer EML2, and the second light emitting element layer EML2 may be etched according to the third mask pattern to form the second conductive layers CL2, the second light emitting elements LE2, and the fourth light emitting elements LE4.

Figure 21:
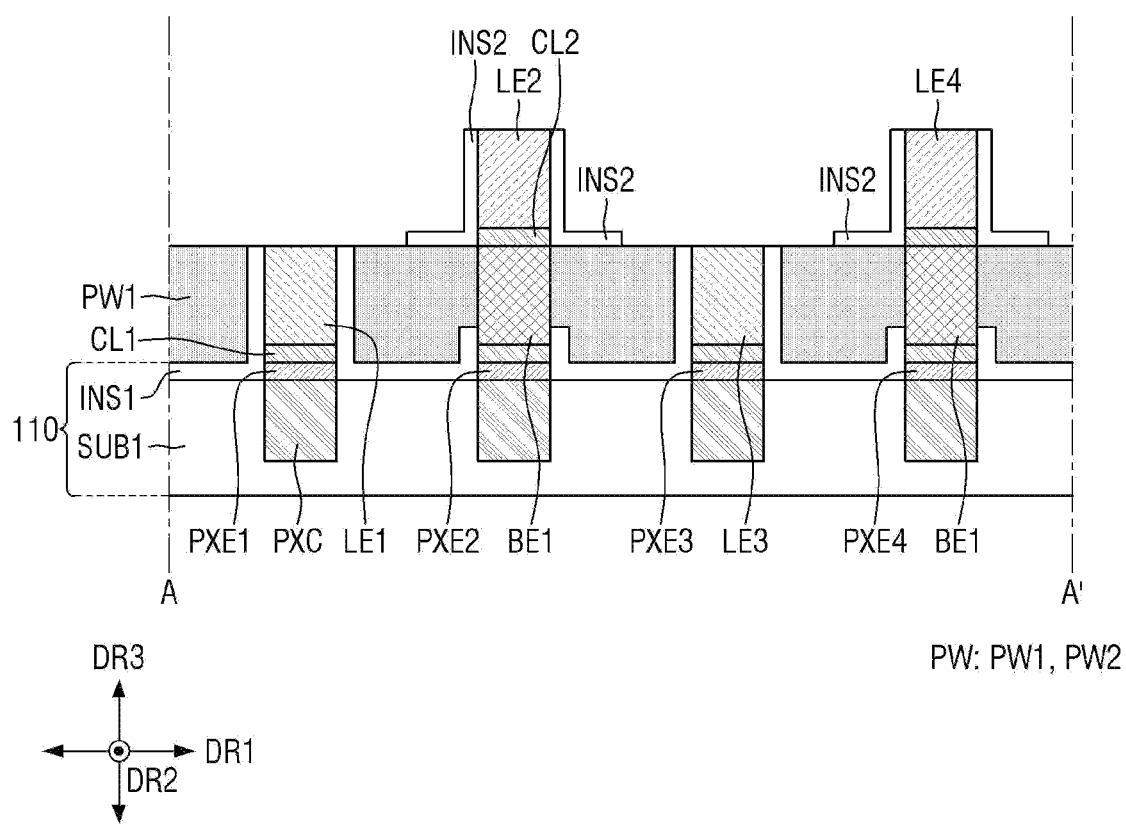

Tenth, referring to FIG. 21, a second insulating layer INS2 is formed (operation S1200 in FIG. 11B).

The second insulating layer INS2 may be deposited using a deposition method, such as chemical vapor deposition, to cover the light emitting elements LE1 through LE4, the first partition wall PW1, and the first insulating layer INS1.

Next, a fourth mask pattern may be formed on the second insulating layer INS2, and the second insulating layer INS2 may be etched according to the fourth mask pattern to form the second insulating layer INS2 covering side surfaces of each of the second light emitting elements LE2 and the fourth light emitting element LE4, side surfaces of the second conductive layers CL2, and a portion of the first partition wall PW1. The upper surface of each of the light emitting elements LE1 through LE4 may be exposed without being covered by the second insulating layer INS2.

Figure 22:
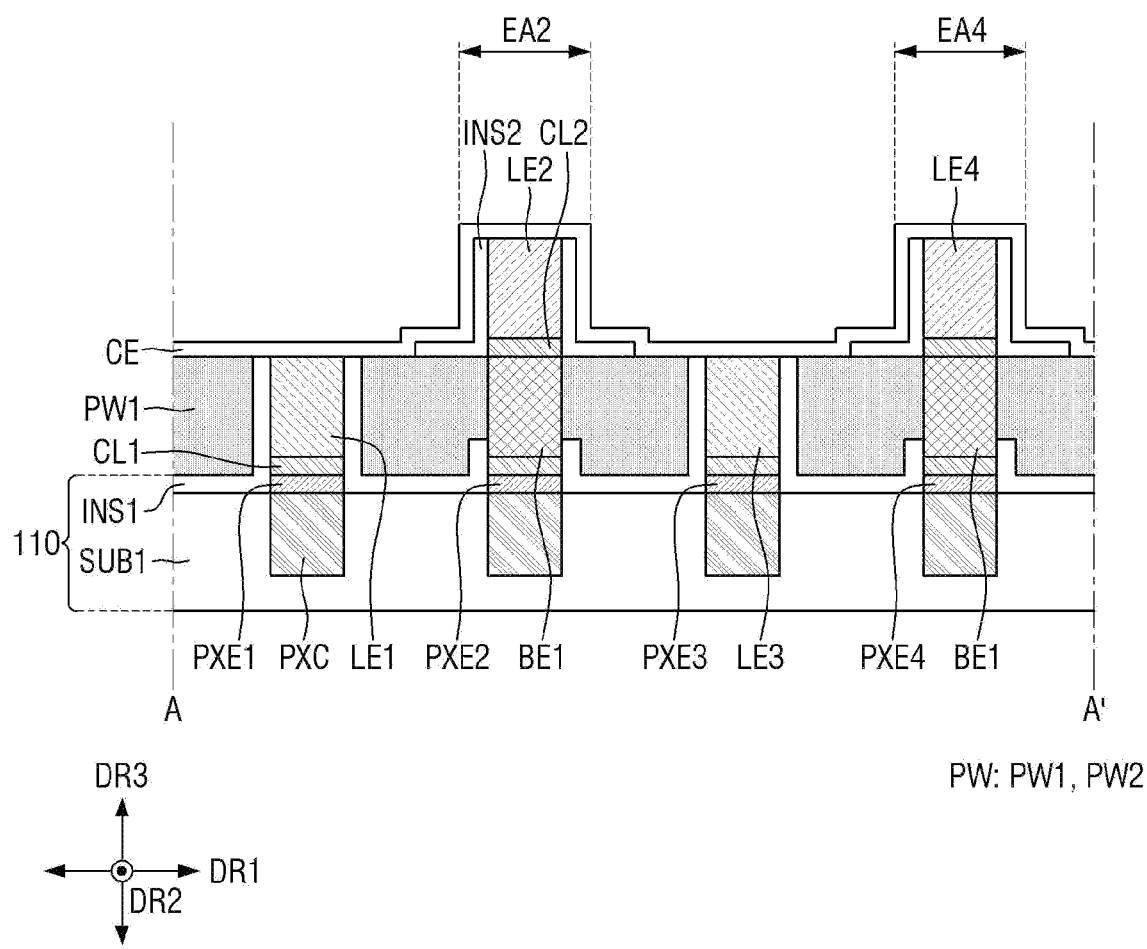

Eleventh, referring to FIG. 22, a common electrode CE is formed (operation S1210 in FIG. 11B).

The common electrode CE may be formed on the upper surface of each of the light emitting elements LE1 through LE4, an upper surface of the second insulating layer INS2, and the upper surface of the first partition wall PW1 by using a deposition method, such as a sputtering method or an atomic layer deposition method. The common electrode CE may be disposed on the side surfaces of each of the second light emitting elements LE2 and the fourth light emitting elements LE4. The common electrode CE may include a transparent conductive material. For example, the common electrode CE may include a transparent conductive oxide (TCO), such as indium tin oxide (ITO) or indium zinc oxide (IZO).

Figure 23:
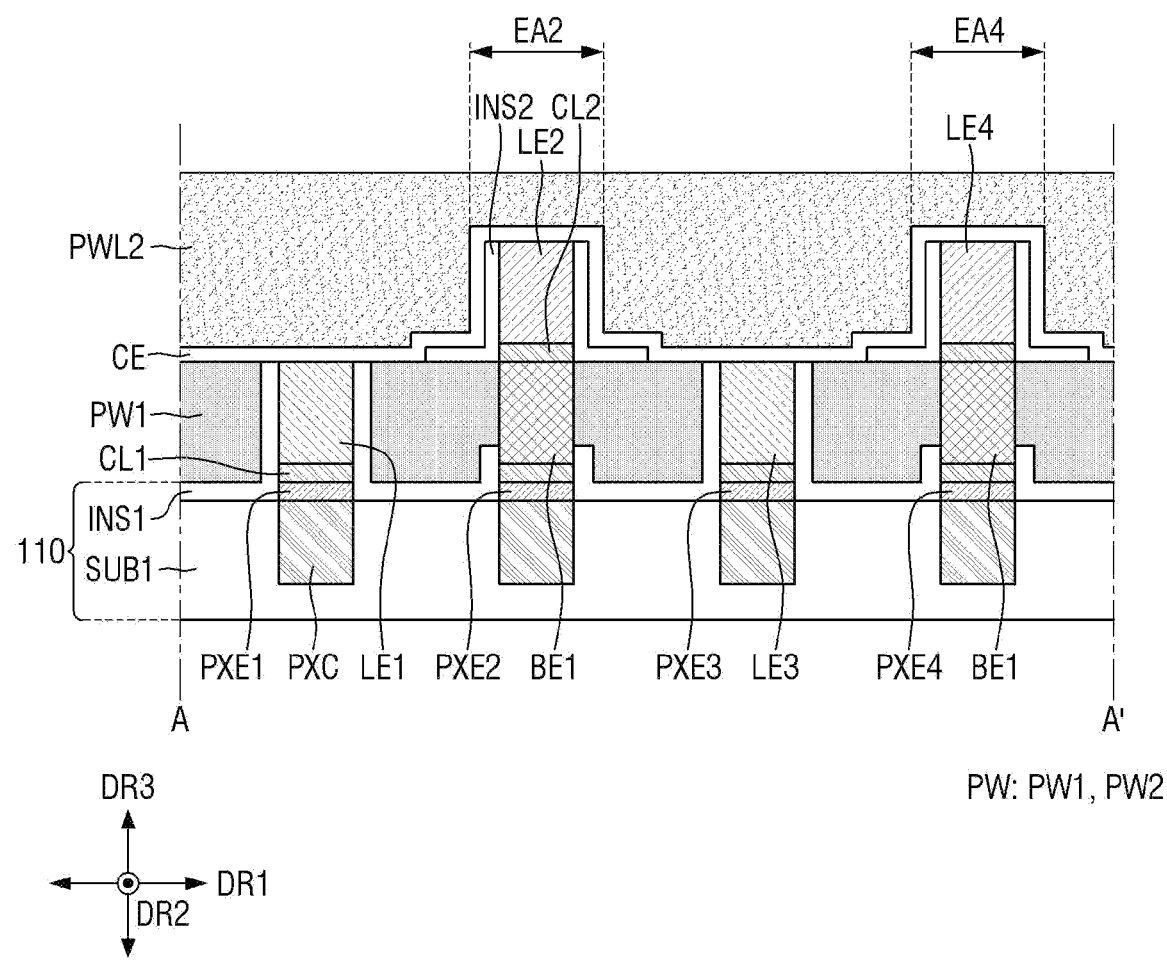

Twelfth, referring to FIG. 23, a second partition wall layer PWL2 is formed (operation S1220 in FIG. 11B).

The second partition wall layer PWL2 may be formed by electroplating (or electrolytic plating) or electroless plating. A thickness of the second partition wall layer PWL2 may be greater than a thickness of each of the second light emitting elements LE2 and the fourth light emitting elements LE4. For example, the common electrode CE disposed on the upper surface of each of the second light emitting elements LE2 and the fourth light emitting elements LE4 may be covered by the second partition wall layer PWL2.

The second partition wall layer PWL2 may be made of aluminum (Al). However, embodiments of the present disclosure are not limited thereto, and the second partition wall layer PWL2 may be made of a material having conductivity, for example, an opaque metal material, such as molybdenum (Mo), chromium (Cr), gold (Au), titanium (Ti), nickel (Ni), neodymium (Nd), or copper (Cu).

Figure 24:
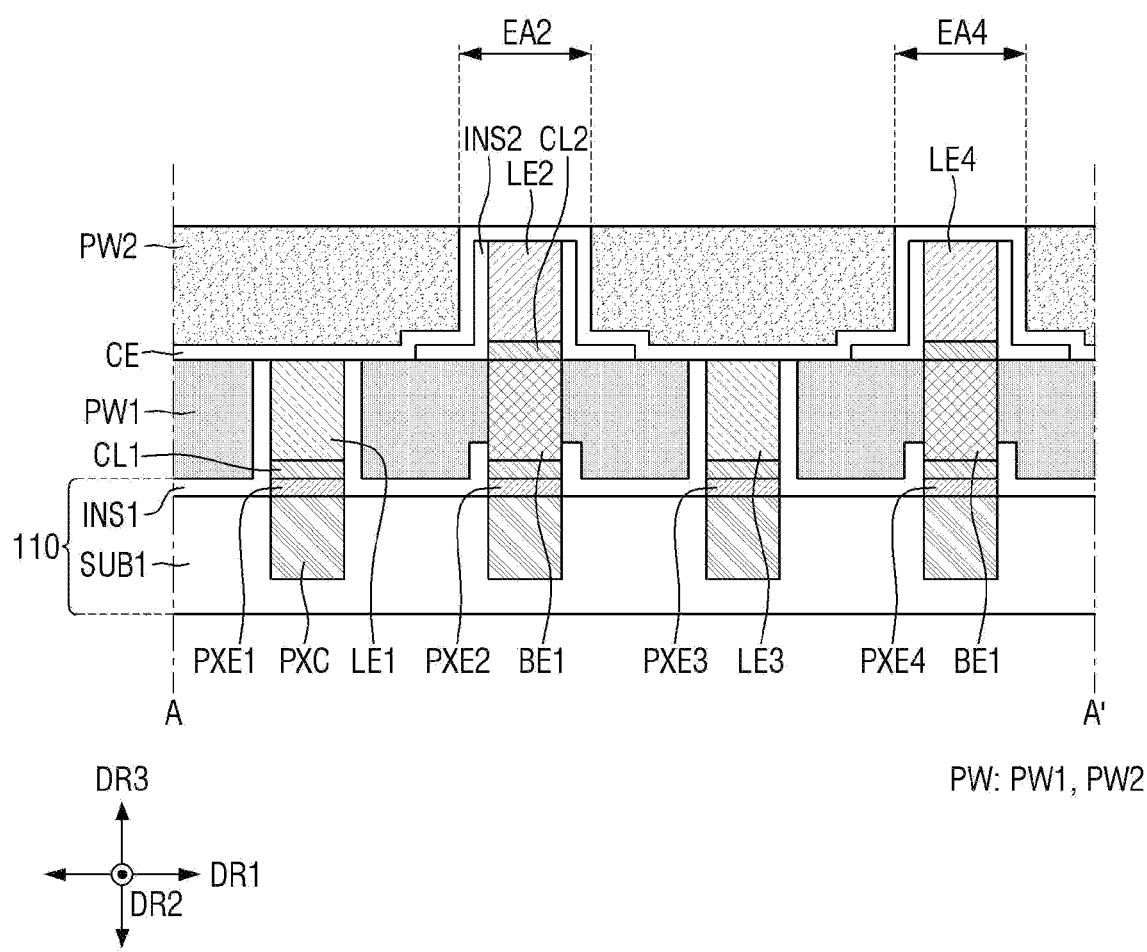

Thirteenth, referring to FIG. 24, the second partition wall layer PWL2 is etched to expose the common electrode CE disposed on the upper surface of each of the second light emitting elements LE2 and the fourth light emitting elements LE4, thereby forming a second partition wall PW2 (operation S1230 in FIG. 11B).

The second partition wall PW2 may be formed by removing the second partition wall layer PWL2 by using a polishing process, such as a CMP process. Accordingly, the common electrode CE disposed on the upper surface of each of the second light emitting elements LE2 and the fourth light emitting elements LE4 may be exposed without being covered by the second partition wall PW2. An upper surface of the common electrode CE disposed on the upper surface of each of the second and fourth light emitting elements LE2 and LE4 and an upper surface of the second partition wall PW2 may be connected to form a flat surface.

Figure 25:
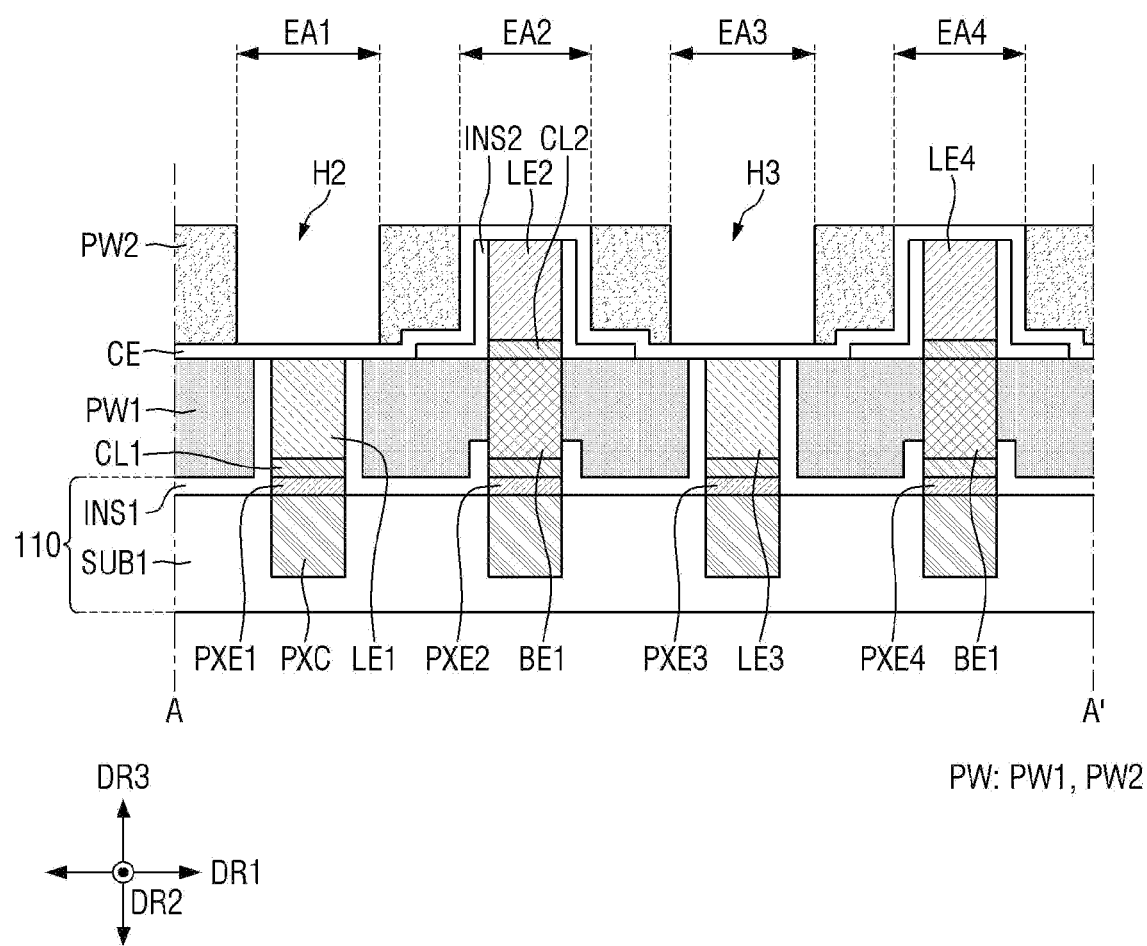

Fourteenth, referring to FIG. 25, second holes (e.g., second openings) H2 may be formed to penetrate the second partition wall PW2 to overlap the first light emitting elements LE1, and third holes (e.g., third openings) H3 may be formed to penetrate the second partition wall PW2 to overlap the third light emitting elements LE3 (operation S1240 in FIG. 11B).

A fifth mask pattern may be formed on the second partition wall PW2, and the second holes H2 and the third holes H3 may be formed by etching the second partition wall PW2 according to the fifth mask pattern. The second holes H2 may be formed to expose the common electrode CE disposed on the first light emitting elements LE1, and the third holes H3 may be formed to expose the common electrode disposed on the third light emitting elements LE3.

Figure 26:
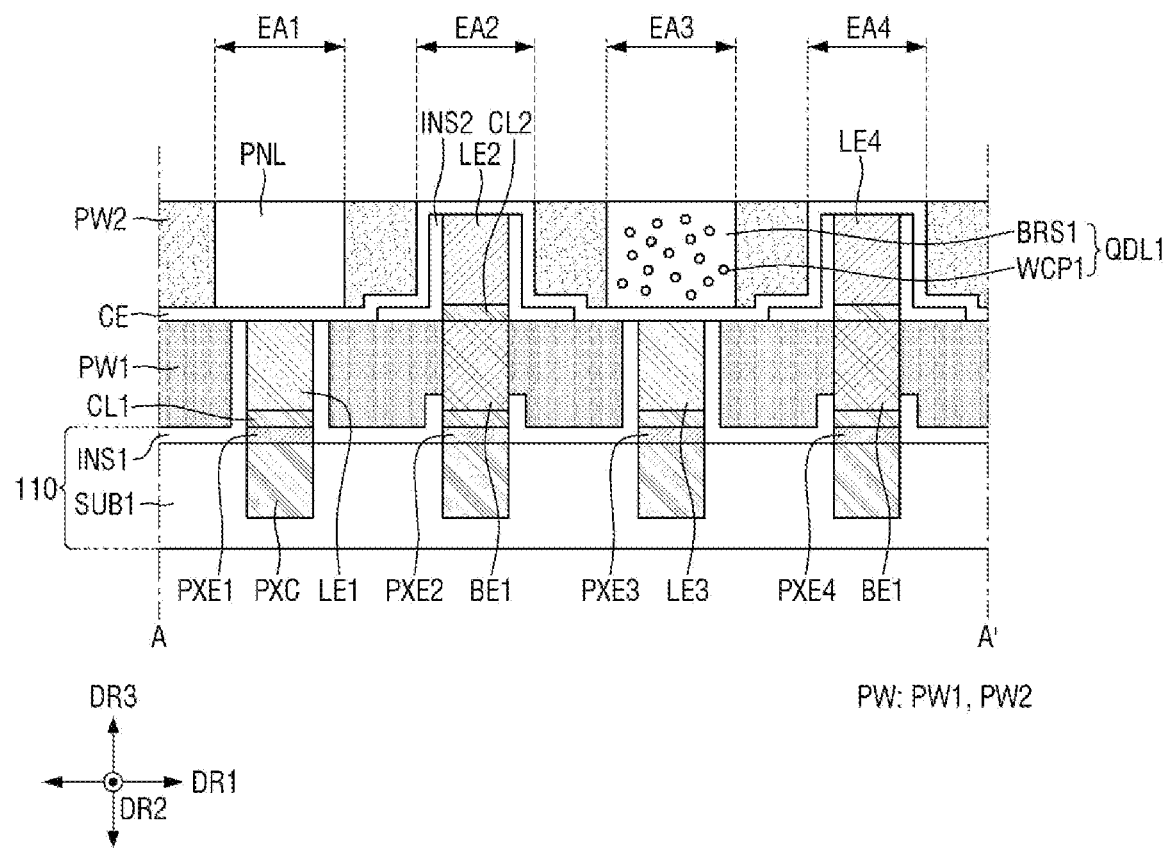

Fifteenth, referring to FIG. 26, a planarization layer PNL is formed in each of the second holes H2, and a first wavelength conversion layer QDL1 is formed in each of the third holes H3 (operation S1250 in FIG. 11B).

The planarization layer PNL fills each of the second holes H2, and the first wavelength conversion layer QDL1 fills each of the third holes H3. Therefore, the upper surface of the second partition wall PW2, the upper surface of the common electrode CE, an upper surface of the planarization layer PNL, and an upper surface of the first wavelength conversion layer QLD1 may be connected to form a flat surface.

Figure 27:
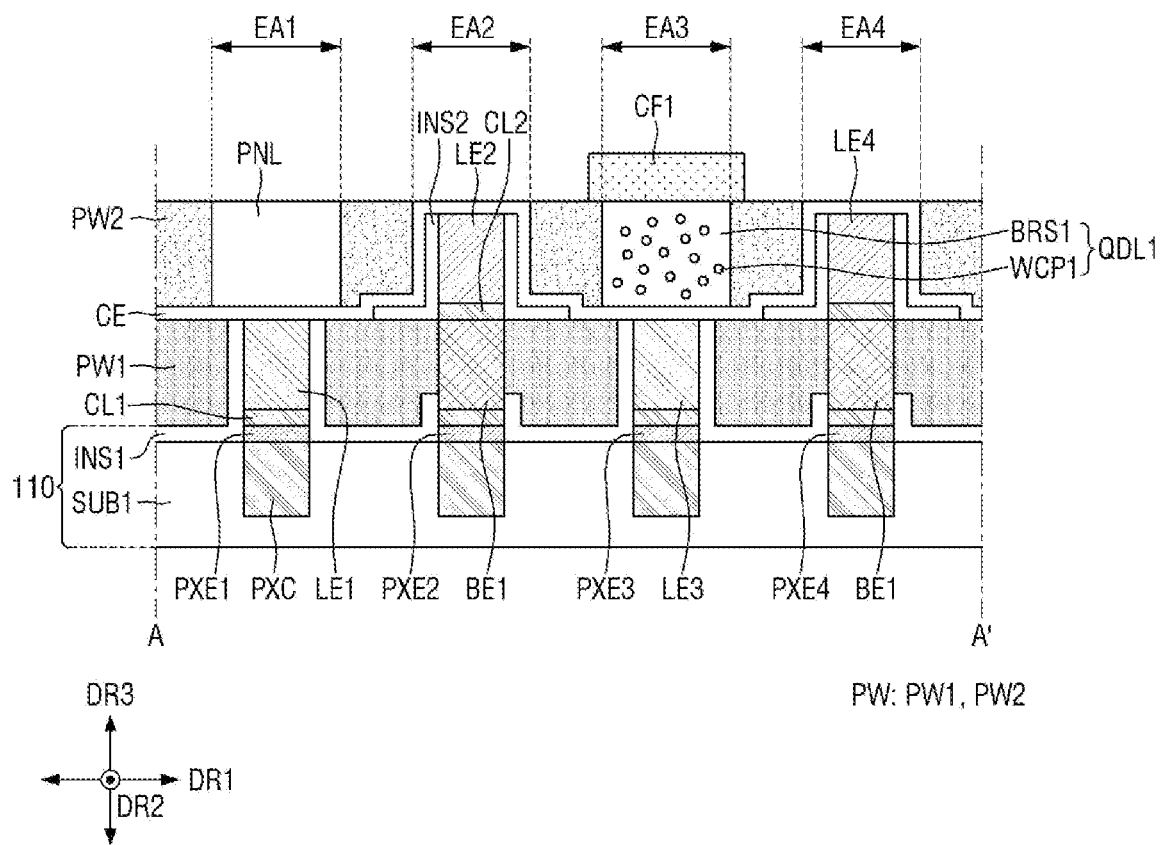

Sixteenth, referring to FIG. 27, a first color filter CF1 is formed on the first wavelength conversion layer QDL1 (operation S1260 in FIG. 11B).

A first color filter layer may be formed on the second partition wall PW2, the common electrode CE, the planarization layer PNL, and the first wavelength conversion layer QLD1. Then, a sixth mask pattern may be formed on the first color filter layer, and the first color filter layer may be removed according to the sixth mask pattern to form the first color filter CF1.

Figure 28:
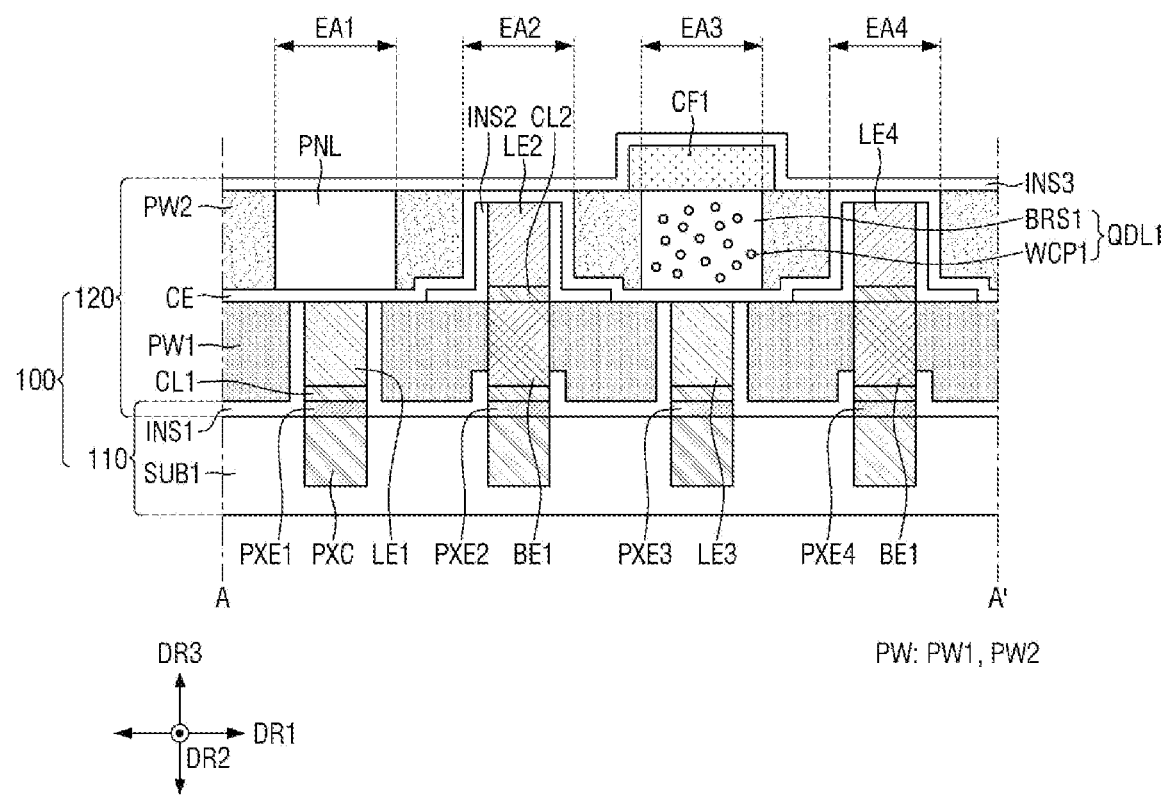

Seventeenth, referring to FIG. 28, a third insulating layer INS3 is formed (operation S1270 of FIG. 11B).

The third insulating layer INS3 may be disposed on an upper surface of the first color filter CF1, the upper surface of the second partition wall PW2, the upper surface of the common electrode CE, and the upper surface of the planarization layer PNL. The third insulating layer INS3 may be disposed on side surfaces of the first color filter CF1.

As described above with reference to FIGS. 11A, 11B, and 12 through 28, after the first light emitting elements LE1 and the third light emitting elements LE3 are formed, the first partition wall material layer PWL1 is formed by using electroplating (electrolytic plating) or electroless plating to fill spaces between the first light emitting elements LE1 and the third light emitting elements LE3, and then, the upper surface of each of the first light emitting elements LE1 and the third light emitting elements LE3 is exposed through a polishing process, such as a CMP process. Accordingly, the first partition wall PW1 disposed between the first light emitting elements LE1 and the third light emitting elements LE3 may be more easily formed.

In addition, after the second light emitting elements LE2 are formed, the second partition wall material layer PWL2 is formed by using electroplating (electrolytic plating) or electroless plating to fill spaces between the second light emitting elements LE2, and then, the common electrode CE disposed on the upper surface of each of the second light emitting elements LE2 is exposed through a polishing process, such as a CMP process. Accordingly, the second partition wall PW2 disposed between the second light emitting elements LE2 may be more easily formed.

Figure 29:
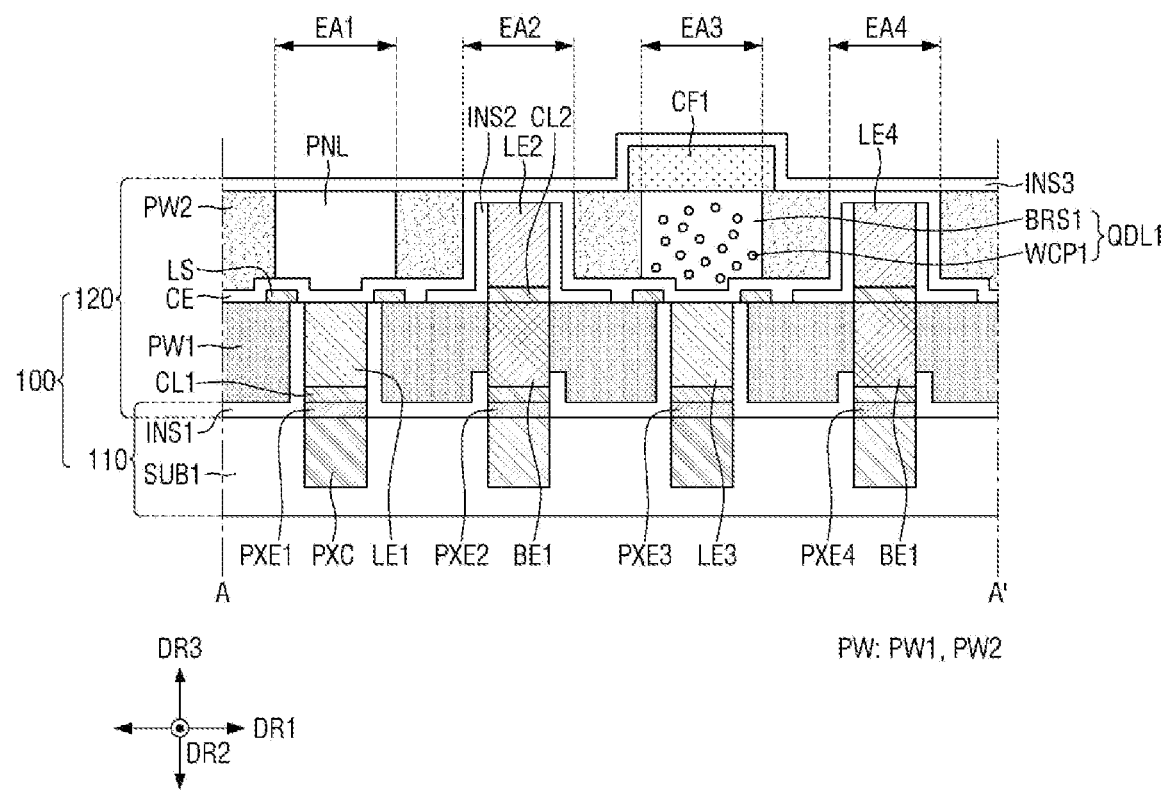
FIG. 29 is a cross-sectional view of the display panel taken along the line A-A' of FIG. 3 according to another embodiment.

FIG. 29 is a cross-sectional view of the display panel 100 taken along the line A-A' of FIG. 3 according to another embodiment.

The embodiment shown in FIG. 29 differs from the embodiment shown in FIG. 5 in that a light blocking layer LS is added. In FIG. 29, any description overlapping that of the embodiment described with reference to FIG. 5 will be omitted.

Referring to FIG. 29, the light blocking layer LS may be disposed on a first partition wall PW1. In addition, the light blocking layer LS may be disposed on a first insulating layer INS1, but embodiments of the present disclosure are not limited thereto.

The light blocking layer LS may include an opaque conductive material that does not transmit light. For example, the light blocking layer LS may be made of the same material as second conductive layers CL2. For example, the light blocking layer LS may include at least any one of gold (Au), copper (Cu), aluminum (Al), and tin (Sn). In some embodiments, the light blocking layer LS may include a first layer including any one of gold (Au), copper (Cu), aluminum (Al) and tin (Sn) and a second layer including another one of gold (Au), copper (Cu), aluminum (Al) and tin (Sn). In such an embodiment, the second layer may be disposed on the first layer.

The light blocking layer LS may be disposed between the first partition wall PW1 and a second partition wall PW2. Therefore, the light blocking layer LS may prevent first light emitted from a first light emitting element LE1 from travelling to a second light emitting area EA2 and a fourth light emitting area EA4 through a common electrode CE between the first partition wall PW1 and the second partition wall PW2. In addition, the light blocking layer LS may prevent the first light emitted from a third light emitting element LE3 from travelling to the second light emitting area EA2 and the fourth light emitting area EA4 through the common electrode CE between the first partition wall PW1 and the second partition wall PW2.

Figure 30:
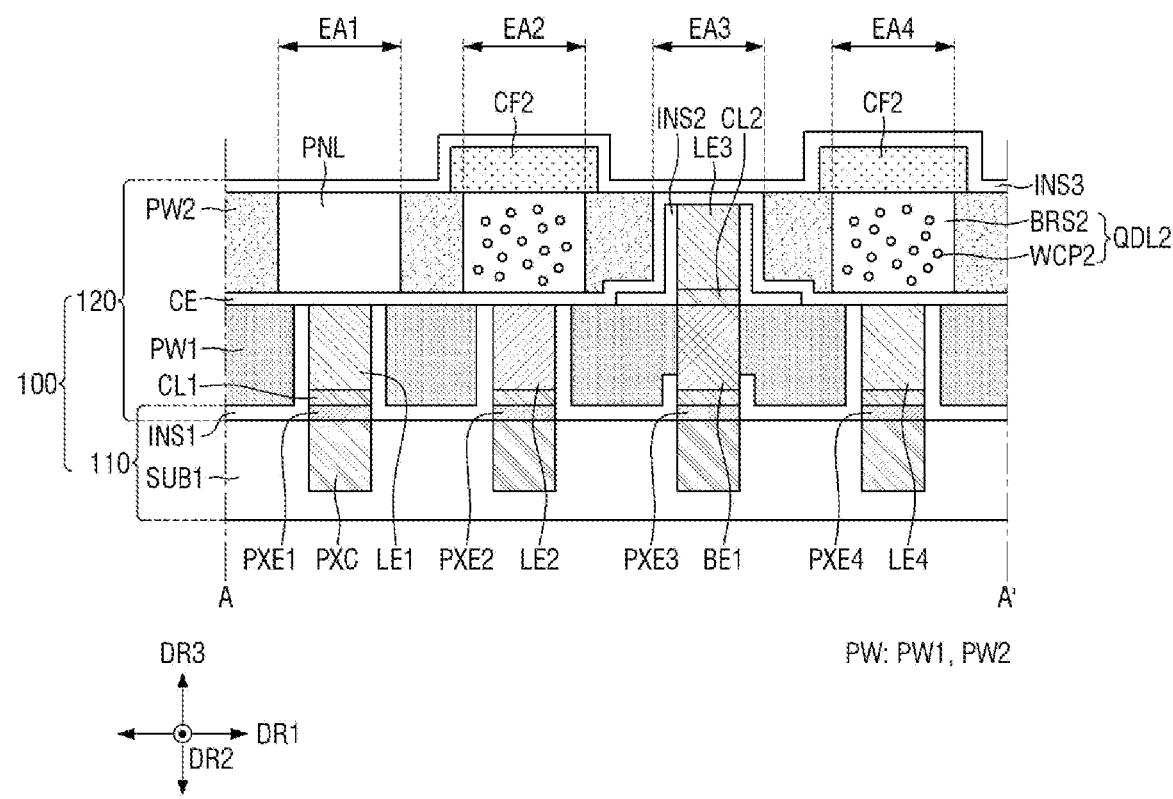
FIG. 30 is a cross-sectional view of the display panel taken along the line A-A' of FIG. 3 according to another embodiment.
Figure 31:
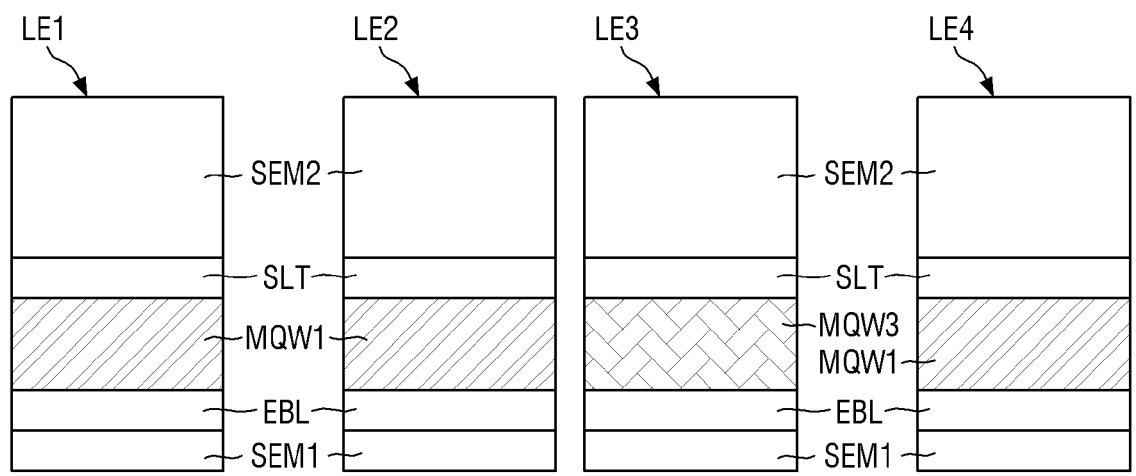
FIG. 31 is an enlarged cross-sectional view illustrating of a first light emitting element, a second light emitting element, a third light emitting element, and a fourth light emitting element shown in FIG. 30 in detail.

FIG. 30 is a cross-sectional view of the display panel 100 taken along the line A-A' of FIG. 3 according to another embodiment. FIG. 31 is an enlarged cross-sectional view illustrating an example of a first light emitting element LE1, a second light emitting element LE2, a third light emitting element LE3, and a fourth light emitting element LE4 of FIG. 30 in more detail.

The embodiment shown in FIGS. 30 and 31 differs from the embodiment shown in FIG. 5 in that first light emitted from each of the second light emitting element LE2 and the fourth light emitting element LE4 is converted into second light by a second wavelength conversion layer QDL2 and that the third light emitting element LE3 emits third light. In FIGS. 30 and 31, any description overlapping that of the embodiment described with reference to FIGS. 5 and 7 will be omitted.

Referring to FIGS. 30 and 31, the second light emitting element LE2 may be disposed on a first conductive layer CL1 in a second light emitting area EA2. The third light emitting element LE3 may be disposed on a second conductive layer CL2 in a third light emitting area EA3. The fourth light emitting element LE4 may be disposed on the first conductive layer CL1 in a fourth light emitting area EA4.

The second light emitting element LE2 and the fourth light emitting element LE4 may be substantially the same as the first light emitting element LE1. For example, the second light emitting element LE2 and the fourth light emitting element LE4 may emit the first light. Each of the first light emitting element LE1, the second light emitting element LE2, and the fourth light emitting element LE4 may include a first semiconductor layer SEM1, an electron blocking layer EBL, a first active layer MQW1, a superlattice layer SLT, and a second semiconductor layer SEM2 as illustrated in FIG. 31.

In contrast, the third light emitting element LE3 may emit the third light. The third light emitting element LE3 may include a first semiconductor layer SEM1, an electron blocking layer EBL, a third active layer MQW3, a superlattice layer SLT, and a second semiconductor layer SEM2 as illustrated in FIG. 31.

When the first active layer MQW1 and the third active layer MQW3 include InGaN, the color of emitted light may vary according to the content of indium (In). For example, as the indium content increases, the wavelength band of light emitted from an active layer may move toward the red wavelength band. As the indium content decreases, the wavelength band of light emitted from the active layer may move toward the blue wavelength band. Therefore, the indium content of the first active layer MQW1 may be lower than the indium content of the third active layer MQW3. For example, the indium content of the first active layer MQW1 may be in a range of about 10 wt % to about 20 wt %, and the indium content of the third active layer MQW3 may be in a range of about 30 wt % to about 45 wt %.

A first connection electrode BE1 may be disposed between the third light emitting element LE3 and the first conductive layer CL1. The second wavelength conversion layer QDL2 may be disposed on each of the second light emitting element LE2 and the fourth light emitting element LE4.

The second wavelength conversion layer QDL2 may be disposed on a common electrode CE in each of the second light emitting area EA2 and the fourth light emitting area EA4. The second wavelength conversion layer QDL2 may overlap the second light emitting element LE2 in the second light emitting area EA2. The common electrode CE may be disposed between the second light emitting element LE2 and the second wavelength conversion layer QDL2 in the second light emitting area EA2. The second wavelength conversion layer QDL2 may overlap the fourth light emitting element LE4 in the fourth light emitting area EA4. The common electrode CE may be disposed between the fourth light emitting element LE4 and the second wavelength conversion layer QDL2 in the fourth light emitting area EA4.

The second wavelength conversion layer QDL2 may convert a portion of (or some of) the first light of the second light emitting element LE2 or the fourth light emitting element LE4 into the third light and output the third light. The second wavelength conversion layer QDL2 may include a second base resin BRS2 and second wavelength conversion particles WCP2.

The second base resin BRS2 may include a light-transmitting organic material. For example, the second base resin BRS2 may include epoxy resin, acrylic resin, cardo resin, or imide resin.

The second wavelength conversion particles WCP2 may convert the first light of the second light emitting element LE2 or the fourth light emitting element LE4 into second light. For example, the second wavelength conversion particles WCP2 may convert light of the blue wavelength band into light of a green wavelength band.

The second wavelength conversion layer QDL2 may further include scatterers for scattering the first light of the second light emitting element LE2 or the fourth light emitting element LE4 in various directions.

Figure 32:
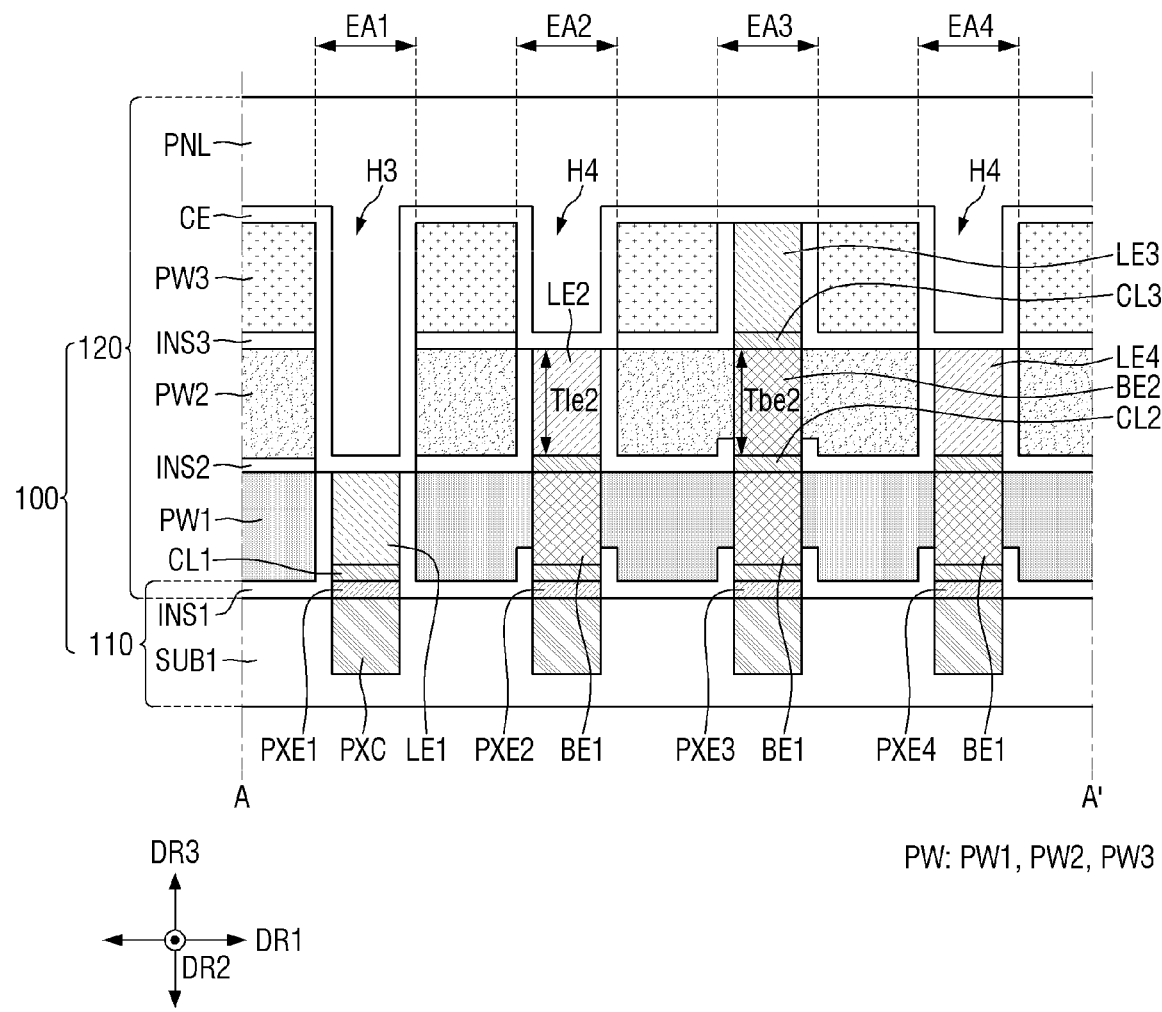
FIG. 32 is a cross-sectional view of the display panel taken along the line A-A' of FIG. 3 according to another embodiment.
Figure 33:
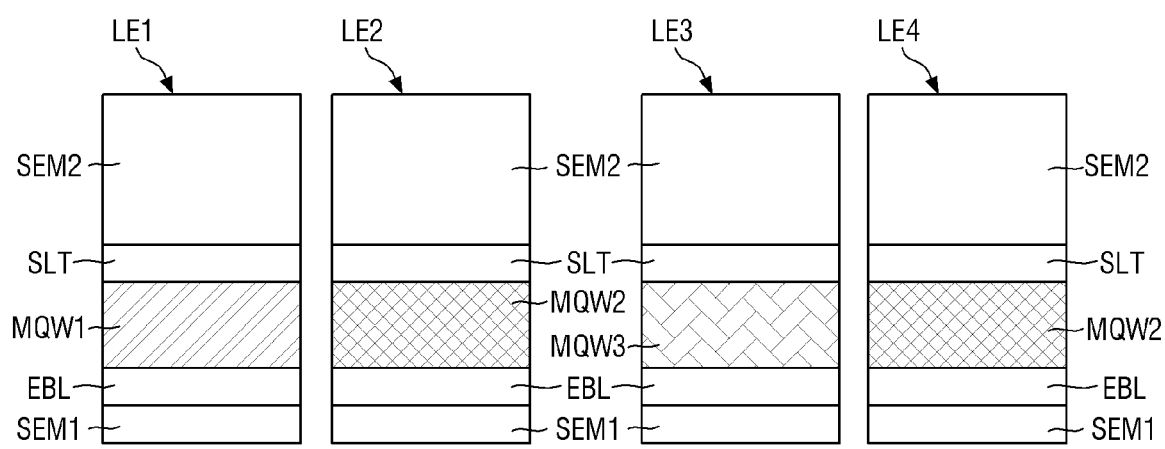
FIG. 33 is an enlarged cross-sectional view illustrating a first light emitting element, a second light emitting element, a third light emitting element, and a fourth light emitting element shown in FIG. 32 in detail.

FIG. 32 is a cross-sectional view of the display panel 100 taken along the line A-A' of FIG. 3 according to another embodiment. FIG. 33 is an enlarged cross-sectional view illustrating a first light emitting element LE1, a second light emitting element LE2, a third light emitting element LE3, and a fourth light emitting element LE4 of FIG. 32 in more detail.

In FIGS. 32 and 33, the same reference numerals are given to the same components as those of the embodiment described with reference to FIGS. 5 and 7, and any description overlapping that of the embodiment described with reference to FIGS. 5 and 7 will be omitted for ease of description.

Referring to FIGS. 32 and 33, a display panel 100 may include a semiconductor circuit board 110 and a light emitting element layer 120.

The light emitting element layer 120 may be a layer including light emitting elements LE1 through LE4 to emit light (e.g., predetermined light). The light emitting element layer 120 may include first conductive layers CL1, second conductive layers CL2, first connection electrodes BE1, second connection electrodes BE2, third connection electrodes BE3, the light emitting elements LE1 through LE4, a common electrode CE, a first insulating layer INS1, a second insulating layer INS2, a third insulating layer INS3, a planarization layer PNL, and a partition wall portion PW. The partition wall portion PW may include a first partition wall PW1 and a second partition wall PW2.

Each of first light emitting elements LE1 may be disposed on the first conductive layer CL1 in a first light emitting area EA1. The first light emitting elements LE1 may emit first light. Each of the first light emitting elements LE1 may include a first semiconductor layer SEM1, an electron blocking layer EBL, a first active layer MQW1, a superlattice layer SLT, and a second semiconductor layer SEM2.

The first connection electrodes BE1 may be disposed on the first conductive layers CL1 in a second light emitting area EA2, a third light emitting area EA3, and a fourth light emitting area EA4, respectively.

The first partition wall PW1 may be disposed on side surfaces of each of the first light emitting elements LE1 and the first connection electrodes BE1.

The second conductive layers CL2 may be disposed on the first connection electrodes BE1 in the second light emitting area EA2, the third light emitting area EA3, and the fourth light emitting area EA4, respectively.

Each of second light emitting elements LE2 may be disposed on the second conductive layer CL2 in the second light emitting area EA2. Each of fourth light emitting elements LE4 may be disposed on the second conductive layer CL2 in the fourth light emitting area EA4. The second light emitting elements LE2 and the fourth light emitting elements LE4 may emit second light. Each of the second light emitting elements LE2 and the fourth light emitting elements LE4 may include a first semiconductor layer SEM1, an electron blocking layer EBL, a second active layer MQW2, a superlattice layer SLT, and a second semiconductor layer SEM2.

Each of the second connection electrodes BE2 may be disposed on the second conductive layer CL2 in the third light emitting area EA3. The second connection electrodes BE2 may be made of a metal material having high conductivity. For example, the second connection electrodes BE2 may be made of a metal material, such as molybdenum (Mo), aluminum (Al), chromium (Cr), gold (Au), tin (Sn), titanium (Ti), nickel (Ni), neodymium (Nd), or copper (Cu). A thickness Tle2 of the second light emitting elements LE2 and a thickness Tbe2 of the second connection electrodes BE2 may be substantially the same.

The second insulating layer INS2 may be disposed on side surfaces of each of the second light emitting elements LE2. The second insulating layer INS2 may be disposed on part of side surfaces of each of the second connection electrodes BE2. The second insulating layer INS2 may not be disposed on an upper surface of each of the second light emitting elements LE2 and the second connection electrodes BE2. In addition, the second insulating layer INS2 may be disposed on side surfaces of each of the second conductive layers CL2. In addition, the second insulating layer INS2 may be disposed on the first partition wall PW1. The second insulating layer INS2 may be formed of an inorganic layer, such as a silicon oxide (e.g., $SiO_2$) layer, an aluminum oxide (e.g., $Al_2O_3$) layer, or a hafnium oxide ($HfO_x$) layer, but embodiments of the present disclosure are not limited thereto.

The second partition wall PW2 may be disposed on side surfaces of each of the second light emitting elements LE2 and the second connection electrodes BE2. The second partition wall PW2 may be disposed on the second insulating layer INS2. A lower surface of the second partition wall PW2 may contact the second insulating layer INS2.

A second oxide layer formed by oxidizing an upper surface of the second partition wall PW2 may be formed on the upper surface of the second partition wall PW2. For example, when the second partition wall PW2 is made of aluminum (Al), the second oxide layer may be an aluminum oxide (e.g., $Al_2O_3$) layer.

Each of third conductive layers CL3 may be disposed on the second connection electrode BE2 in the third light emitting area EA3. The third conductive layers CL3 may be bonding metal layers for bonding the second connection electrodes BE2 to third light emitting elements LE3. For example, each of the third conductive layers CL3 may include at least any one of gold (Au), copper (Cu), aluminum (Al), and tin (Sn). In some embodiments, each of the third conductive layers CL3 may include a first layer including any one of gold (Au), copper (Cu), aluminum (Al) and tin (Sn) and a second layer including another one of gold (Au), copper (Cu), aluminum (Al) and tin (Sn). In such embodiments, the second layer may be disposed on the first layer.

Each of the third light emitting elements LE3 may be disposed on the third conductive layer CL3 in the third light emitting area EA3. For example, a minimum distance between the third light emitting elements LE3 and the first substrate SUB1 may be greater than a minimum distance between the second light emitting elements LE2 and the first substrate SUB1 and a minimum distance between the fourth light emitting elements LE4 and the first substrate SUB1. In addition, the minimum distance between the second light emitting elements LE2 and the first substrate SUB1 and the minimum distance between the fourth light emitting elements LE4 and the first substrate SUB1 may be greater than a minimum distance between the first light emitting elements LE1 and the first substrate SUB1. The minimum distance between the second light emitting elements LE2 and the first substrate SUB1 and the minimum distance between the fourth light emitting elements LE4 and the first substrate SUB1 may be substantially the same.

The third light emitting elements LE3 may emit third light. Each of the third light emitting elements LE3 may include a first semiconductor layer SEM1, an electron blocking layer EBL, a third active layer MQW3, a superlattice layer SLT, and a second semiconductor layer SEM2.

When the first active layer MQW1, the second active layer MQW2, and the third active layer MQW3 include InGaN, the color of emitted light may vary according to the content of indium (In). For example, as the indium content increases, the wavelength band of light emitted from an active layer may move toward the red wavelength band. As the indium content decreases, the wavelength band of light emitted from the active layer may move toward the blue wavelength band. Therefore, the indium content of the first active layer MQW1 may be lower than the indium content of the second active layer MQW2. In addition, the indium content of the second active layer MQW2 may be lower than the indium content of the third active layer MQW3. For example, the indium content of the first active layer MQW1 may be in a range of about 10 wt % to about 20 wt %, the indium content of the second active layer MQW2 may be in a range of about 20 wt % to about 30 wt %, and the indium content of the third active layer MQW3 may be in a range of about 30 wt % to about 45 wt %.

The third insulating layer INS3 may be disposed on side surfaces of each of the third light emitting elements LE3. The third insulating layer INS3 may not be disposed on an upper surface of each of the third light emitting elements LE3. In addition, the third insulating layer INS3 may be disposed on side surfaces of each of the third conductive layers CL3. In addition, the third insulating layer INS3 may be disposed on the second partition wall PW2. The third insulating layer INS3 may be formed of an inorganic layer, such as a silicon oxide (e.g., $SiO_2$) layer, an aluminum oxide (e.g., $Al_2O_3$) layer, or a hafnium oxide ($HfO_x$) layer, but embodiments of the present disclosure are not limited thereto.

A third partition wall PW3 may be disposed on the side surfaces of each of the third light emitting elements LE3. The third partition wall PW3 may surround the side surfaces of each of the third light emitting elements LE3.

The third partition wall PW3 may be disposed on the third insulating layer INS3. Side surfaces of the third partition wall PW3 may contact the third insulating layer INS3 disposed on the side surfaces of each of the third light emitting elements LE3.

The third partition wall PW3 may include a material having conductivity. For example, the third partition wall PW3 may be made of a metal material having high thermal conductivity. In such an embodiment, heat generated by the third light emitting elements LE3 may be radiated to the third partition wall PW3. For example, the third partition wall PW3 may dissipate heat generated by the third light emitting elements LE3.

In addition, the third partition wall PW3 may include a metal material having high reflectivity. The third partition wall PW3 may be made of aluminum (Al). However, embodiments of the present disclosure are not limited thereto, and the third partition wall PW3 may also be made of an opaque metal material, such as molybdenum (Mo), chromium (Cr), gold (Au), titanium (Ti), nickel (Ni), neodymium (Nd), or copper (Cu).

A third oxide layer formed by oxidizing an upper surface of the third partition wall PW3 may be formed on the upper surface of the third partition wall PW3. For example, when the third partition wall PW3 is made of aluminum (Al), the third oxide layer may be an aluminum oxide (e.g., $Al_2O_3$) layer. Due to the third oxide layer, the third partition wall PW3 may be electrically insulated from the common electrode CE.

When the third partition wall PW3 is made of a metal material having high reflectivity, the third light emitted from the third light emitting elements LE3 may be reflected upwardly above the third light emitting elements LE3 by the third partition wall PW3. Therefore, the output efficiency of the third light of the third light emitting elements LE3 may be increased by the third partition wall PW3.

In some embodiments, the third partition wall PW3 may include a light blocking material that absorbs or blocks light. The light blocking material may be an inorganic black pigment, such as carbon black or an organic black pigment. In such an embodiment, the third partition wall PW3 may prevent light emitted from adjacent light emitting elements LE1 through LE4 from being mixed with each other.

The common electrode CE may be disposed on the third partition wall PW3. The common electrode CE may be connected to an upper surface of the first light emitting elements LE1 through a third hole (e.g., a third opening) H3 penetrating the second partition wall PW2, the second insulating layer INS2, the third partition wall PW3, and the third insulating layer INS3. The common electrode CE may be disposed on the upper surface of each of the first light emitting elements LE1, side surfaces of the second insulating layer INS2, side surfaces of the second partition wall PW2, side surfaces of the third insulating layer INS3, and the side surfaces of the third partition wall PW3 exposed through the third hole H3.

The common electrode CE may be connected to the upper surface of each of the second light emitting elements LE2 through a fourth hole (e.g., a fourth opening) H4 penetrating the third partition wall PW3 and the third insulating layer INS3. The common electrode CE may be disposed on the upper surface of each of the second light emitting elements LE2, the side surfaces of the third insulating layer INS3, and the side surfaces of the third partition wall PW3 exposed through the fourth hole H4.

The planarization layer PNL may be disposed on the common electrode CE. The planarization layer PNL may fill the third hole H3 and the fourth hole H4.

As illustrated in FIGS. 32 and 33, each of a plurality of pixels PX includes the first light emitting element LE1 emitting the first light, the second light emitting element LE2 emitting the second light, the third light emitting element LE3 emitting the third light, and the fourth light emitting element LE4 emitting the second light. Therefore, each of the pixels PX can display various colors without a wavelength conversion layer. That is, because the wavelength conversion layer can be omitted, ease of a fabrication process can be increased.

Figure 34A:
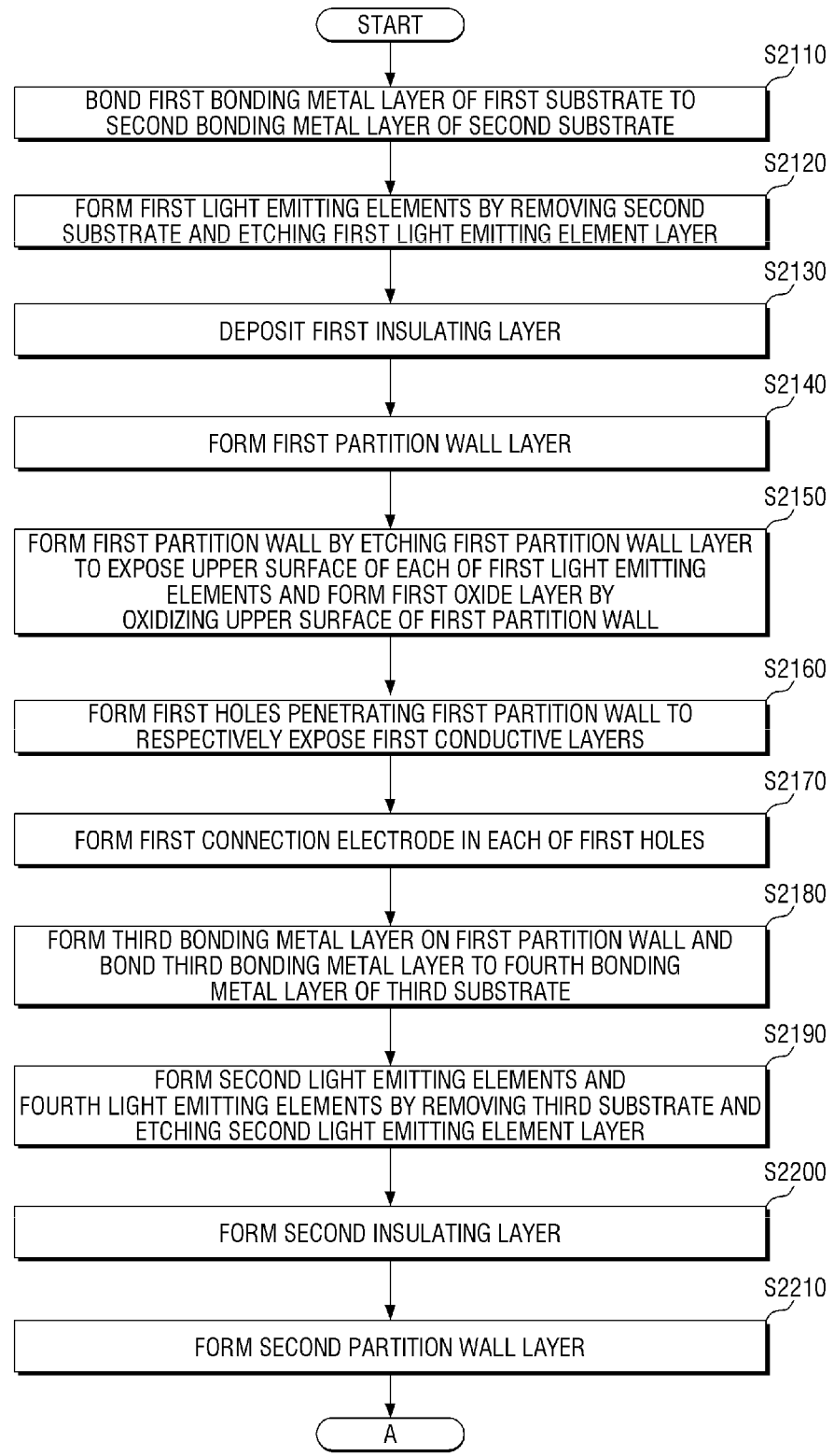
FIGS. 34A and 34B are flowcharts illustrating steps of a method of fabricating a display device according to an embodiment.
Figure 34B:
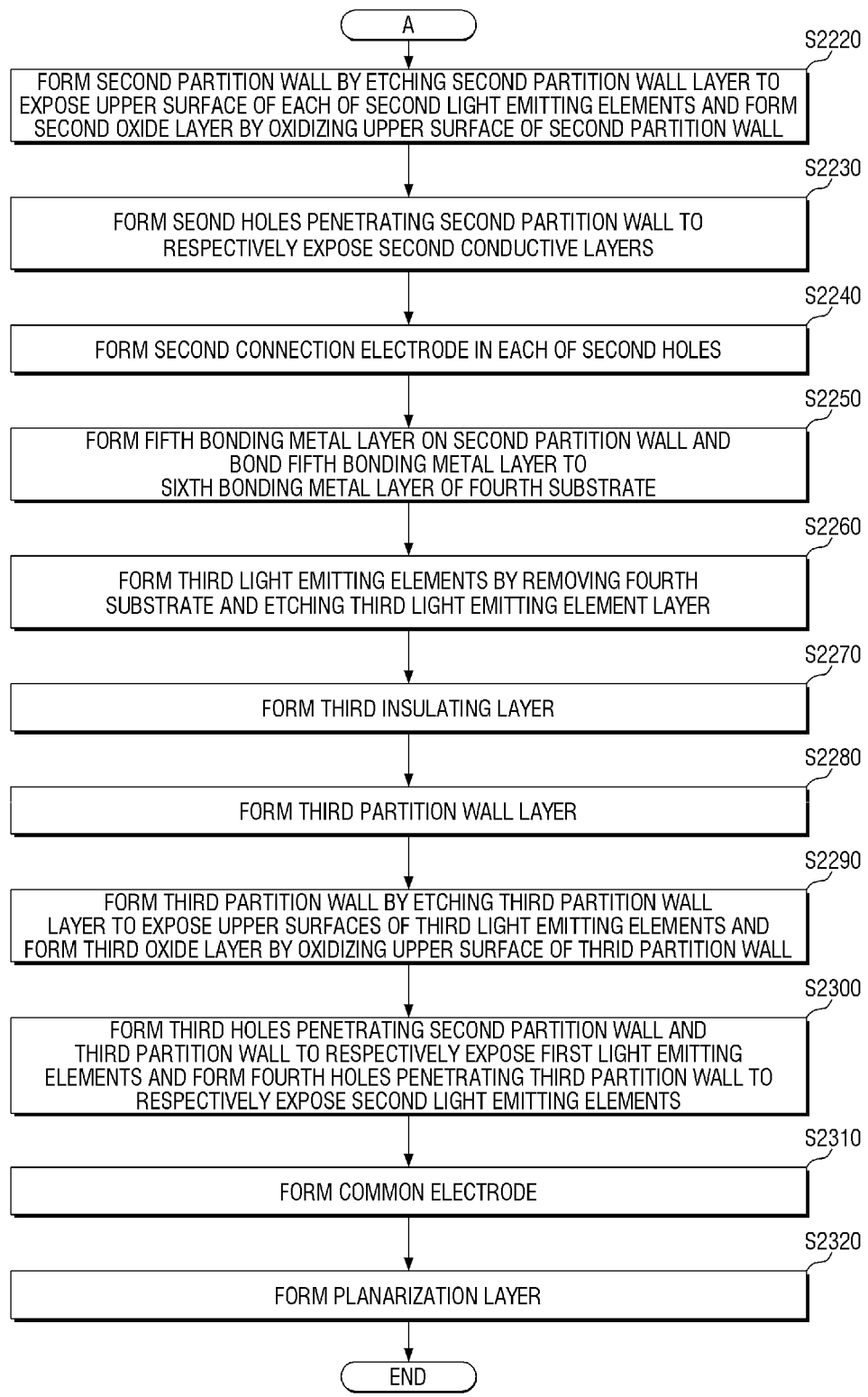

FIGS. 34A and 34B are flowcharts illustrating steps of a method of fabricating a display device according to an embodiment. FIGS. 35 through 55 are cross-sectional views for describing the method of fabricating the display device according to the embodiment shown in FIGS. 34A and 34B. FIGS. 35 through 55 are cross-sectional views of a display panel 100 taken along the line A-A' of FIG. 3.

A method of fabricating a display panel according to an embodiment will now be described in detail with reference to FIGS. 34A, 34B, and 35 through 55.

First, a first bonding metal layer BML1 of a first substrate SUB1 and a bonding metal layer BML2 of a second substrate SUB2 are bonded together (operation S2110 in FIG. 34A).

Because operation S2110 of FIG. 34 is substantially the same as operation S1110 of FIG. 11A, a description thereof will be omitted.

Figure 35:
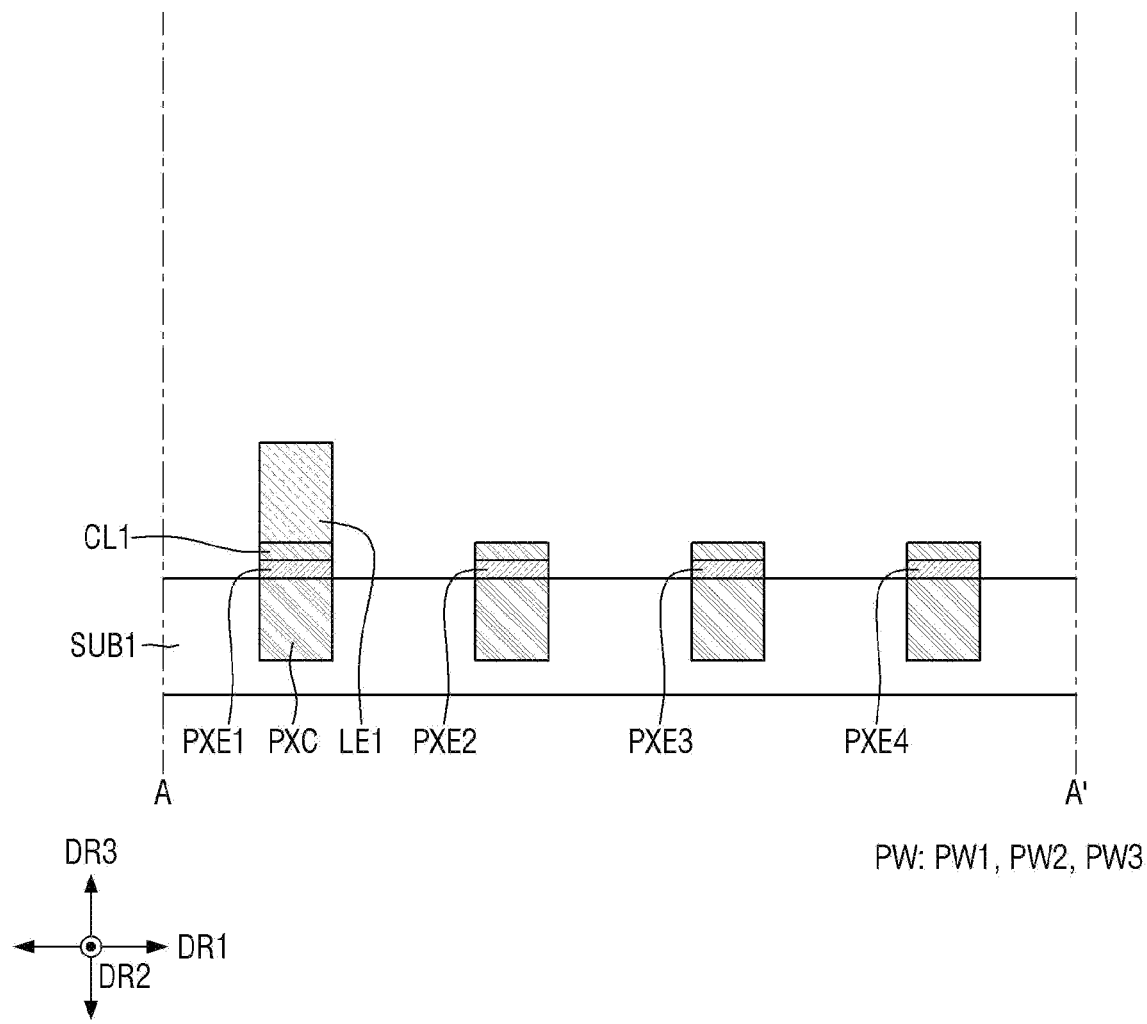
FIGS. 35 through 55 are cross-sectional views describing the method of fabricating the display device according to an embodiment.

Second, referring to FIG. 35, the second substrate SUB2 is removed, and a first light emitting element layer EML1 is etched to form first conductive layers CL1 and first light emitting elements EL1 (operation S2120 in FIG. 34A).

The second substrate SUB2 may be removed by a polishing process, such as a CMP process or a laser lift off process. When the first light emitting element layer EML1 includes an undoped semiconductor layer, the undoped semiconductor layer may be removed by a polishing process, such as a CMP process.

Next, a first mask pattern may be formed on the first light emitting element layer EML1, and the first light emitting element layer EML1 may be etched according to the first mask pattern to form the first conductive layers CL1 and the first light emitting elements LE1. In some embodiments, a planarization insulating layer PINS1 may be etched together with the first light emitting element layer EML1.

Figure 36:
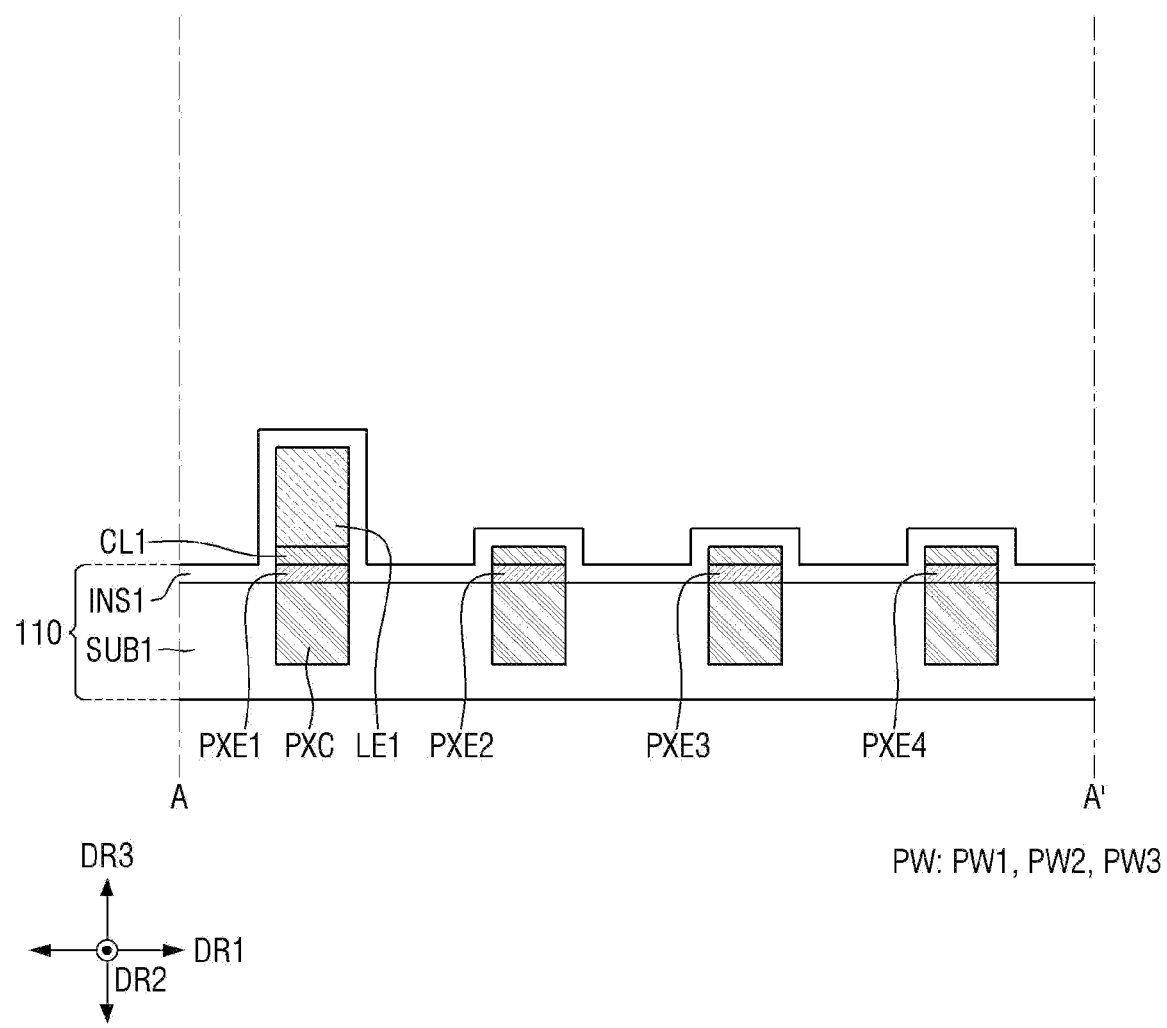

Third, referring to FIG. 36, a first insulating layer INS1 is deposited (operation S2130 in FIG. 34A).

The first insulating layer INS1 may be formed by using a deposition method, such as chemical vapor deposition. The first insulating layer INS1 may be formed to cover the first light emitting elements LE1. The first insulating layer INS1 may be disposed on side surfaces of each of the first conductive layers CL1 disposed under the first light emitting elements LE1. The first insulating layer INS1 may cover the first conductive layers CL1 not covered by the first light emitting elements LE1. For example, the first insulating layer INS1 may cover the first conductive layers CL1 disposed on second pixel electrodes PXE2, third pixel electrodes PXE3, and fourth pixel electrodes PXE4. The first insulating layer INS1 may be disposed on side surfaces of each of the pixel electrodes PXE1 through PXE4. The first insulating layer INS1 may cover an upper surface of the first substrate SUB1 disposed between the pixel electrodes PXE1 through PXE4.

Figure 37:
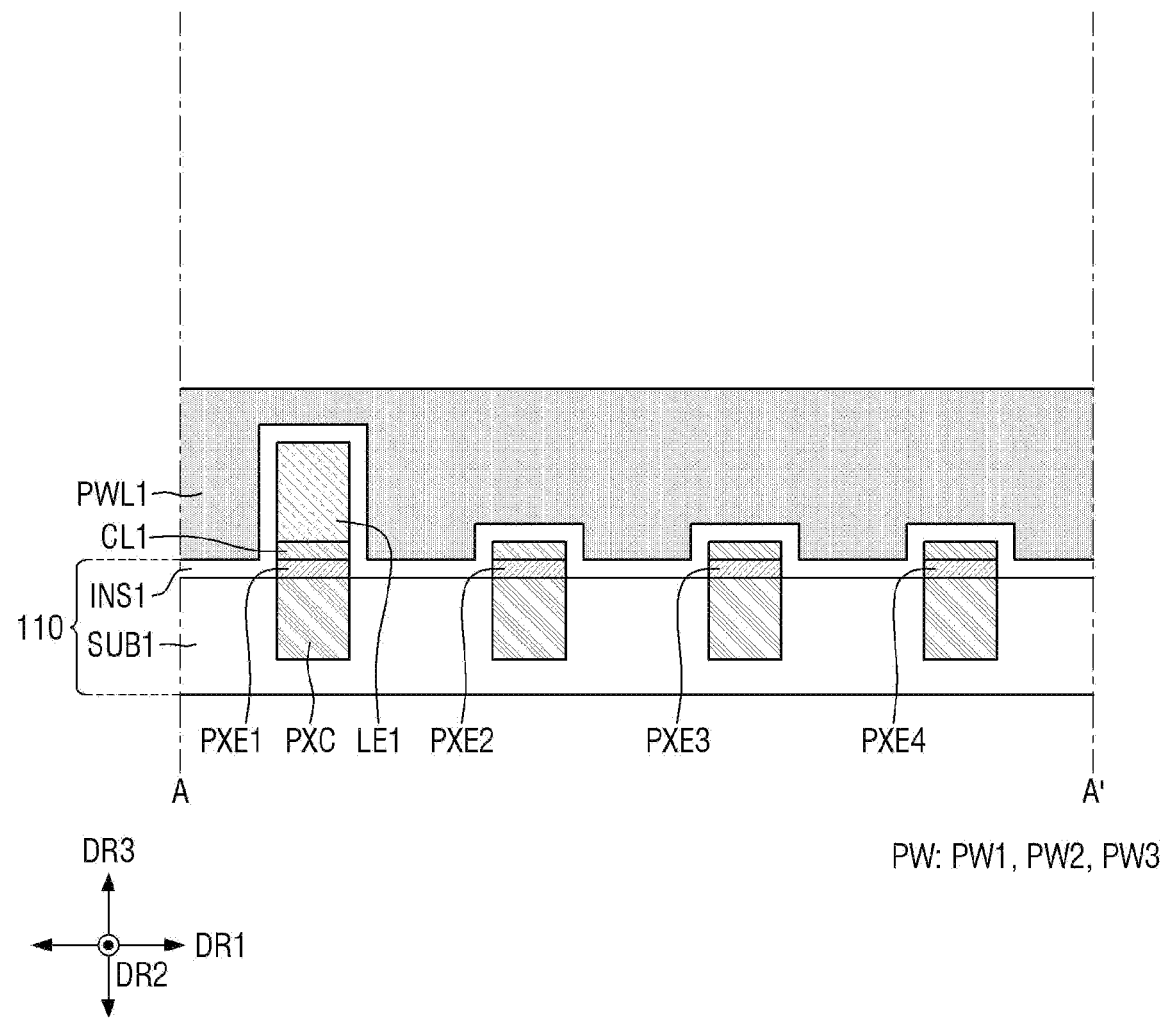

Fourth, referring to FIG. 37, a first partition wall layer PWL1 is formed (operation S2140 in FIG. 34A).

The first partition wall layer PWL1 may be formed by electroplating (or electrolytic plating) or electroless plating. A thickness of the first partition wall layer PWL1 may be greater than a thickness of each of the first light emitting elements LE1. For example, the first insulating layer INS1 disposed on an upper surface of each of the first light emitting elements LE1 may be covered by the first partition wall layer PWL1.

The first partition wall layer PWL1 may be made of aluminum (Al). However, embodiments of the present disclosure are not limited thereto, and the first partition wall layer PWL1 may also be made of a material having conductivity, for example, an opaque metal material, such as molybdenum (Mo), chromium (Cr), gold (Au), titanium (Ti), nickel (Ni), neodymium (Nd), or copper (Cu).

Figure 38:
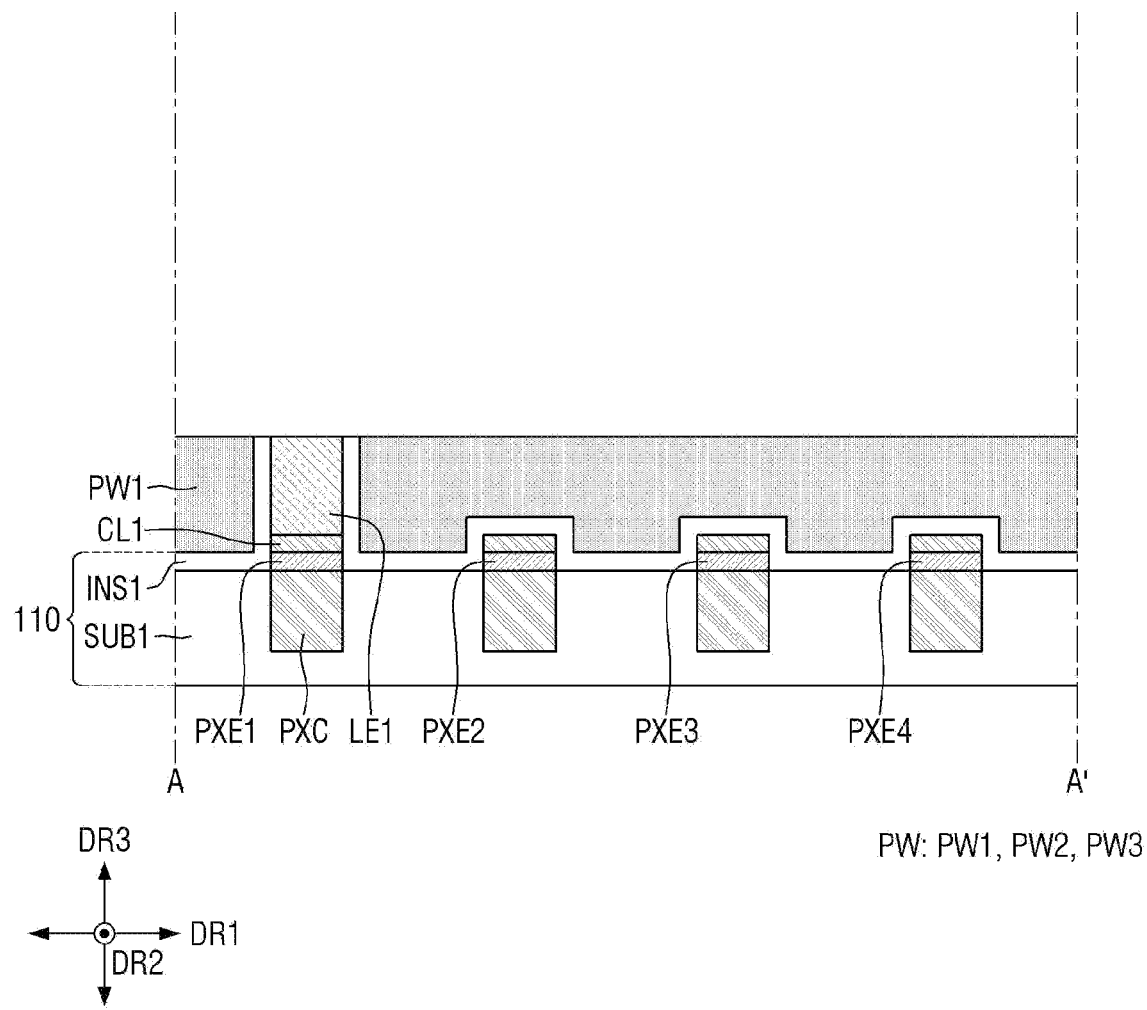

Fifth, referring to FIG. 38, a first partition wall PW1 is formed by etching the first partition wall layer PWL1 to expose the upper surfaces of the first light emitting elements LE1, and a first oxide layer PWO1 (see, e.g., FIG. 6) is formed by oxidizing an upper surface of the first partition wall PW1 (operation S2150 in FIG. 34A).

The first partition wall PW1 may be formed by removing the first partition wall layer PWL1 by using a polishing process, such as a CMP process. The upper surface of each of the first light emitting elements LE1 may be exposed without being covered by the first partition wall PW1. In addition, an upper surface of the first insulating layer INS1 disposed on side surfaces of each of the first light emitting elements LE1 may be exposed without being covered by the first partition wall PW1. Therefore, the upper surface of each of the first light emitting elements LE1, the upper surface of the first insulating layer INS1, and the upper surface of the first partition wall PW1 may be connected to form a flat surface.

In addition, as illustrated in FIG. 6, the first oxide layer PWO1 may be formed by injecting oxygen into the upper surface of the first partition wall PW1. For example, when the first partition wall PW1 is made of aluminum (Al), the first oxide layer PWO1 may be an aluminum oxide (e.g., $Al_2O_3$) layer. The first oxide layer PWO1 may be an electrically insulated insulating layer.

Figure 39:
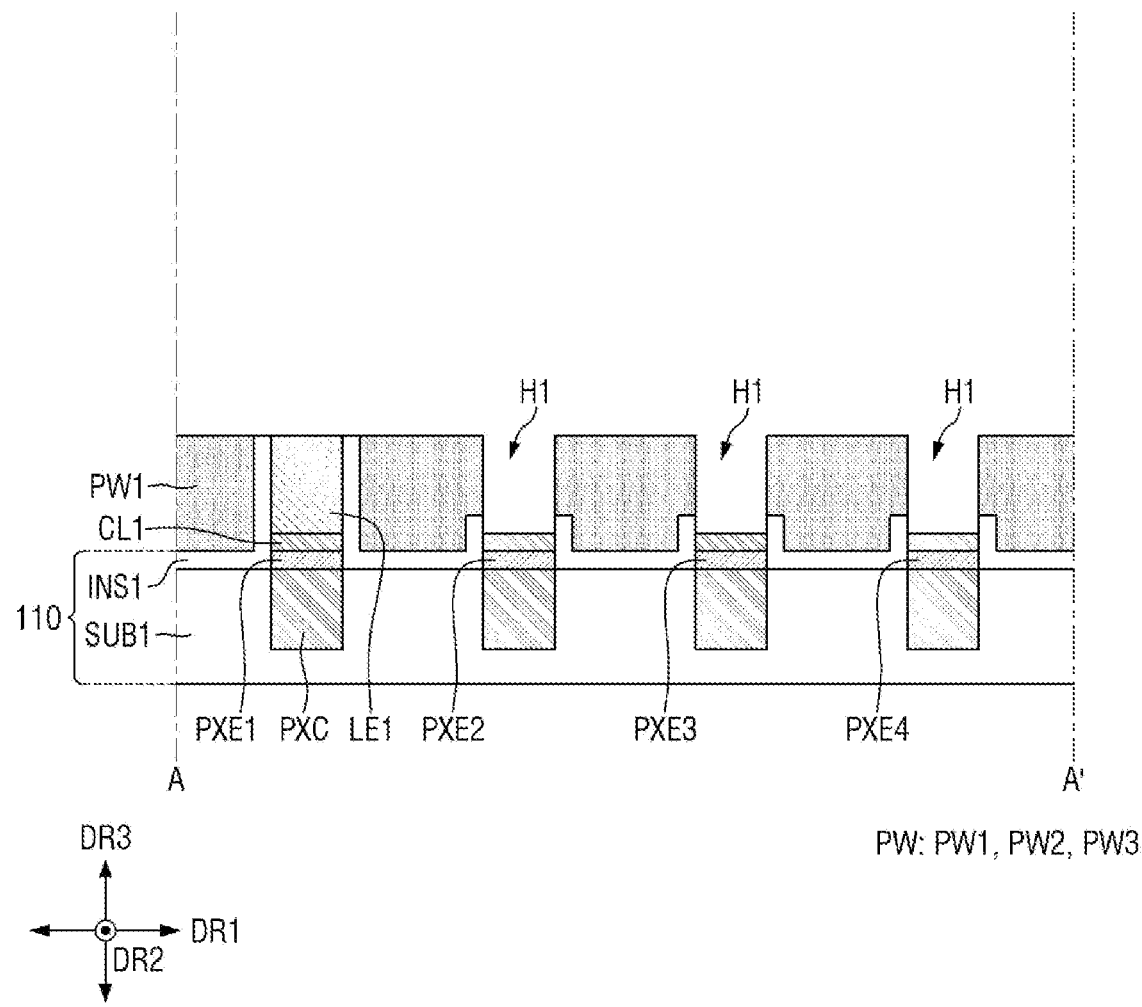

Sixth, referring to FIG. 39, first holes (e.g., first openings) H1 may be formed to penetrate the first partition wall PW1 to expose the first conductive layers CL1, respectively (operation S2160 in FIG. 34A).

A second mask pattern may be formed on the first partition wall PW1, and the first holes H1 may be formed by etching the first partition wall PW1 and the first insulating layer INS1 according to the second mask pattern. The first holes H1 may be formed to expose the first conductive layers CL1 that are not covered by the first light emitting elements LE1. For example, the first holes H1 may be formed to expose the first conductive layers CL1 disposed on the second pixel electrodes PXE2, the third pixel electrodes PXE3, and the fourth pixel electrodes PXE4, respectively.

Figure 40:
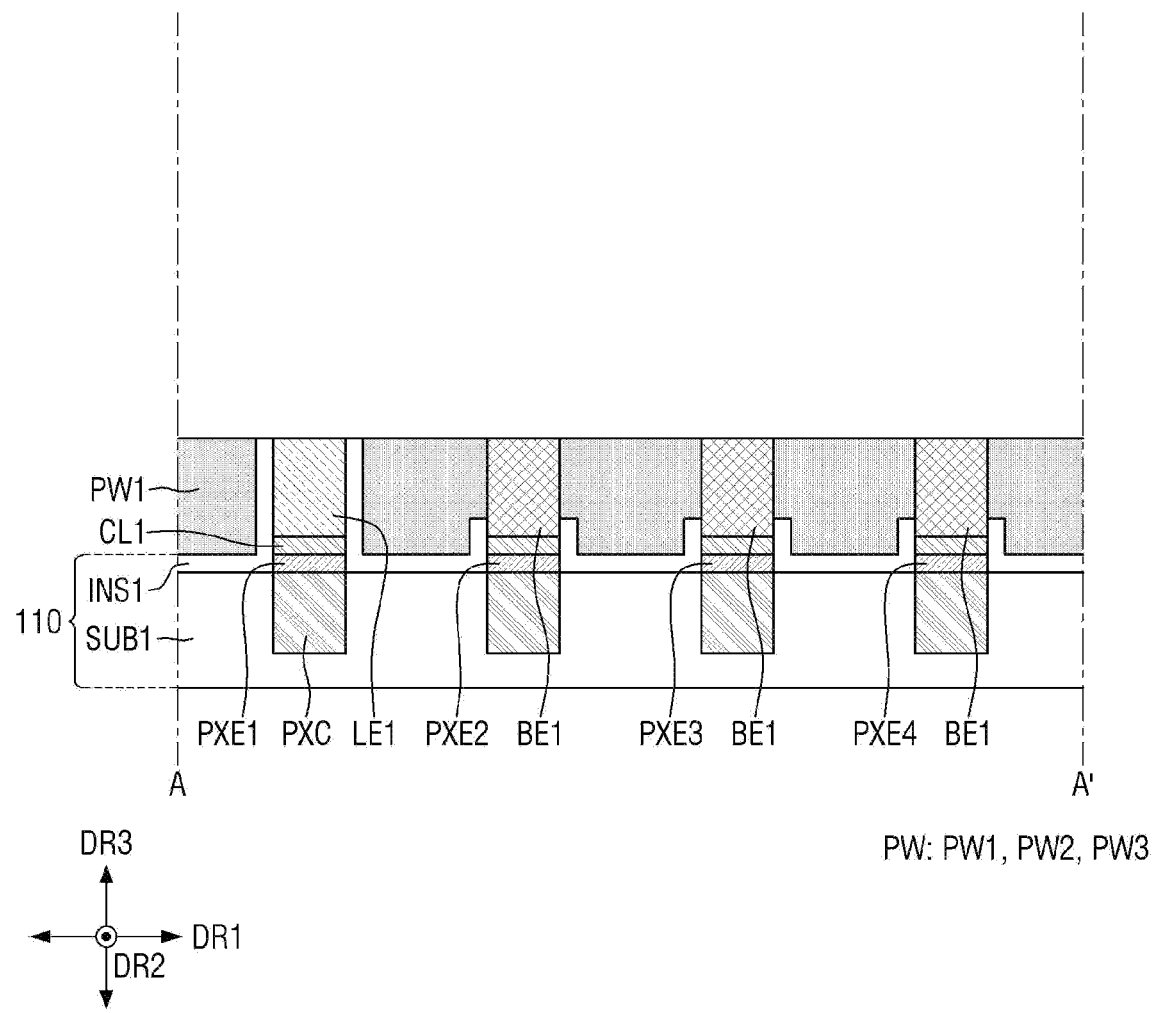

Seventh, referring to FIG. 40, a first connection electrode BE1 is formed in each of the first holes H1 (operation S2170 in FIG. 34A).

Because the first connection electrode BE1 fills each of the first holes H1, the upper surface of the first partition wall PW1, the upper surface of the first insulating layer INS1, the upper surfaces of the first light emitting elements LE1, and upper surfaces of the first connection electrodes BE1 may be connected to form a flat surface.

Figure 41:
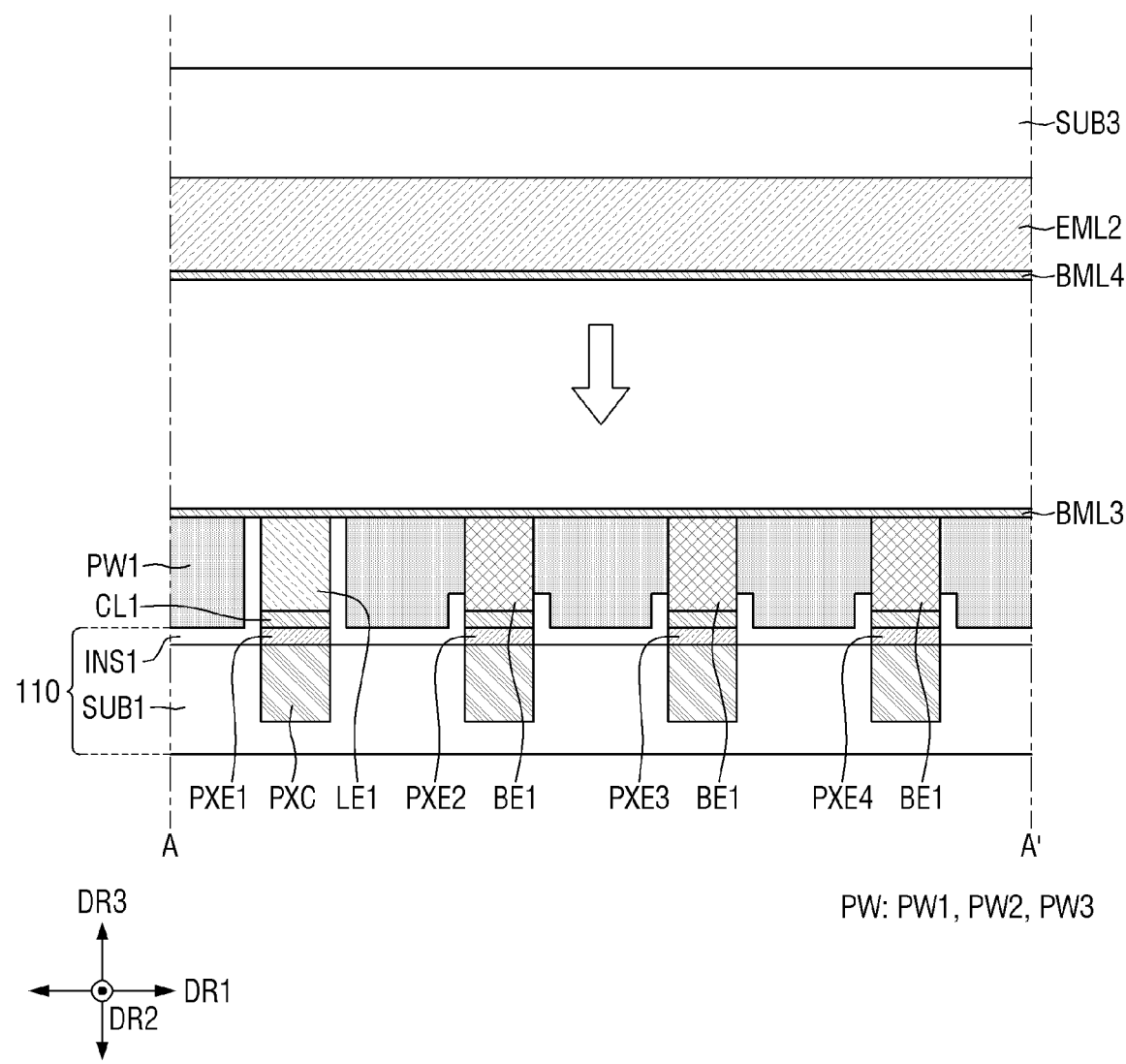

Eighth, referring to FIG. 41, a third bonding metal layer BML3 is formed on the first partition wall PW1, and the third bonding metal layer BML3 and a fourth bonding metal layer BML4 of a third substrate SUB3 are bonded together (operation S2180 in FIG. 34A).

The third bonding metal layer BML3 may be deposited on the upper surfaces of the first light emitting elements LE1, the first insulating layer INS1, the first connection electrodes BE1, and the first partition wall PW1. The third bonding metal layer BML3 may include gold (Au), copper (Cu), aluminum (Al), or tin (Sn).

Next, the fourth bonding metal layer BML4 is formed on a second light emitting element layer EML2 of the third substrate SUB3. The third substrate SUB3 may be a silicon substrate or a sapphire substrate. The second light emitting element layer EML2 may include a first semiconductor layer SEM1, an electron blocking layer EBL, a second active layer MQW2, a superlattice layer SLT, and a second semiconductor layer SEM2. Additionally, in the second light emitting element layer EML2, a semiconductor layer not doped with a dopant, that is, an undoped semiconductor layer, may be disposed on the third substrate SUB3 and the second semiconductor layer SEM2. The fourth bonding metal layer BML4 may include gold (Au), copper (Cu), aluminum (Al), or tin (Sn).

Next, the third bonding metal layer BML3 and the fourth bonding metal layer BML4 of the third substrate SUB3 are brought into contact with each other. Then, one bonding metal layer is formed by melt-bonding the third bonding metal layer BML3 and the fourth bonding metal layer BML4 at a reference temperature (e.g., a predetermined temperature).

Figure 42:
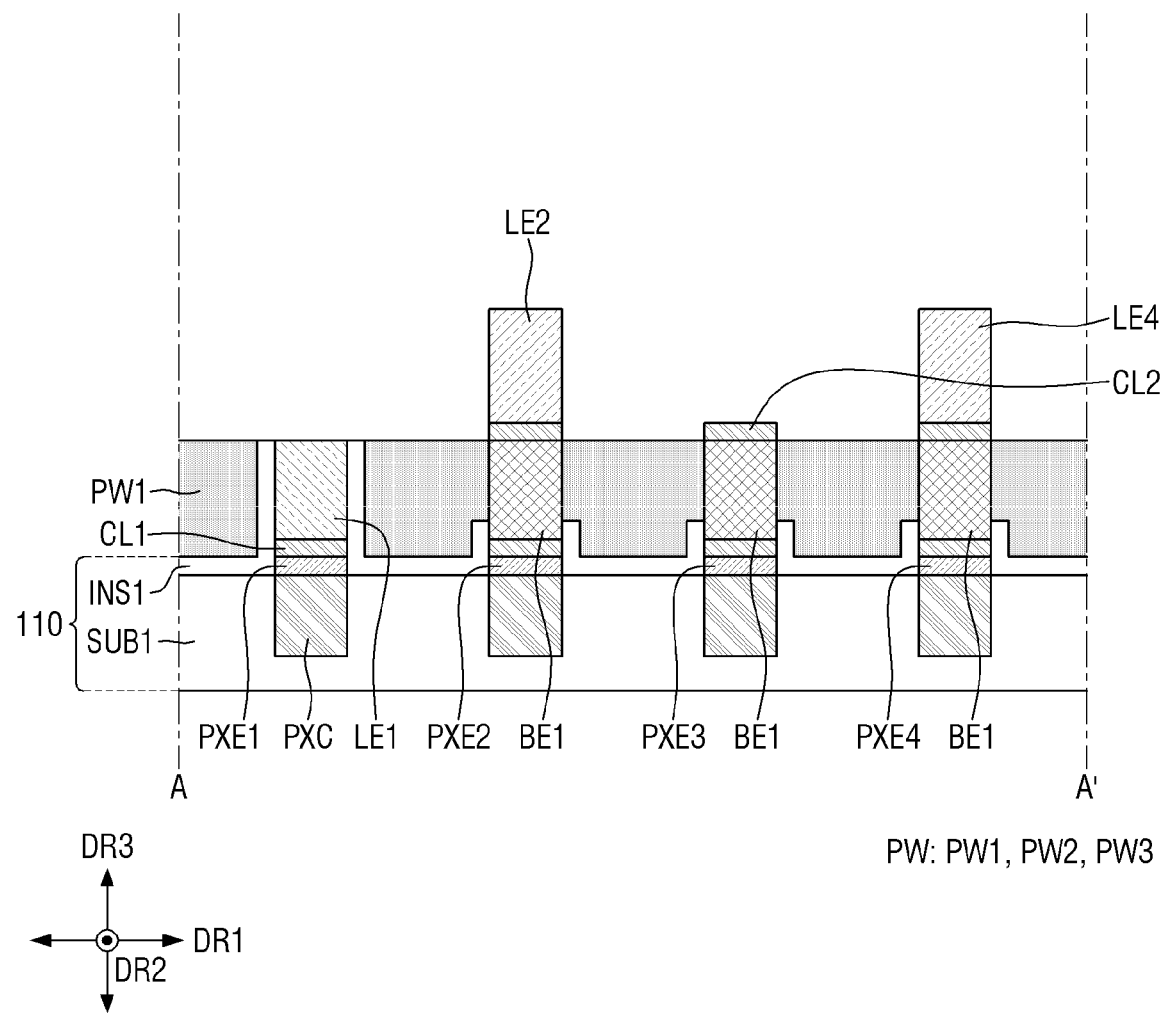

Ninth, referring to FIG. 42, the third substrate SUB3 is removed, and the second light emitting element layer EML2 is etched to form second conductive layers CL2 and second light emitting elements LE2 and fourth light emitting elements LE4 (operation S2190 in FIG. 34A).

The third substrate SUB3 may be removed by a polishing process, such as a CMP process or a laser lift off process. When the second light emitting element layer EML2 includes an undoped semiconductor layer, the undoped semiconductor layer may be removed by a polishing process, such as a CMP process.

Next, a third mask pattern may be formed on the second light emitting element layer EML2, and the second light emitting element layer EML2 may be etched according to the third mask pattern to form the second conductive layers CL2, the second light emitting elements LE2, and the fourth light emitting elements LE4.

Figure 43:
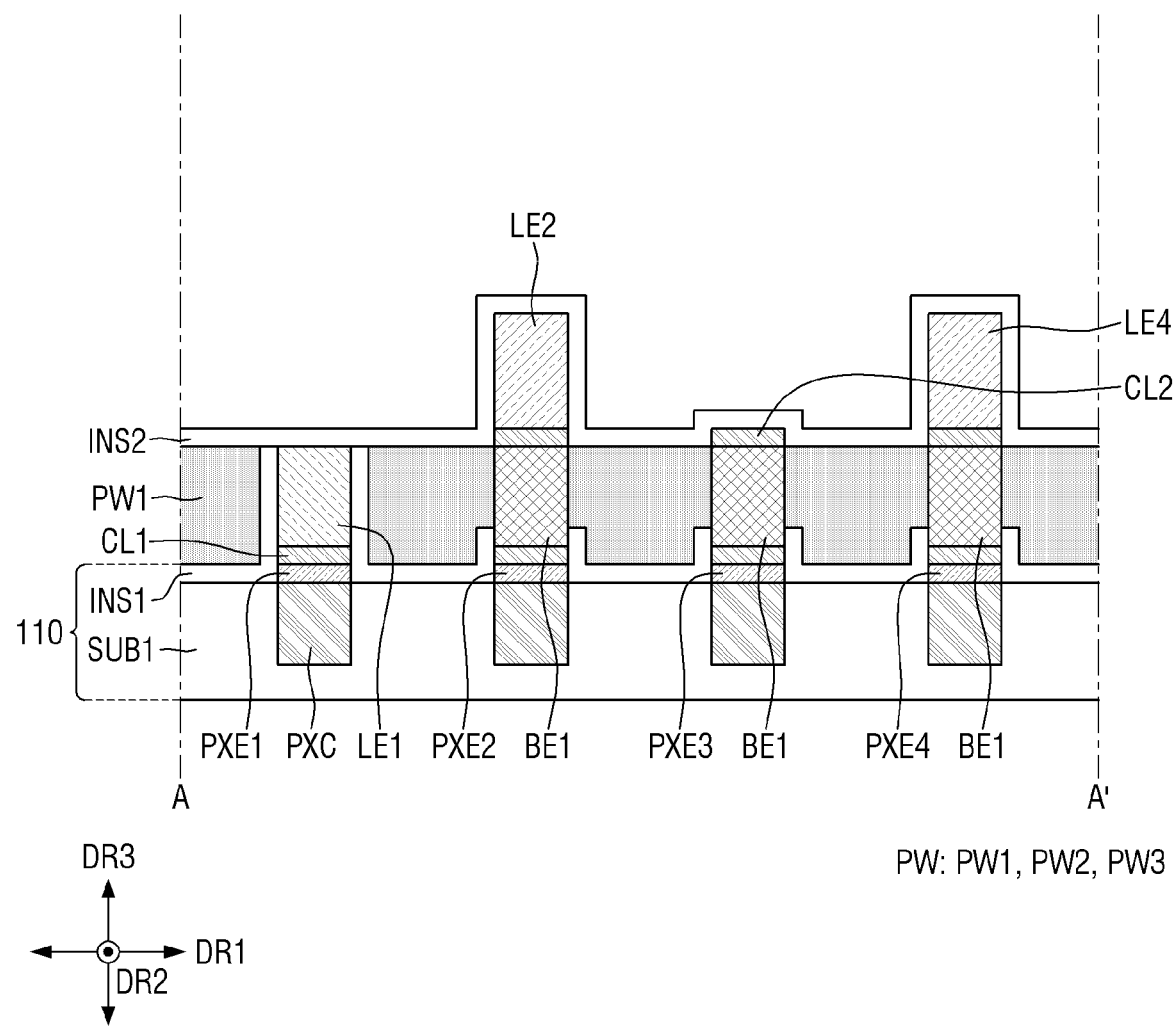

Tenth, referring to FIG. 43, a second insulating layer INS2 is formed (operation S2200 in FIG. 34A).

The second insulating layer INS2 may be formed by using a deposition method, such as chemical vapor deposition. The second insulating layer INS2 may be formed to cover the second light emitting elements LE2 and the fourth light emitting elements LE4. The second insulating layer INS2 may be disposed on side surfaces of each of the second conductive layers CL2 disposed under the second light emitting elements LE2 and the fourth light emitting elements LE4. The second insulating layer INS2 may cover the second conductive layers CL2 that are not covered by the second light emitting elements LE2 and the fourth light emitting elements LE4. The second insulating layer INS2 may be disposed on the first partition wall PW1.

Figure 44:
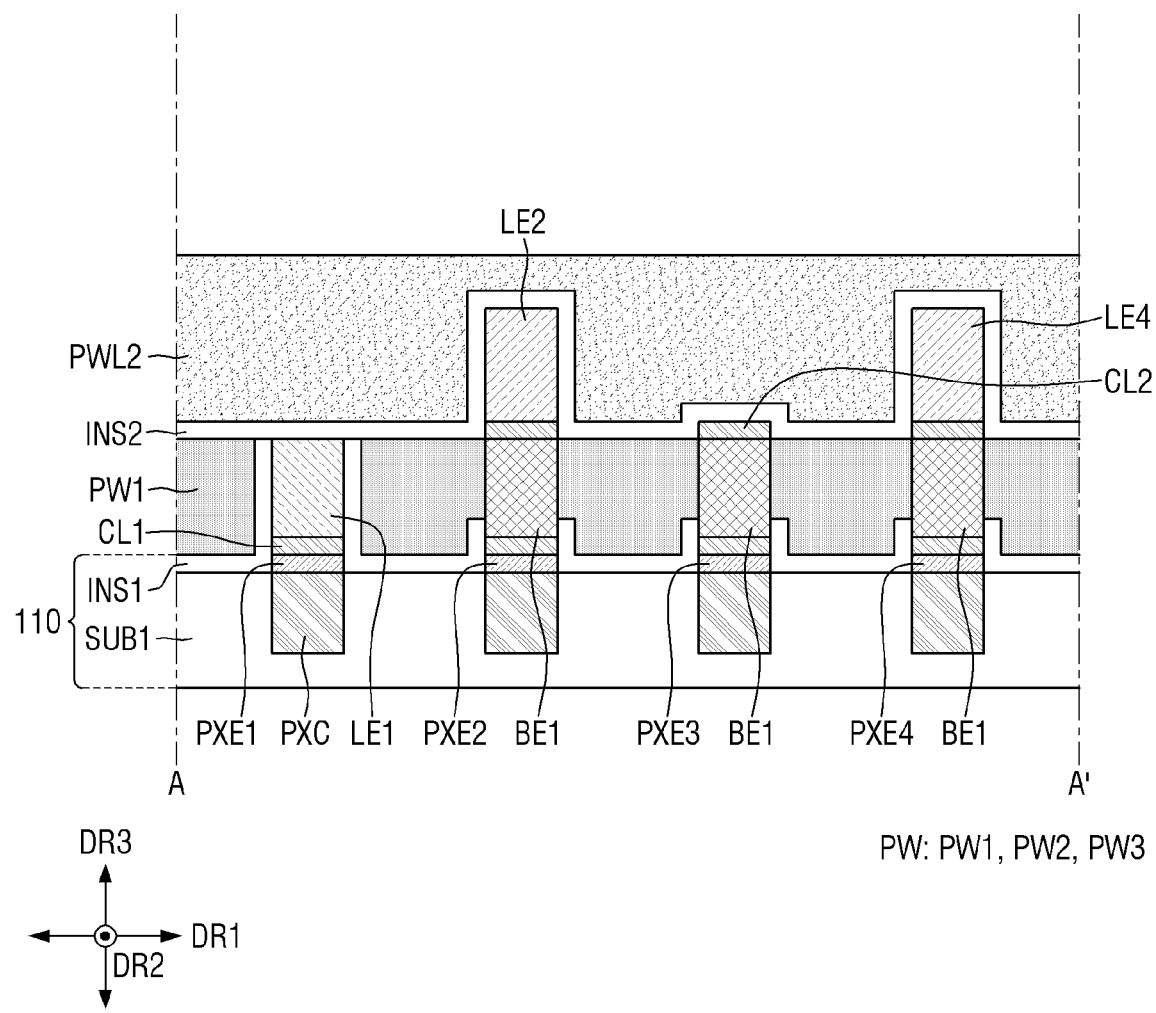

Eleventh, referring to FIG. 44, a second partition wall layer PWL2 is formed (operation S2210 in FIG. 34A).

The second partition wall layer PWL2 may be formed by electroplating (or electrolytic plating) or electroless plating. A thickness of the second partition wall layer PWL2 may be greater than a thickness of each of the second light emitting elements LE2 and the fourth light emitting elements LE4. For example, the second insulating layer INS2 disposed on an upper surface of each of the second light emitting elements LE2 and the fourth light emitting elements LE4 may be covered by the second partition wall layer PWL2.

The second partition wall layer PWL2 may be made of aluminum (Al). However, embodiments of the present disclosure are not limited thereto, and the second partition wall layer PWL2 may also be made of a material having conductivity, for example, an opaque metal material, such as molybdenum (Mo), chromium (Cr), gold (Au), titanium (Ti), nickel (Ni), neodymium (Nd), or copper (Cu).

Figure 45:
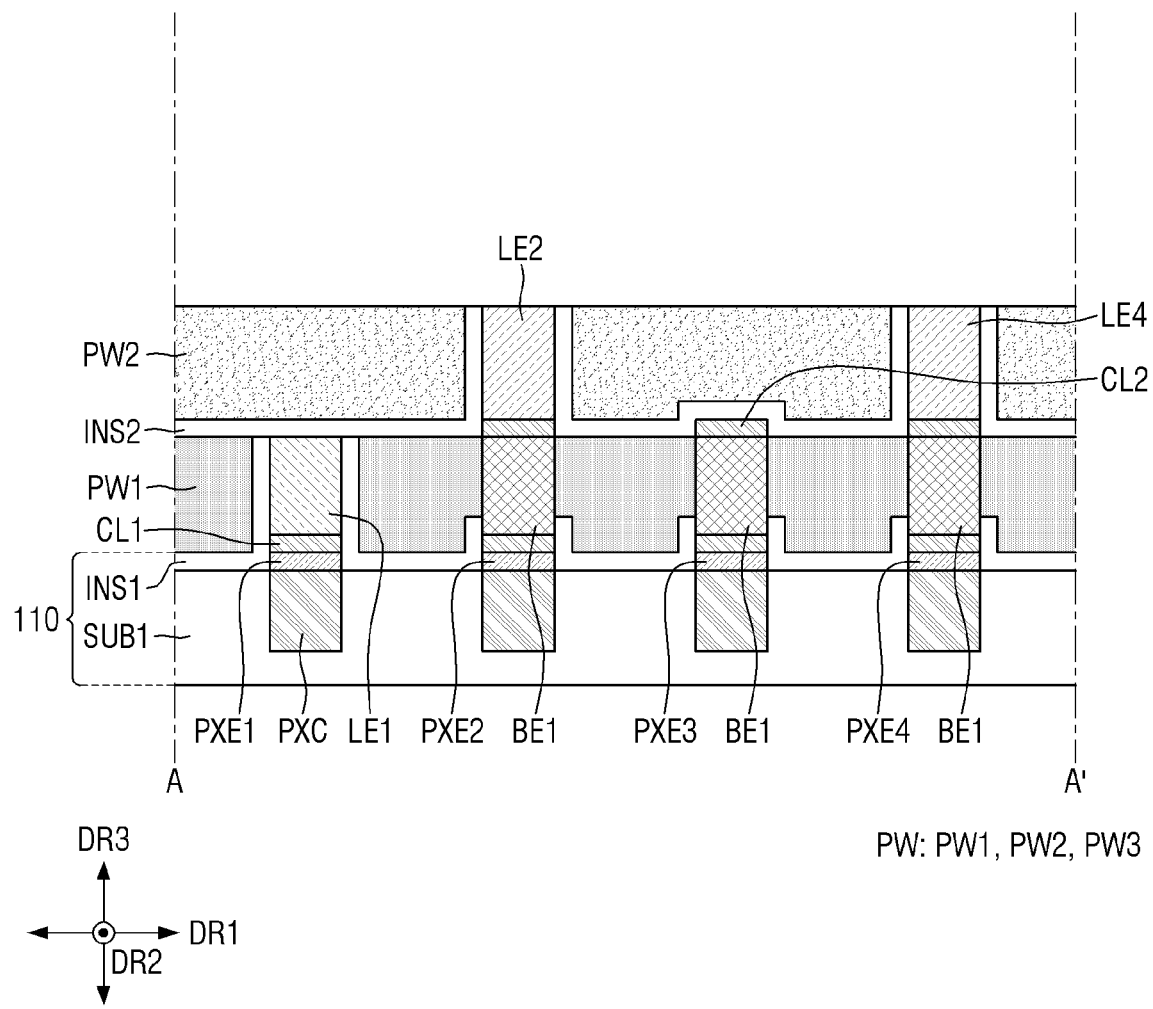

Twelfth, referring to FIG. 45, a second partition wall PW2 is formed by etching the second partition wall layer PWL2 to expose the upper surfaces of the second light emitting elements LE2 and the fourth light emitting elements LE4, and a second oxide layer is formed by oxidizing an upper surface of the second partition wall PW2 (operation S2220 in FIG. 34B).

The second partition wall PW2 may be formed by removing the second partition wall layer PWL2 by using a polishing process, such as a CMP process. Here, the upper surface of each of the second light emitting elements LE2 and the fourth light emitting elements LE4 may be exposed without being covered by the second partition wall PW2. Therefore, the upper surface of each of the second light emitting elements LE2 and the fourth light emitting elements LE4 and the upper surface of the second partition wall PW2 may be connected to form a flat surface.

In addition, the second oxide layer may be formed by injecting oxygen into the upper surface of the second partition wall PW2. For example, when the second partition wall PW2 is made of aluminum (Al), the second oxide layer may be an aluminum oxide (e.g., $Al_2O_3$) layer. The second oxide layer may be an electrically insulated insulating layer.

Figure 46:
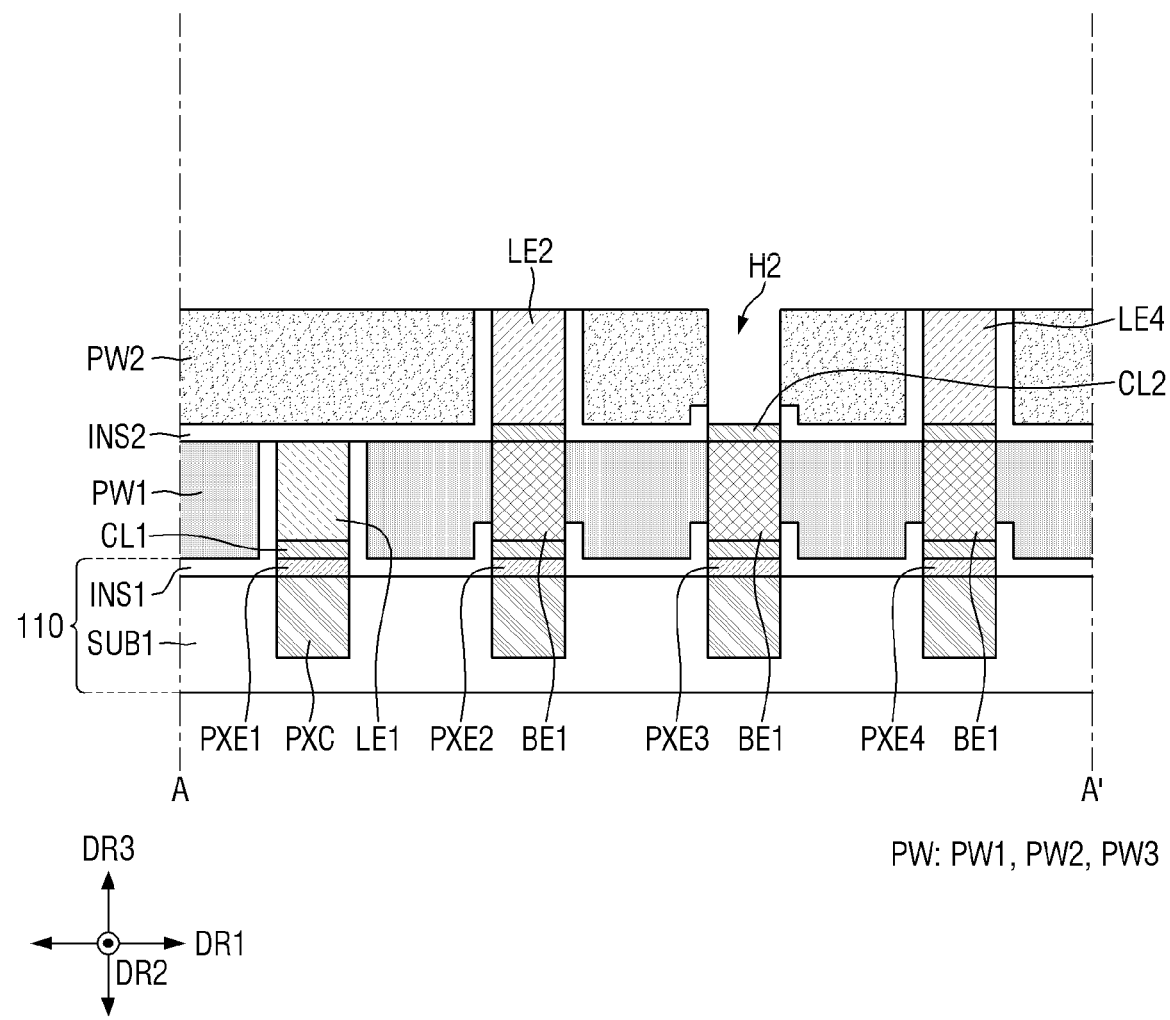

Thirteenth, referring to FIG. 46, second holes (e.g., second openings) H2 may be formed to penetrate the second partition wall PW2 to expose the second conductive layers CL2, respectively (operation S2230 in FIG. 34B).

A fifth mask pattern may be formed on the second partition wall PW2, and the second holes H2 may be formed by etching the second partition wall PW2 and the second insulating layer INS2 according to the fifth mask pattern. The second holes H2 may be formed to expose the second conductive layers CL2 not covered by the second light emitting elements LE2 and the fourth light emitting elements LE4. For example, the second holes H2 may be formed to expose the second conductive layers CL2 disposed on the third pixel electrodes PXE3.

Figure 47:
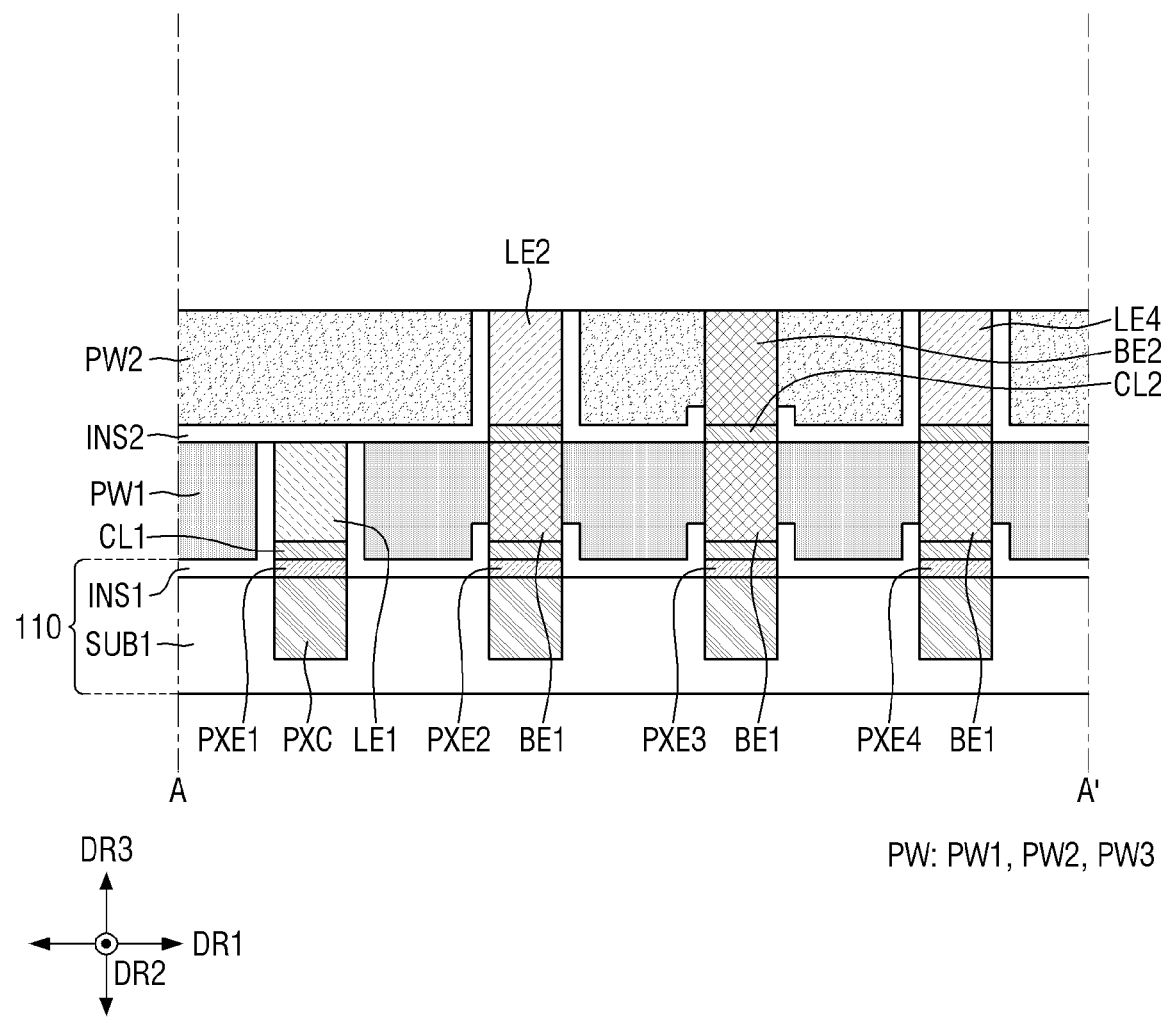

Fourteenth, referring to FIG. 47, a second connection electrode BE2 is formed in each of the second holes H2 (operation S2240 in FIG. 34B).

Because the second connection electrode BE2 fills each of the second holes H2, the upper surface of the second partition wall PW2, an upper surface of the second insulating layer INS2, the upper surfaces of the second light emitting elements LE2, the upper surfaces of the fourth light emitting elements LE4, and upper surfaces of the second connection electrodes BE2 may be connected to form a flat surface.

Figure 48:
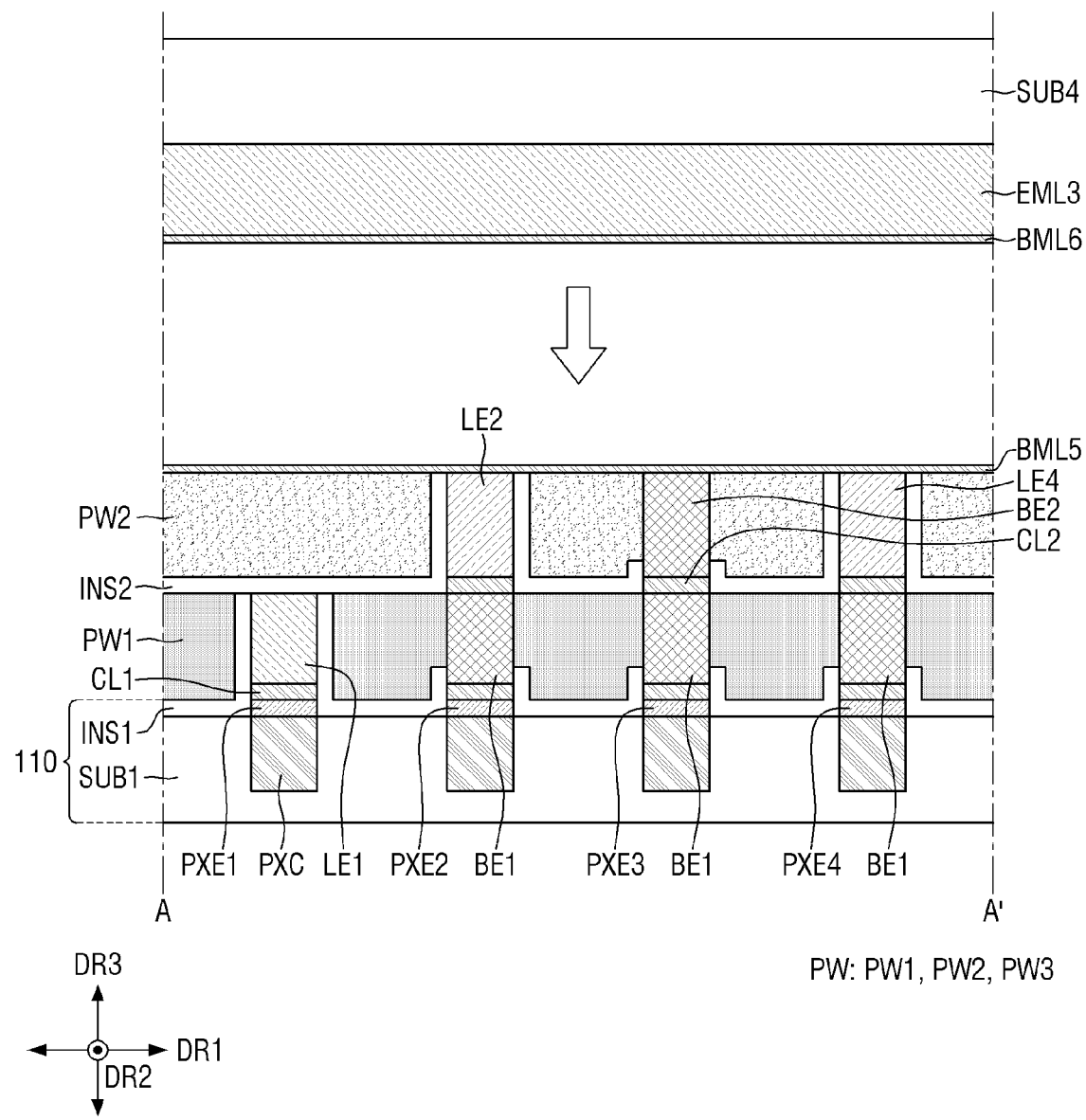

Fifteenth, referring to FIG. 48, a fifth bonding metal layer BML5 is formed on the second partition wall PW2, and the fifth bonding metal layer BML5 and a sixth bonding metal layer BML6 of a fourth substrate SUB4 are bonded together (operation S2250 in FIG. 34B).

The fifth bonding metal layer BML5 may be deposited on the upper surfaces of the second light emitting elements LE2, the fourth light emitting elements LE4, the second insulating layer INS2, the second connection electrodes BE2, and the second partition wall PW2. The fifth bonding metal layer BML5 may include gold (Au), copper (Cu), aluminum (Al), or tin (Sn).

Next, the sixth bonding metal layer BML6 is formed on a third light emitting element layer EML3 of the fourth substrate SUB4. The fourth substrate SUB4 may be a silicon substrate or a sapphire substrate. The third light emitting element layer EML3 may include a first semiconductor layer SEM1, an electron blocking layer EBL, a third active layer MQW3, a superlattice layer SLT, and a second semiconductor layer SEM2. Additionally, in the third light emitting element layer EML3, a semiconductor layer not doped with a dopant, that is, an undoped semiconductor layer, may be disposed on the fourth substrate SUB4 and the second semiconductor layer SEM2. The sixth bonding metal layer BML6 may include gold (Au), copper (Cu), aluminum (Al), or tin (Sn).

Next, the fifth bonding metal layer BML5 and the sixth bonding metal layer BML6 of the fourth substrate SUB4 are brought into contact with each other. Then, one bonding metal layer is formed by melt-bonding the fifth bonding metal layer BML5 and the sixth bonding metal layer BML6 at a reference temperature (e.g., a predetermined temperature).

Figure 49:
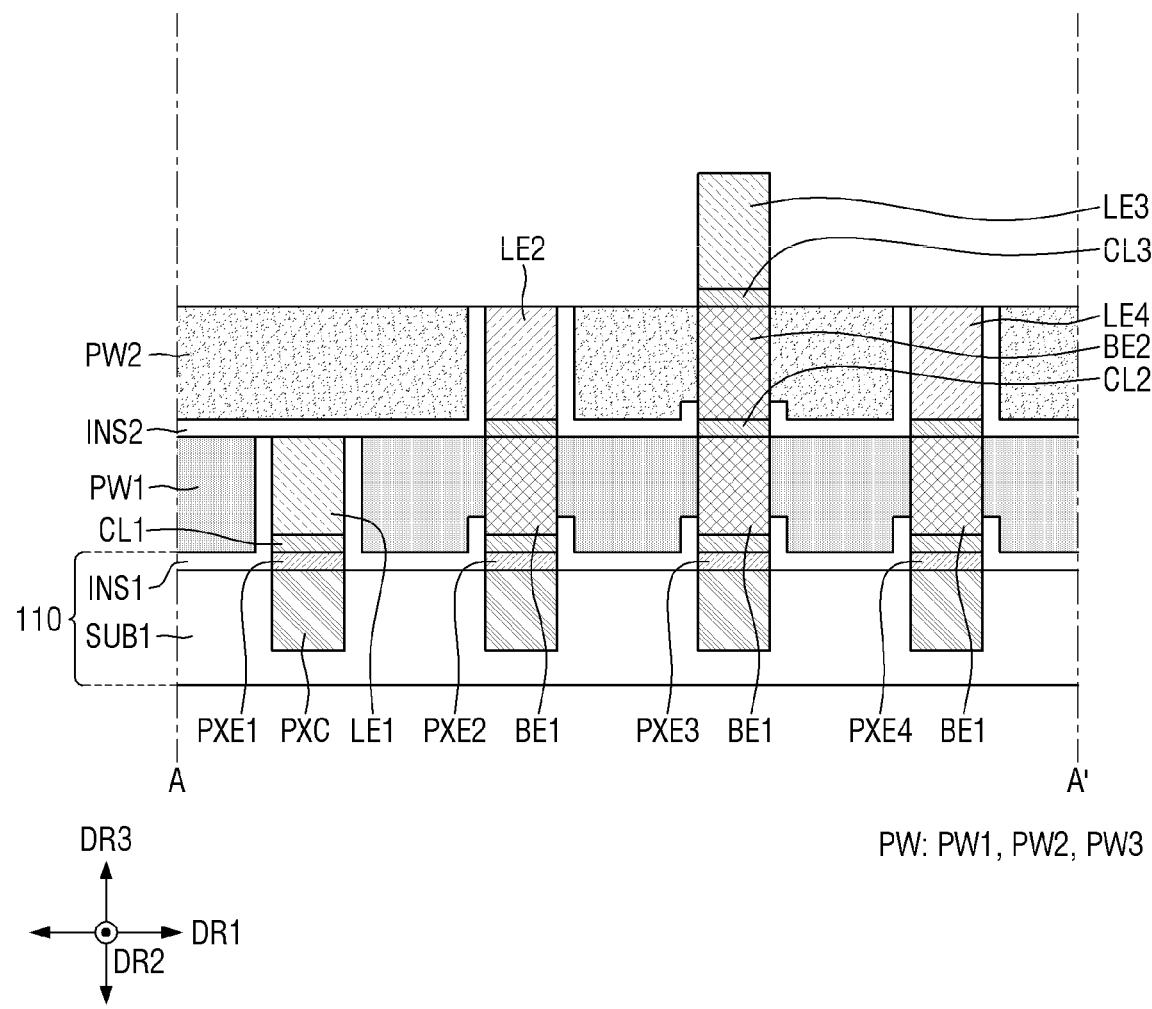

Sixteenth, referring to FIG. 49, the fourth substrate SUB4 is removed, and the third light emitting element layer EML3 is etched to form third conductive layers CL3 and third light emitting elements LE3 (operation S2260 in FIG. 34B).

The fourth substrate SUB4 may be removed by a polishing process, such as a CMP process or a laser lift off process. When the third light emitting element layer EML3 includes an undoped semiconductor layer, the undoped semiconductor layer may be removed by a polishing process, such as a CMP process.

Next, a sixth mask pattern may be formed on the third light emitting element layer EML3, and the third light emitting element layer EML3 may be etched according to the sixth mask pattern to form the third conductive layers CL3 and the third light emitting elements LE3.

Figure 50:
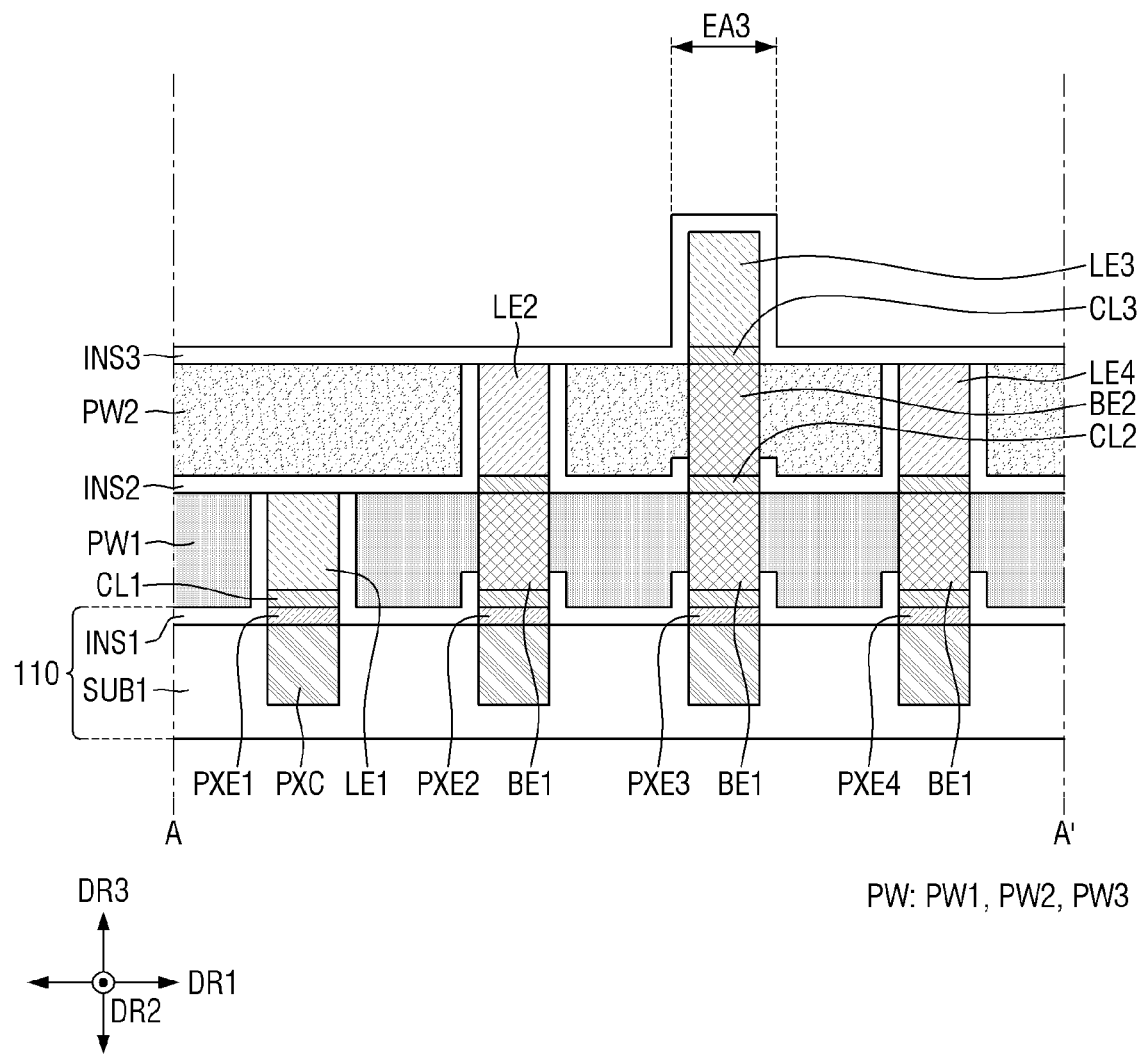

Seventeenth, referring to FIG. 50, a third insulating layer INS3 is formed (operation S2270 in FIG. 34B).

The third insulating layer INS3 may be formed by using a deposition method, such as chemical vapor deposition. The third insulating layer INS3 may be formed to cover the third light emitting elements LE3. The third insulating layer INS3 may be disposed on side surfaces of each of the third conductive layers CL3 disposed under the third light emitting elements LE3. The third insulating layer INS3 may be disposed on the second partition wall PW2.

Figure 51:
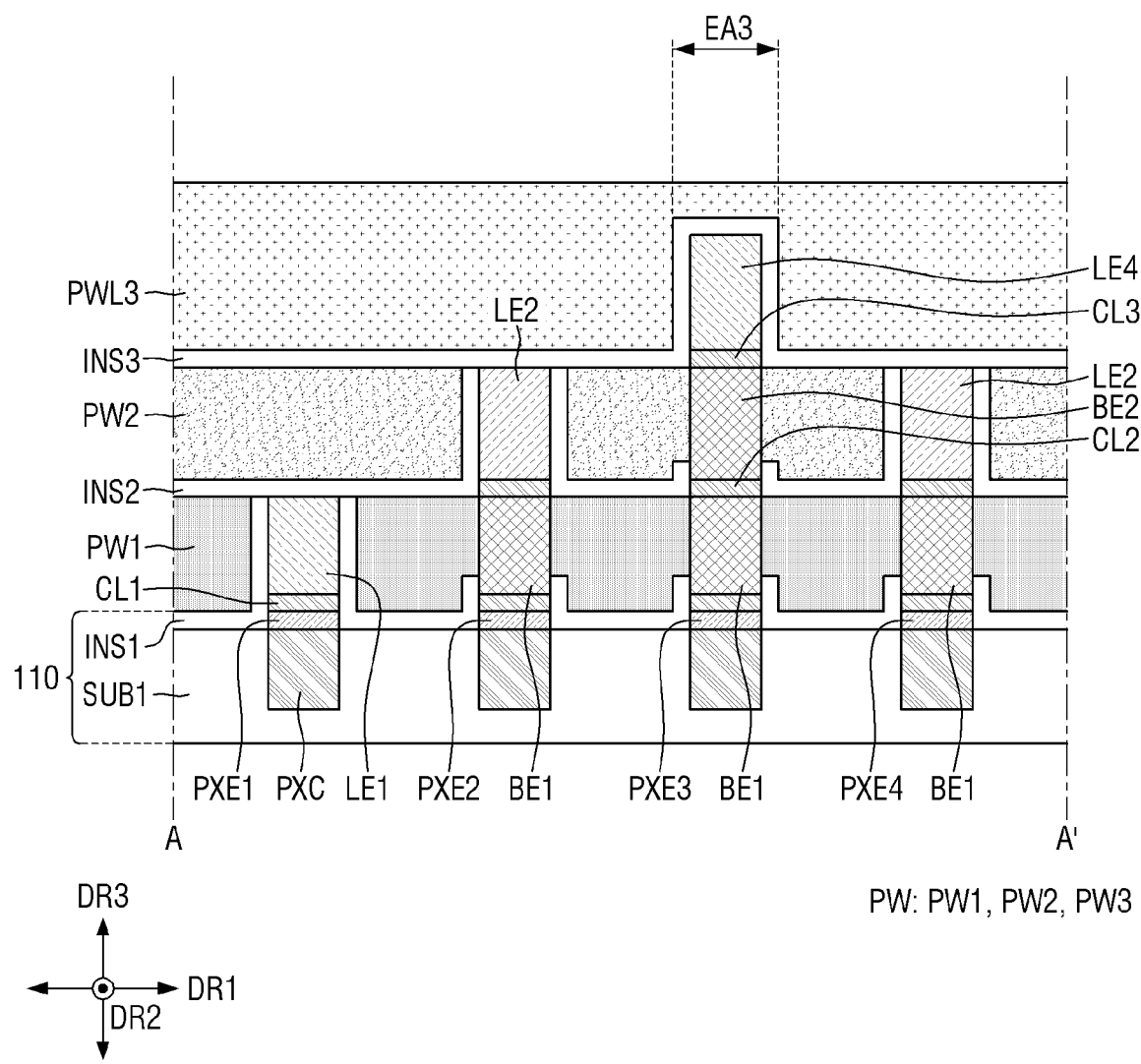

Eighteenth, referring to FIG. 51, a third partition wall layer PWL3 is formed (operation S2280 in FIG. 34B).

The third partition wall layer PWL3 may be formed by electroplating (or electrolytic plating) or electroless plating. A thickness of the third partition wall layer PWL3 may be greater than a thickness of each of the third light emitting elements LE3. For example, the third insulating layer INS3 disposed on an upper surface of each of the third light emitting elements LE3 may be covered by the third partition wall layer PWL3.

The third partition wall layer PWL3 may be made of aluminum (Al). However, embodiments of the present disclosure are not limited thereto, and the third partition wall layer PWL3 may also be made of a material having conductivity, for example, an opaque metal material, such as molybdenum (Mo), chromium (Cr), gold (Au), titanium (Ti), nickel (Ni), neodymium (Nd), or copper (Cu).

Figure 52:
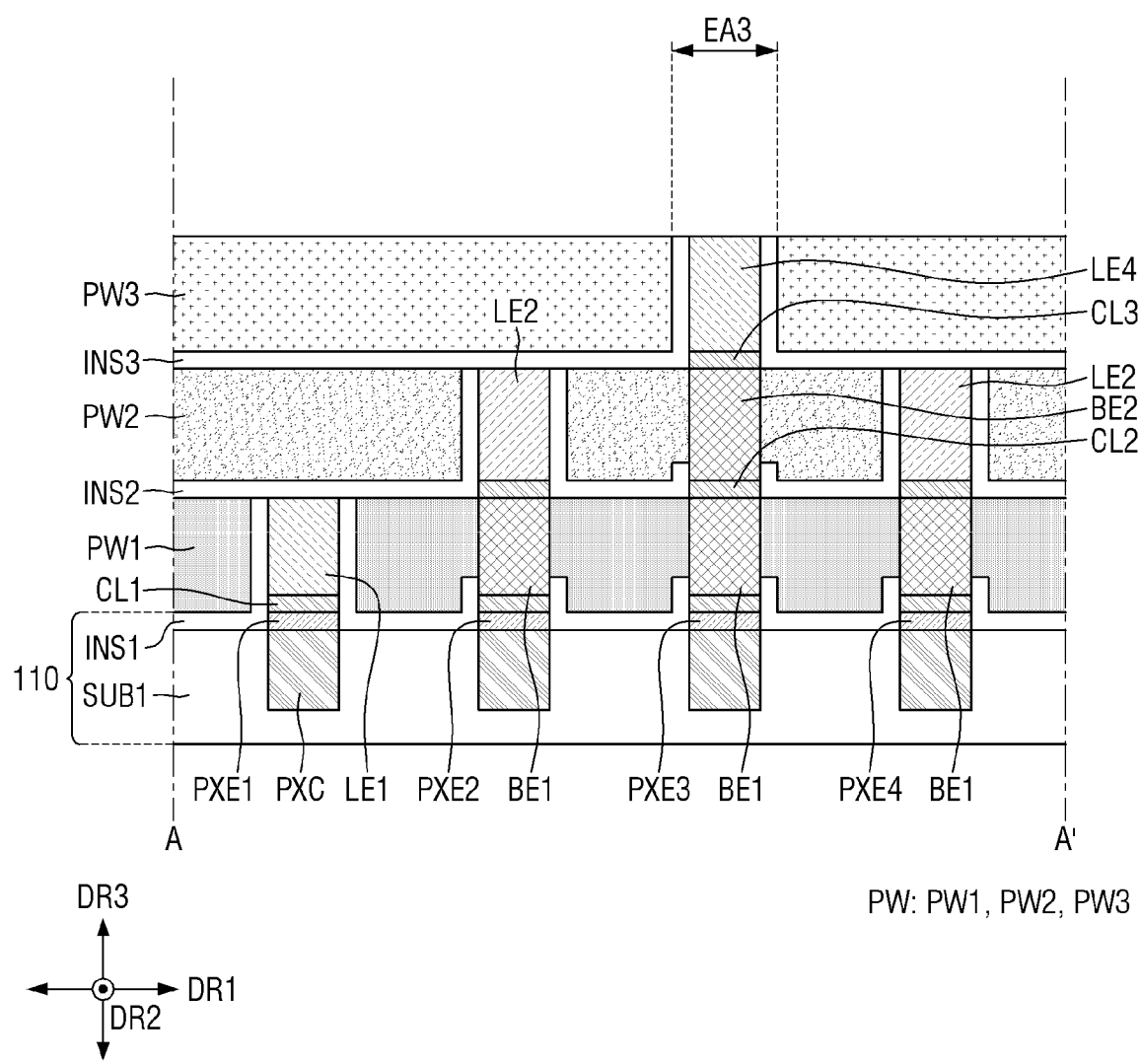

Nineteenth, referring to FIG. 52, a third partition wall PW3 is formed by etching the third partition wall layer PWL3 to expose the upper surface of each of the third light emitting elements LE3, and a third oxide layer is formed by oxidizing an upper surface of the third partition wall PW3 (operation S2290 in FIG. 34B).

The third partition wall PW3 may be formed by removing the third partition wall layer PWL3 by using a polishing process, such as a CMP process. Here, the upper surface of each of the third light emitting elements LE3 may be exposed without being covered by the third partition wall PW3. Therefore, the upper surface of each of the third light emitting elements LE3 and the upper surface of the third partition wall PW3 may be connected to form a flat surface.

In addition, the third oxide layer may be formed by injecting oxygen into the upper surface of the third partition wall PW3. For example, when the third partition wall PW3 is made of aluminum (Al), the third oxide layer may be an aluminum oxide (e.g., $Al_2O_3$) layer. The third oxide layer may be an electrically insulated insulating layer.

Figure 53:
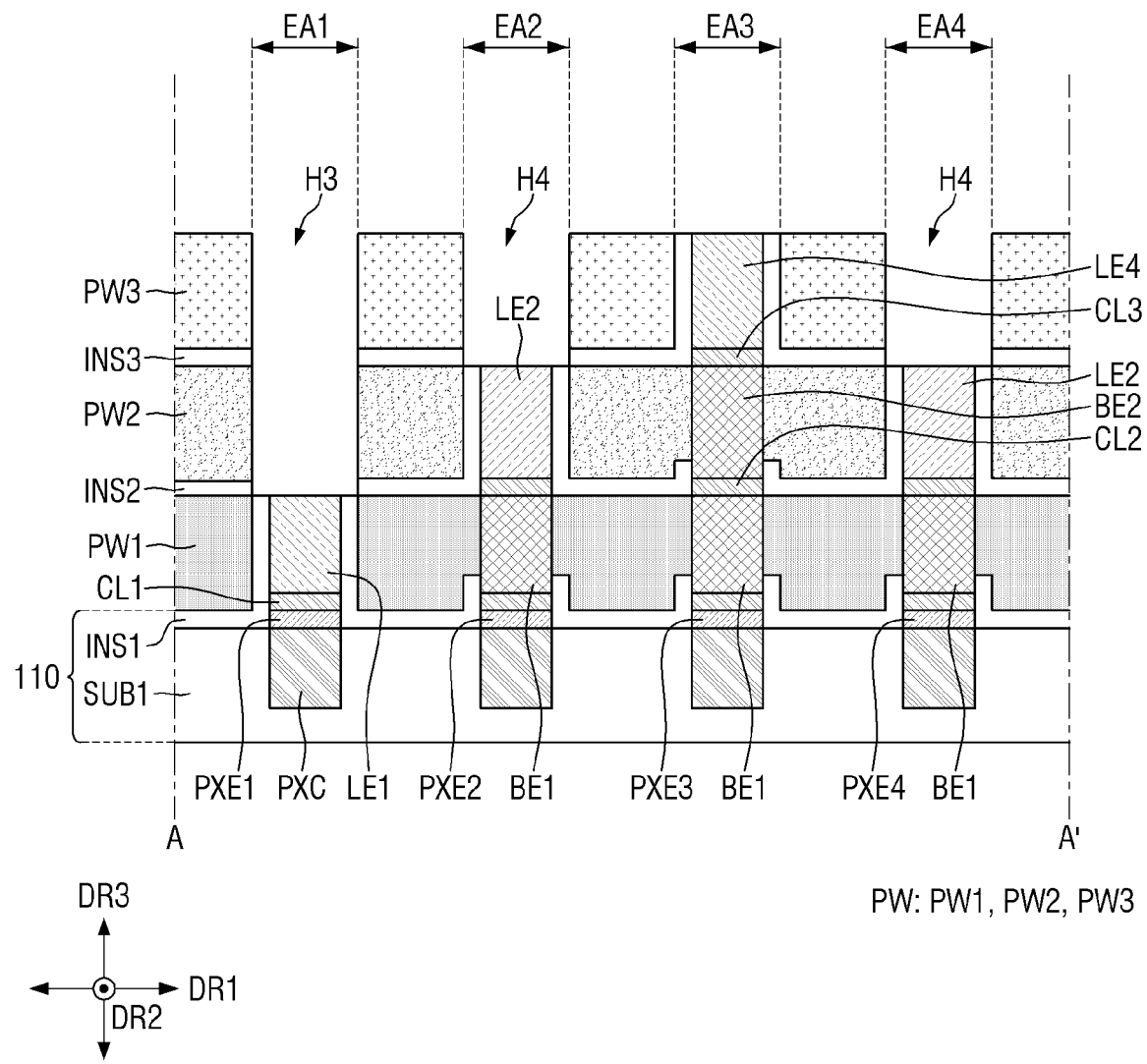

Twentieth, referring to FIG. 53, third holes (e.g., third openings) H3 may be formed to penetrate the second partition wall PW2, the second insulating layer INS2, the third partition wall PW3, and the third insulating layer INS3 to respectively expose the first light emitting elements LE1, and fourth holes (e.g., fourth openings) H4 may be formed to penetrate the third partition wall PW3 and the third insulating layer INS3 to respectively expose the second light emitting elements LE2 (operation S2300 in FIG. 34B).

In the third holes H3, the upper surfaces of the first light emitting elements LE1, side surfaces of the second insulating layer INS2, side surfaces of the second partition wall PW2, side surfaces of the third insulating layer INS3, and side surfaces of the third partition wall PW3 may be exposed. In the fourth holes H4, the upper surfaces of the second light emitting elements LE2, the side surfaces of the third insulating layer INS3, and the side surfaces of the third partition wall PW3 may be exposed.

Figure 54:
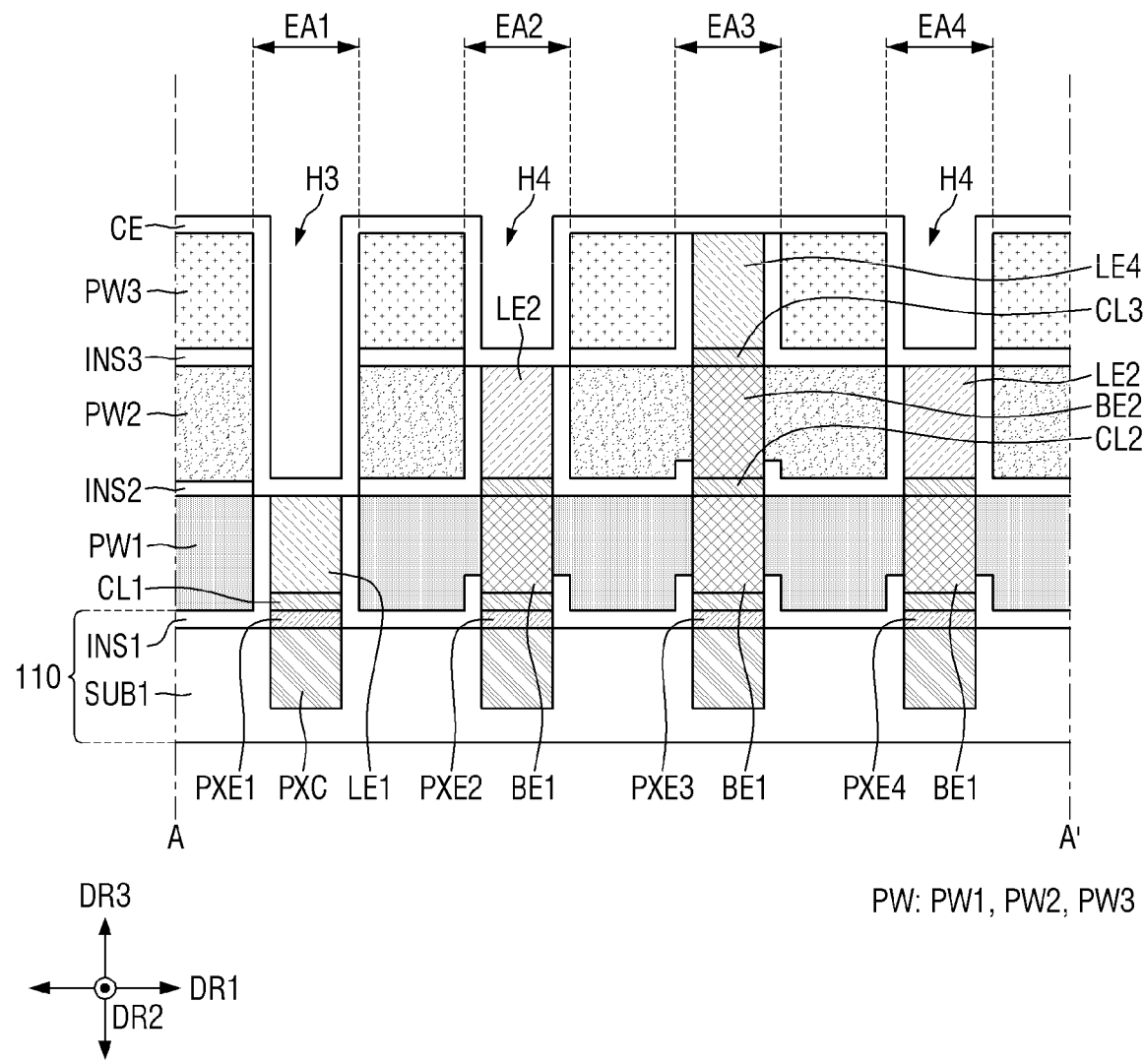

Twenty-first, referring to FIG. 54, a common electrode CE is formed (operation S2310 in FIG. 34B).

The common electrode CE may be formed on the third partition wall PW3 by using a deposition method, such as a sputtering method or an atomic layer deposition method. The common electrode CE may be connected to the upper surfaces of the first light emitting elements LE1 through the third holes H3. The common electrode CE may be disposed on the upper surfaces of the first light emitting elements LE1, the side surfaces of the second insulating layer INS2, the side surfaces of the second partition wall PW2, the side surfaces of the third insulating layer INS3, and the side surfaces of the third partition wall PW3 exposed through the third holes H3.

The common electrode CE may include a transparent conductive material. For example, the common electrode CE may include a transparent conductive oxide (TCO), such as indium tin oxide (ITO) or indium zinc oxide (IZO).

Figure 55:
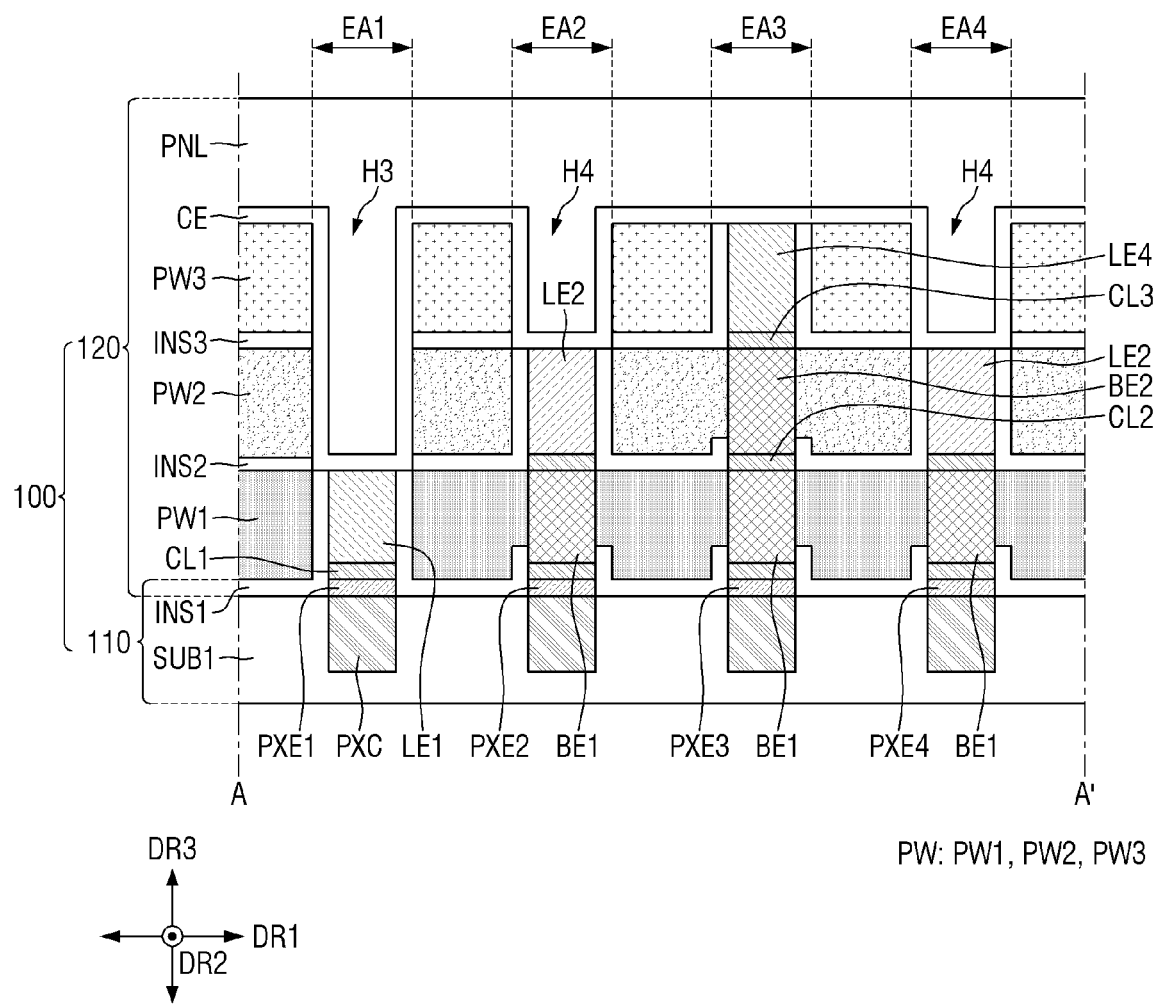

Twenty-second, referring to FIG. 55, a planarization layer PNL is formed (operation S2320 in FIG. 34B).

The planarization layer PNL may be disposed on the common electrode CE. The planarization layer PNL may fill the third holes H3 and the fourth holes H4. The planarization layer PNL may be formed of an organic layer, such as acryl resin, epoxy resin, phenolic resin, polyamide resin, or polyimide resin.

As illustrated in FIGS. 34A, 34B, and 35 through 55, each of a plurality of pixels PX includes the first light emitting element LE1 for emitting first light, the second light emitting element LE2 for emitting second light, and the third light emitting element LE3 for emitting third light, and the fourth light emitting element LE4 for emitting the second light. Therefore, each of the pixels PX can display various colors without a wavelength conversion layer. That is, because the wavelength conversion layer can be omitted, a fabrication process can be simplified.

In addition, the first light emitting elements LE1 for emitting the first light are formed by bonding the first light emitting element layer EML1 and then etching the first light emitting element layer EML1. The second light emitting elements LE2 and the fourth light emitting elements LE4 for emitting the second light are formed by bonding the second light emitting element layer EML2 and then etching the second light emitting element layer EML2. The third light emitting elements LE3 for emitting the third light are formed by bonding the third light emitting element layer EML3 and then etching the third light emitting element layer EML3. Therefore, the first light emitting elements LE1, the second light emitting elements LE2, the third light emitting elements LE3, and the fourth light emitting elements LE4 do not need to be separately aligned and bonded.

Figure 56:
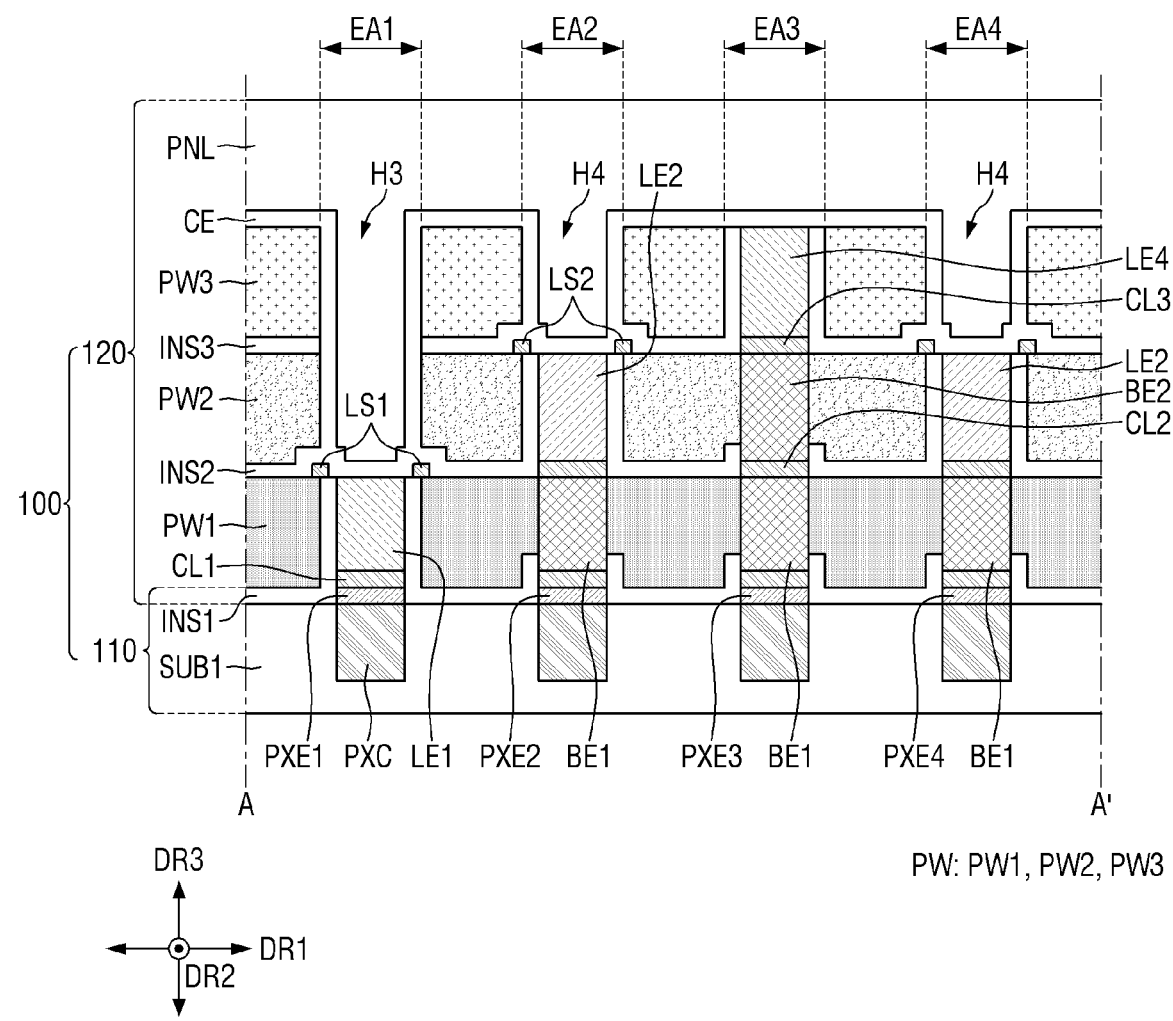
FIG. 56 is a cross-sectional view of the display panel taken along the line A-A' of FIG. 3 according to another embodiment.

FIG. 56 is a cross-sectional view of the display panel 100 taken along the line A-A' of FIG. 3 according to another embodiment.

The embodiment shown in FIG. 56 is different from the embodiment shown in FIG. 32 in that a first light blocking layer LS1 and a second light blocking layer LS2 are added.

In FIG. 56, any description overlapping that of the embodiment described with reference to FIG. 32 will be omitted.

Referring to FIG. 56, the first light blocking layer LS1 may be disposed on a first partition wall PW1. Although the first light blocking layer LS1 is disposed on a first insulating layer INS1 and contacts a common electrode CE, embodiments of the present disclosure are not limited thereto. The first light blocking layer LS1 may not overlap the first insulating layer INS1 in the third direction DR3 and may not contact the common electrode CE.

The first light blocking layer LS1 may be disposed between the first partition wall PW1 and a second partition wall PW2. Therefore, the first light blocking layer LS1 may prevent first light emitted from a first light emitting element LE1 from travelling to a second light emitting area EA2, a third light emitting area EA3, and a fourth light emitting area EA4 through a second insulating layer INS2 between the first partition wall PW1 and the second partition wall PW2.

The second light blocking layer LS2 may be disposed on the second partition wall PW2. Although the second light blocking layer LS2 is disposed on the second insulating layer INS2 and contacts the common electrode CE, embodiments of the present disclosure are not limited thereto. The second light blocking layer LS2 may not overlap the second insulating layer INS2 in the third direction DR3 and may not contact the common electrode CE.

The second light blocking layer LS2 may be disposed between the second partition wall PW2 and a third partition wall PW3. Therefore, the second light blocking layer LS2 may prevent second light emitted from a second light emitting element LE2 from travelling to the third light emitting area EA3 through the third insulating layer INS3 between the second partition wall PW2 and the third partition wall PW3. In addition, the second light blocking layer LS2 may prevent the second light emitted from a fourth light emitting element LE4 from travelling to the third light emitting area EA3 through the third insulating layer INS3 between the second partition wall PW2 and the third partition wall PW3.

The first light blocking layer LS1 and the second light blocking layer LS2 may include an opaque conductive material that does not transmit light. For example, the first light blocking layer LS1 may be made of the same material as a second conductive layer CL2, and the second light blocking layer LS2 may be made of the same material as a third conductive layer CL3. For example, the first light blocking layer LS1 and the second light blocking layer LS2 may include at least any one of gold (Au), copper (Cu), aluminum (Al), and tin (Sn). In some embodiments, the first light blocking layer LS1 and the second light blocking layer LS2 may include a first layer including any one of gold (Au), copper (Cu), aluminum (Al) and tin (Sn) and a second layer including another one of gold (Au), copper (Cu), aluminum (Al) and tin (Sn). In such an embodiment, the second layer may be disposed on the first layer.

Figure 57:
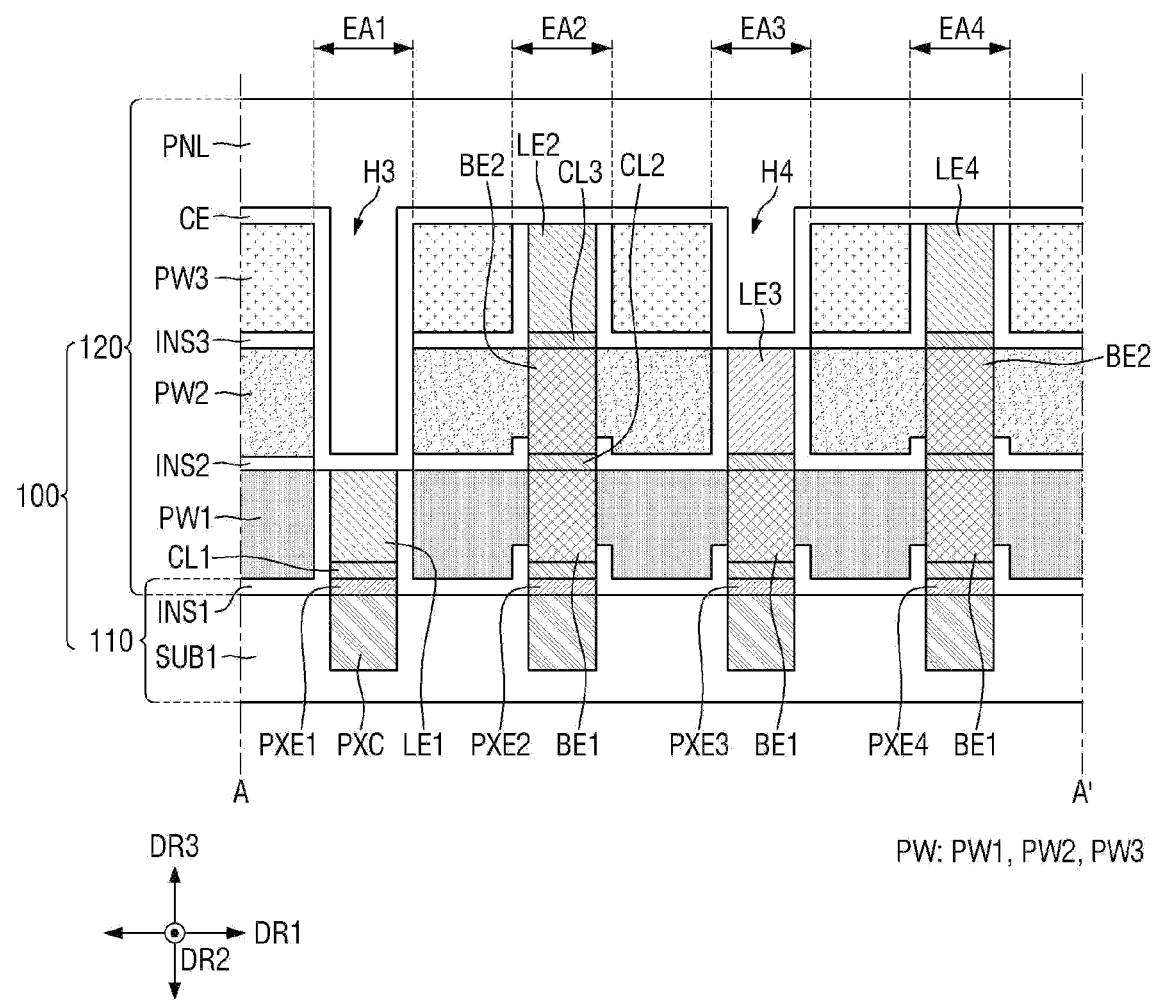
FIG. 57 is a cross-sectional view of the display panel taken along the line A-A' of FIG. 3 according to another embodiment.

FIG. 57 is a cross-sectional view of the display panel 100 taken along the line A-A' of FIG. 3 according to another embodiment.

The embodiment shown in FIG. 57 differs from the embodiment shown in FIG. 32 in that a second light emitting element LE2 and a fourth light emitting element LE4 are surrounded by a third partition wall PW3, and a third light emitting element LE3 is surrounded by a second partition wall PW2. In FIG. 57, any description overlapping that of the embodiment described with reference to FIG. 32 will be omitted.

Referring to FIG. 57, the second light emitting element LE2 may be disposed on a third conductive layer CL3 in a second light emitting area EA2. The third light emitting element LE3 may be disposed on a second conductive layer CL2 in a third light emitting area EA3. The fourth light emitting element LE4 may be disposed on the third conductive layer CL3 in a fourth light emitting area EA4.

For example, a minimum distance between the second light emitting element LE2 and a first substrate SUB1 and a minimum distance between the fourth light emitting element LE4 and the first substrate SUB1 may be greater than a minimum distance between the third light emitting element LE3 and the first substrate SUB1. The minimum distance between the third light emitting element LE3 and the first substrate SUB1 may be greater than a minimum distance between a first light emitting element LE1 and the first substrate SUB1.

The placement positions of the first light emitting element LE1, the second light emitting element LE2, the third light emitting element LE3, and the fourth light emitting element LE4 are not limited to those illustrated in FIGS. 32 and 57. For example, in FIGS. 32 and 57, the first light emitting element LE1 for emitting first light is disposed closer to the first substrate SUB1 than the second light emitting element LE2, the third light emitting element LE3 and the fourth light emitting element LE4, but embodiments of the present disclosure are not limited thereto. For example, the minimum distance between the first light emitting element LE1 and the first substrate SUB1, the minimum distance between the second light emitting element LE2 and the first substrate SUB1, the minimum distance between the third light emitting element LE3 and the first substrate SUB1, and the minimum distance between the fourth light emitting element LE4 and the first substrate SUB1 may be determined by the luminous efficiency of the first light emitting element LE1, the luminous efficiency of the second light emitting element LE2, the luminous efficiency of the third light emitting element LE3, and the luminous efficiency of the fourth light emitting element LE4. The light emitting element LE1/LE2/LE3/LE4 may be disposed closer to the first substrate SUB1 as its luminous efficiency is higher and may be disposed farther from the first substrate SUB1 as its luminous efficiency is lower.

Figure 58:
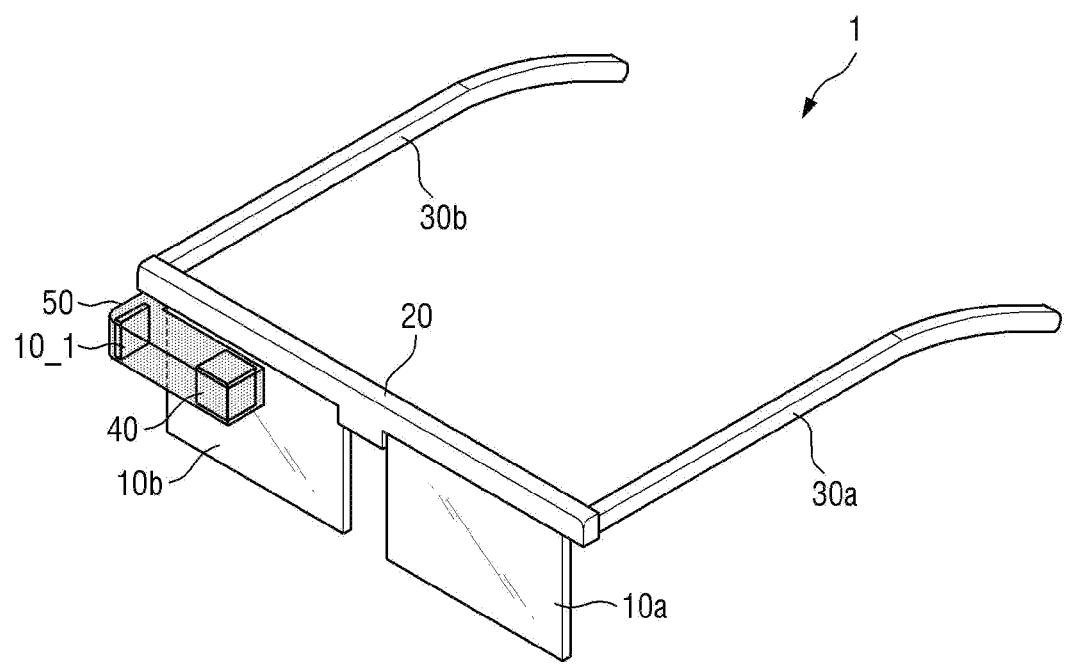
FIG. 58 shows a virtual reality (VR) device including a display device according to an embodiment.

FIG. 58 is an example view of a virtual reality (VR) device including a display device according to an embodiment. FIG. 58 illustrates a VR device 1 to which a display device 10_1 according to an embodiment has been applied.

Referring to FIG. 58, the VR device 1 according to an embodiment may be a device in the form of glasses. The VR device 1 according to the embodiment may include the display device 10_1, a left lens 10a, a right lens 10b, a support frame 20, eyeglass frame legs 30a and 30b, a reflective member 40, and a display device accommodating unit 50.

In FIG. 58, the VR device 1 including the eyeglass frame legs 30a and 30b is illustrated as an example. However, the VR device 1 according to the embodiment may also be applied to a head-mounted display including a head-mounted band, which can be mounted on a user's head, instead of the eyeglass frame legs 30a and 30b. The VR device 1 according to the embodiment is not limited to the structure illustrated in FIG. 58 and can be applied in various forms to various other electronic devices.

The display device accommodating unit 50 may include the display device 10_1 and the reflective member 40. An image displayed on the display device 10_1 may be reflected by the reflective member 40 and provided to a user's right eye through the right lens 10*b*. Accordingly, the user may view a VR image displayed on the display device 10_1 through the right eye.

Although the display device accommodating unit 50 is disposed at a right end of the support frame 20 in FIG. 58, embodiments of the present disclosure are not limited thereto. For example, the display device accommodating unit 50 may also be disposed at a left end of the support frame 20. In such an embodiment, an image displayed on the display device 10_1 may be reflected by the reflective member 40 and provided to the user's left eye through the left lens 10*a*. Accordingly, the user may view a VR image displayed on the display device 10_1 through the left eye. In other embodiments, the display device accommodating unit 50 may be disposed at both the right end and the left end of the support frame 20. In such an embodiment, the user may view a VR image displayed on the display device 10_1 through both the left eye and the right eye.

Figure 59:
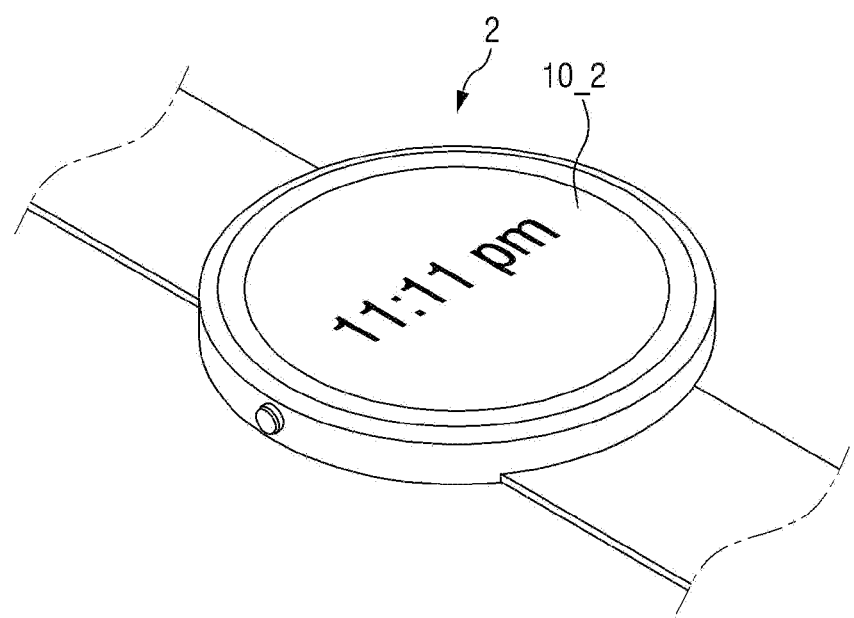
FIG. 59 shows a smart device including a display device according to an embodiment.

FIG. 59 is an example view of a smart device including a display device according to an embodiment.

Referring to FIG. 59, a display device 10_2 according to an embodiment may be applied to a smart watch 2 as an examples of a smart device.

Figure 60:
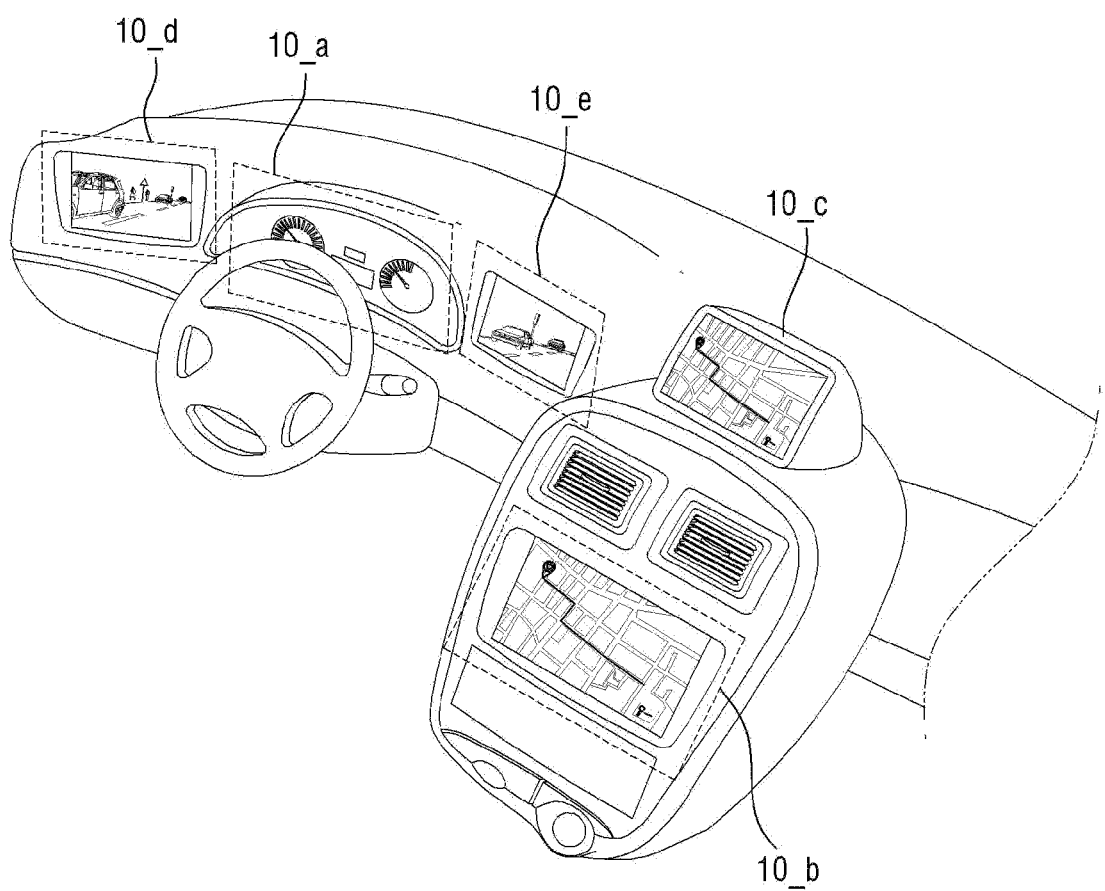
FIG. 60 shows a vehicle dashboard and a center fascia including a display device according to an embodiment.

FIG. 60 is an example view illustrating a vehicle dashboard and a center fascia including a display device according to an embodiment. FIG. 60 illustrates a vehicle to which display devices 10_*a* through 10_*e* according to an embodiment have been applied.

Referring to FIG. 60, display devices 10_*a* through 10_*c* according to an embodiment may be applied to a dashboard of a vehicle, a center fascia of the vehicle, or a center information display (CID) disposed on the dashboard of the vehicle. In addition, display devices 10_*d* and 10_*e* according to an embodiment may be applied to interior mirror displays that replace side mirrors of the vehicle.

Figure 61:
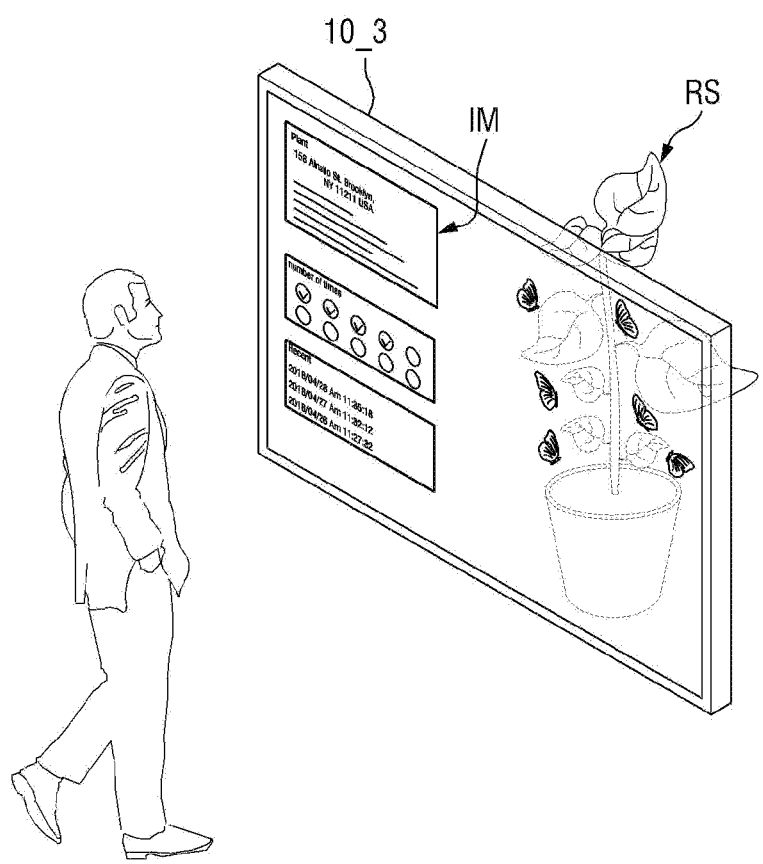
FIG. 61 shows a transparent display device including a display device according to an embodiment.

FIG. 61 is an example view of a transparent display device including a display device 10_3 according to an embodiment.

Referring to FIG. 61, the display device 10_3 according to the embodiment may be applied to the transparent display device. The transparent display device may transmit light while displaying an image IM. Therefore, a user located in front of the transparent display device may not only view the image IM displayed on the display device 10_3 but may also view an object RS or the background located behind the transparent display device. When the display device 10_3 is applied to the transparent display device, the first substrate SUB1 of the display device 10_3 illustrated in FIGS. 5 and 32 may include a light transmitting portion configured to transmit light or may be made of a light-transmissible material.

In a display device and a method of fabricating the same according to embodiments, a plurality of pixels respectively include a first light emitting element and a third light emitting element for emitting first light, a second light emitting element for emitting second light, and a fourth light emitting element for emitting third light. Because only a first wavelength conversion layer for converting the first light emitted from the third light emitting element into the third light is included, ease of a fabrication process can be increased.

In addition, in a display device and a method of fabricating the same according to embodiments, a plurality of pixels respectively include a first light emitting element for emitting first light, a second light emitting element for emitting second light, and a third light emitting element for emitting third light. Therefore, various colors can be displayed without a wavelength conversion layer. For example, Because the wavelength conversion layer can be omitted, ease of a fabrication process can be increased.

However, aspects and features of embodiments of the present disclosure are not restricted to those set forth herein. The above and other aspects and features of embodiments of the present disclosure will become more apparent to one of ordinary skill in the art to which the present disclosure pertains by referencing the claims and their equivalents.

What is claimed is:

1. A display device comprising:
a substrate;
a first pixel electrode on the substrate;
a second pixel electrode on the substrate and spaced apart from the first pixel electrode;
a first light emitting element on the first pixel electrode and configured to emit first light;
a first connection electrode on the second pixel electrode;
a first partition wall between a side surface of the first light emitting element and a side surface of the first connection electrode;
a second light emitting element on the first connection electrode and configured to emit second light; and
a common electrode on an upper surface of the first light emitting element and an upper surface of the second light emitting element.

2. The display device of claim 1, wherein the first partition wall has conductivity.

3. The display device of claim 2, further comprising a first oxide layer on an upper surface of the first partition wall.

4. The display device of claim 1, further comprising:
a planarization layer on the first light emitting element; and
a second partition wall between a side surface of the second light emitting element and a side surface of the planarization layer.

5. The display device of claim 4, wherein the second partition wall has conductivity.

6. The display device of claim 4, wherein the first partition wall and the second partition wall comprise an opaque metal material.

7. The display device of claim 4, wherein the first partition wall and the second partition wall are made of the same material.

8. The display device of claim 4, wherein the second partition wall comprises a light blocking material that absorbs or blocks light.

9. The display device of claim 4, wherein the common electrode is between the first light emitting element and the planarization layer.

10. The display device of claim 4, further comprising:
a first insulating layer between the side surface of the first light emitting element and the first partition wall; and
a second insulating layer between the side surface of the second light emitting element and the second partition wall.

11. The display device of claim 10, wherein the common electrode is between the second insulating layer and the second partition wall.

12. The display device of claim 1, further comprising:
a third pixel electrode on the substrate and spaced apart from the first pixel electrode and the second pixel electrode; and
a third light emitting element on the third pixel electrode and configured to emit the first light.

13. The display device of claim 12, further comprising:
a wavelength conversion layer on the third light emitting element and configured to convert the first light emitted from the third light emitting element into third light; and
a second partition wall between a side surface of the second light emitting element and a side surface of the wavelength conversion layer.

14. The display device of claim 13, wherein the common electrode is between the third light emitting element and the wavelength conversion layer.

15. The display device of claim 13, further comprising a color filter on the wavelength conversion layer and configured to transmit the third light and block the first light.

16. The display device of claim 1, further comprising a reflective conductive layer on the first partition wall,
wherein the common electrode is on the reflective conductive layer.

17. The display device of claim 1, further comprising:
a third pixel electrode on the substrate and spaced apart from the first pixel electrode and the second pixel electrode;
a second connection electrode on the third pixel electrode;
a third connection electrode on the second connection electrode; and
a third light emitting element on the third connection electrode.

18. The display device of claim 17, wherein the common electrode is on an upper surface of the third light emitting element.

19. The display device of claim 17, further comprising:
a second partition wall between a side surface of the second light emitting element and a side surface of the third connection electrode; and
a third partition wall on a side surface of the third light emitting element.

20. The display device of claim 19, wherein the second partition wall and the third partition wall have conductivity.

21. The display device of claim 19, further comprising:
a second oxide layer on an upper surface of the second partition wall; and
a third oxide layer on an upper surface of the third partition wall.

22. A display device comprising:
a substrate;
a first pixel electrode on the substrate;
a second pixel electrode on the substrate and spaced apart from the first pixel electrode;
a first light emitting element on the first pixel electrode and configured to emit first light;
a second light emitting element on the second pixel electrode and configured to emit second light; and
a common electrode on an upper surface of the first light emitting element and an upper surface of the second light emitting element,
wherein a minimum distance between the substrate and the first light emitting element is smaller than a minimum distance between the substrate and the second light emitting element.

23. The display device of claim 22, further comprising a first connection electrode between the second pixel electrode and the second light emitting element.

24. The display device of claim 23, wherein a thickness of the first light emitting element is the same as a thickness of the first connection electrode.

25. The display device of claim 22, further comprising:
a first partition wall surrounding a side surface of the first light emitting element; and
a second partition wall surrounding a side surface of the second light emitting element,
wherein the second partition wall is on the first partition wall.

26. The display device of claim 25, further comprising:
a third pixel electrode on the substrate and spaced apart from the first pixel electrode and the second pixel electrode; and
a third light emitting element on the third pixel electrode and configured to emit third light,
wherein the common electrode is on an upper surface of the third light emitting element, and
wherein a minimum distance between the substrate and the third light emitting element is greater than the minimum distance between the substrate and the second light emitting element.

27. The display device of claim 26, further comprising a third partition wall surrounding a side surface of the third light emitting element,
wherein the first partition wall, the second partition wall, and the third partition wall have conductivity.

28. The display device of claim 27, further comprising:
a first oxide layer on the first partition wall;
a second oxide layer on the second partition wall; and
a third oxide layer on the third partition wall.

29. The display device of claim 26, further comprising:
a first connection electrode between the third pixel electrode and the third light emitting element; and
a second connection electrode between the first connection electrode and the third light emitting element.

30. The display device of claim 29, wherein a thickness of the first light emitting element is the same as a thickness of the first connection electrode, and
wherein a thickness of the second light emitting element is the same as a thickness of the second connection electrode.

* * * * *